US007605061B2

(12) United States Patent
Takahashi et al.

(10) Patent No.: US 7,605,061 B2
(45) Date of Patent: Oct. 20, 2009

(54) SEMICONDUCTOR DEVICE AND METHOD OF MANUFACTURING THE SEMICONDUCTOR DEVICE

(75) Inventors: Kouta Takahashi, Nagano (JP);
 Susumu Iwamoto, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 338 days.

(21) Appl. No.: 11/745,687

(22) Filed: May 8, 2007

(65) Prior Publication Data
 US 2007/0207597 A1   Sep. 6, 2007

Related U.S. Application Data

(62) Division of application No. 11/054,366, filed on Feb. 9, 2005, now Pat. No. 7,262,459.

(30) Foreign Application Priority Data

Feb. 9, 2004   (JP) ............................... 2004-032739
Jul. 23, 2004   (JP) ............................... 2004-216225

(51) Int. Cl.
 *H01L 21/20*  (2006.01)
 *H01L 21/36*  (2006.01)
(52) U.S. Cl. ...................................... 438/478
(58) Field of Classification Search .................. 438/478
 See application file for complete search history.

(56) References Cited

U.S. PATENT DOCUMENTS 4,754,310 A    6/1988  Coe
 5,216,275 A    6/1993  Chen
 2001/0028083 A1  10/2001  Onishi et al.
 2003/0052329 A1   3/2003  Kobayashi et al.

FOREIGN PATENT DOCUMENTS

EP   1 011 146 A1   6/2000
 JP   2001-196573 A   7/2001

(Continued)

OTHER PUBLICATIONS

Office Action issued in corresponding German Patent Application No. 102005002778.4-33 dated Sep. 15, 2008.

*Primary Examiner*—Leonardo Andújar
*Assistant Examiner*—Monica D Harrison
(74) *Attorney, Agent, or Firm*—Rossi, Kimms & McDowell LLP

(57) ABSTRACT

An active region in a semiconductor device is made up of a parallel p-n layer including a first p-semiconductor layer and a first n-semiconductor with the widths and total amounts of impurities being equal to each other to provide a structure in which charges are balanced. A section parallel to stripes in the parallel p-n layer in an inactive region is made up of a second parallel p-n layer including a second p-semiconductor layer, with its width larger than that of the first p-semiconductor layer, and a second n-semiconductor layer with its width smaller than that of the first n-semiconductor layer. The total amount of impurities in the second p-semiconductor layer is made larger than that in the second n-semiconductor layer to provide a structure in which charges are made unbalanced.

4 Claims, 36 Drawing Sheets

FOREIGN PATENT DOCUMENTS

| | | |
|---|---|---|
| JP | 2001-298190 A | 10/2001 |
| JP | 2001-298191 A | 10/2001 |
| JP | 2002-280555 A | 9/2002 |
| JP | 2003-008014 A | 1/2003 |
| JP | 2003-224273 A | 8/2003 |

SEMICONDUCTOR DEVICE AND METHOD OF MANUFACTURING THE SEMICONDUCTOR DEVICE

This is a divisional application of U.S. patent application Ser. No. 11/054,366 filed on Feb. 9, 2005

BACKGROUND OF THE INVENTION

The present invention relates to a semiconductor device having in a drift section a parallel p-n layer arranged with n-type semiconductor layers and p-type semiconductor layers being alternately joined and a method of manufacturing the semiconductor device having such an arrangement.

In general, semiconductor elements may be classified into lateral elements each having electrodes formed on its one side and vertical elements each having electrodes on both sides. In a vertical element, both of the direction in which a drift current flows in a turned-on state and the direction in which a depletion layer, formed by a reverse bias voltage, extends in a turned-off state are the same. In an ordinary planer n-channel vertical MOSFET (insulated gate field effect transistor), a high resistance drift layer is operated as a region for flowing a drift current in the vertical direction when the MOSFET is in a turned-on state. Therefore, a shortened current path in the drift layer lowers drift resistance, by which an effect of reducing substantial on-resistance of the MOSFET is obtained.

While, the drift layer is depleted when in a turned-off state to enhance a breakdown voltage. Therefore, the thinned drift region narrows the expanding width of a depletion layer between the drain and the base which layer travels from the p-n junction between a p-type base region and the n-type drift layer. This causes the electric field strength in the depletion layer to fast reach the critical electric field strength of silicon to lower the breakdown voltage. Contrary to this, in a semiconductor element with a high breakdown voltage, a thick drift layer increases on-resistance to result in an increase in a loss. In this way, between the on-resistance and the breakdown voltage, there is a relation that necessitates a tradeoff.

The tradeoff is known to be similarly necessary also in a semiconductor element such as an IGBT (insulated gate bipolar transistor), a bipolar transistor or a diode. Moreover, the same tradeoff is necessary also in a lateral semiconductor element in which the direction in which a drift current flows in a turned-on state differs from the direction in which a depletion layer extends in a turned-off state.

A well-known solving measure to the problem of necessitating the above-explained tradeoff is to provide a super-junction semiconductor element in which a drift layer is provided as a parallel p-n layer having a structure with n-type semiconductor layers and p-type semiconductor layers alternately joined, both having increased impurity concentrations. In the semiconductor device with such a structure, even though the impurity concentrations in the parallel pn-structure are high, when in a turned-off state, a depletion layer expands in the lateral direction from each p-n junction extending in the vertical direction of the parallel p-n layer. This makes the whole drift section depleted, by which a high breakdown voltage can be provided.

A previously known method of making a parallel p-n layer of a super-junction semiconductor device is a method of alternately carrying out epitaxial growth of the n-type semiconductor layer and selective ion implantation of p-type impurities (hereinafter referred to as a multistage epitaxial growth method). The method is disclosed in, for example, JP-A-2001-298190 and JP-A-2003-224273. Another method is proposed in JP-A-2001-196573, for example, in which a plurality of trenches are formed in an n-type semiconductor layer and each trench is filled with an epitaxial layer of p-type semiconductor (hereinafter referred to as a trench filling method).

In the trench filling method, the number of times of carrying out the epitaxial growth is smaller than that in the multistage epitaxial growth method. This provides the advantage of lowering cost. However, for ensuring a breakdown voltage of a super-junction semiconductor device manufactured by the trench filling method, a peripheral voltage withstanding structure, provided in an edge structure section, must be made different from the structure provided in the case when the super-junction semiconductor device is manufactured by the multistage epitaxial growth method. Here, the edge structure section is provided in the inactive region on the outside of the active region in which a current flows when the super-junction semiconductor device is in a turned-on state.

The reason will be explained in the following. Here, all of the MOSFETs are taken as those of n-channel type. Moreover, the parallel p-n layer is taken as a structure with a plane figure in which long narrow extended n-semiconductor layers and p-semiconductor layers are alternately joined in the direction perpendicular to the extending direction of the n-semiconductor layers (hereinafter referred to as a stripe-pattern-like plane figure). In the specification, the direction in which the n-semiconductor layer (or the p-semiconductor layer) in the parallel p-n layer are extended is taken as the direction parallel to the stripes in the parallel p-n layer. The direction orthogonal to this is taken as the direction perpendicular to the stripes in the parallel p-n layer.

Moreover, it is assumed that, in the inactive region, there are laid out a parallel p-n layer with a high impurity concentration like the parallel p-n layer in the active region. A section along a side extending in the direction perpendicular to the stripes of the parallel p-n layer in the edge structure section becomes a lateral super-junction structure when the MOSFET is in a turned-off state, which can ensure a sufficiently high breakdown voltage in the section. Meanwhile, in a section along a side extending in the direction parallel to the stripes of the parallel p-n layer in the edge structure section, a depletion layer tends to expand in the horizontal direction (lateral direction) from the p-n junctions when the MOSFET is in a turned-off state. The depletion layer, however, is not made to expand sufficiently because of high impurity concentration in the n-semiconductor layer in the parallel p-n layer laid out in the inactive region. Therefore, a sufficiently high breakdown voltage cannot be ensured in the edge structure section parallel to the stripes.

In order to avoid the problem, it is necessary to provide the structure of the parallel p-n layer in the edge structure section as a structure different from the structure of the parallel p-n layer in the active region. That is, the structure must be provided as a structure that reduces the electric field strength at least on the surface of the parallel p-n layer in the edge structure section to make a depletion layer expand easily in the edge structure section. Specifically, such a structure is disclosed in the above JP-A-2001-298190 as a structure in which, in the parallel p-n layer in the edge structure section, impurity concentration is lowered or the pitch of the stripes is narrowed. Furthermore, the impurity concentration is lowered together with the pitch of the stripes is narrowed or the impurity concentration is lowered together with the pitch of the stripes is increased. In the structure disclosed in the above JP-A-2001-298190, as shown in FIG. 47, in the parallel p-n layer in the active region, the amounts of impurities in the p-semiconductor layer and that in the n-semiconductor layer are equal to each other. Moreover, in the edge structure section, that is, in the parallel p-n layer in the inactive section, the amounts of impurities in the p-semiconductor layer and that in the n-semiconductor layer are also equal to each other.

In the above JP-A-2003-224273, a structure is disclosed in which the parallel p-n layer in the edge structure section is divided into two layers, an upper layer section and a lower layer section. In the structure, only in the parallel p-n layer in the upper layer section, impurity concentration is lowered or the pitch of the stripes is narrowed. Furthermore, the impurity concentration is lowered together with the pitch of the stripes is narrowed or the impurity concentration is lowered together with the pitch of the stripes is increased. The super-junction semiconductor devices disclosed in the above JP-A-2001-298190 and JP-A-2003-224273, are manufactured by the multistage epitaxial growth method. In the multistage epitaxial growth method, by changing a dose at selective ion implantation and/or a ratio of a window width at ion implantation, impurity concentration can be changed. Therefore, it is easy to lower only the impurity concentration in the parallel p-n layer in the edge structure section.

In general, for ensuring a stable breakdown voltage in a semiconductor device, a peripheral voltage withstanding structure must be provided. However, in the above JP-A-2001-196573 in which the trench filling method is proposed, no peripheral voltage withstanding structure and no method of manufacturing the structure are mentioned. Thus, the device according to the above JP-A-2001-196573 has a possibility of making it difficult to ensure a stable breakdown voltage. Therefore, the inventors studied the technique of forming the peripheral voltage withstanding structure as is disclosed in the above JP-A-2001-298190 by the trench filling method as is disclosed in the above JP-A-2001-196573. As a result, it was found that the widths of the p-semiconductor layers and the n-semiconductor layers in the parallel p-n layer can be controlled by changing the width of each of the trenches to be formed and spacing between the trenches (pitch). Specifically, it was found that, for ensuring the stable breakdown voltage, it is only necessary to make the widths and the pitch of the trenches in the inactive region smaller than the widths and the pitch of the trenches in the active region.

However, the trench widths in the inactive region made excessive small cause too low impurity concentrations in the p-semiconductor layers. This results in weakened effect of expanding the depletion layer outward the p-semiconductor layers. Therefore, the depletion layer expands poorly to cause inconvenience of making the breakdown voltage hard to be ensured. Moreover, trench widths made excessively small in the inactive region cause the trenches hard to be formed. Along with this, an aspect ratio of each of the trenches is made too high to cause difficulty in filling the trenches with epitaxial layers.

In addition, there was also studied the technology of forming the peripheral voltage withstanding structure as is disclosed in the above JP-A-2003-224273 by the trench filling method. In the disclosed structure, the parallel pn-structure in the edge structure section in the inactive region is divided into two layers of the upper layer section and the lower layer section. As a result, it was found that to change impurity concentration only in the p-semiconductor layer in the upper layer section or only in the n-semiconductor layer in the upper layer is impossible with one time formation of the trenches and one time epitaxial growth for filling the trenches. This is attributed to uniform distribution of the impurity concentration in the substrate before the trenches are formed therein and impurity concentration distribution becoming uniform when the trenches are filled.

The invention was made in view of the foregoing with an object of providing a semiconductor device being provided with a super-junction structure capable of ensuring a sufficiently high breakdown voltage. Another object of the invention is to provide a semiconductor device provided with a super-junction structure suited for being manufactured by a trench filling method. Further another object of the invention is to provide a method of manufacturing a semiconductor device provided with the super-junction structure by the trench filling method.

SUMMARY OF THE INVENTION

In order to achieve the above object, a semiconductor device according to a first aspect of the invention is a device in which a parallel p-n layer with first conductivity type semiconductor layers and second conductivity type semiconductor layers being alternately joined is provided on a first conductivity type low resistance semiconductor layer and the parallel p-n layer is laid out both in an active region in which a current flows in a turned-on state and in an inactive region around the active region, wherein in at least a part of the parallel p-n layer laid out in the inactive region, the total amount of impurities in the second conductivity type semiconductor layer is larger than the total amount of impurities in the first conductivity type semiconductor layer.

According to the first aspect of the invention, in the inactive region, although charges in the parallel p-n layer are made unbalanced, the impurities of a larger total amount in the second conductivity type semiconductor layer in the parallel p-n layer enhance the depletion in the first conductivity type semiconductor layer in the outer peripheral section of the second conductivity type semiconductor layer. Moreover, in the inactive region, the lowered impurity concentration in the first conductivity type semiconductor layer enhances depletion in the first conductivity type semiconductor layer. This reduces the electric field strength in the inactive region, so that a sufficiently high breakdown voltage can be ensured.

A semiconductor device according to a second aspect of the invention is a device in which, in the device according to the first aspect of the invention, in at least a part of the parallel p-n layer laid out in the inactive region, the width of the second conductivity type semiconductor layer is larger than the width of the first conductivity type semiconductor layer.

According to the second aspect of the invention, in at least a part of the parallel p-n layer laid out in the inactive region, interdiffusion of impurities between the first conductivity type semiconductor layer and the second conductivity type semiconductor layer increases the total amount of impurities in the second conductivity type semiconductor layer to be larger than that in the first conductivity type semiconductor layer. Realization of the structure according to the second aspect is made possible by the following. First, a first conductivity type semiconductor layer is formed on the first conductivity type low resistance semiconductor layer. Then, a plurality of trenches are formed in at least a part of the region to become the inactive region in the first conductivity type semiconductor layer so that the width of each of the trenches becomes larger than the width of the first conductivity type semiconductor layer between the trenches. Finally, each of the trenches is filled with an epitaxially grown second conductivity type semiconductor layer. Therefore, the structure is suited for being formed by the trench filling method.

A semiconductor device according to a third aspect of the invention is a device in which, in the device according to the second aspect of the invention, the width of the second conductivity type semiconductor layer in the parallel p-n layer laid out in the inactive region is equal to the width of the second conductivity type semiconductor layer in the parallel p-n layer laid out in the active region.

According to the third aspect of the invention, in the region to become the inactive region, the width of the trench for forming the second conductivity type semiconductor layer in the parallel p-n layer are simply made to be equal to the width of the trench formed in the region to become the active region. Hence, an aspect ratio of the trench formed in the region to become the inactive region can be determined to such an extent that the trench can be formed and the trench can be filled with an epitaxially grown semiconductor layer. Therefore, the structure is suited for being formed by the trench filling method.

A semiconductor device according to a fourth aspect of the invention is a device in which, in the device according to the second aspect of the invention, in at least a part of the parallel p-n layer laid out in the inactive region, the width of the second conductivity type semiconductor layer is larger than the width of the second conductivity type semiconductor layer in the parallel p-n layer laid out in the active region.

According to the fourth aspect of the invention, in at least a part of the region to become the inactive region, the width of the trench for forming the second conductivity type semiconductor layer in the parallel p-n layer are simply made larger than the width of the trench formed in the region to become the active region. Hence, an aspect ratio of the trench formed in at least a part of the region to become the inactive region can be determined to such an extent that the trench can be formed and the trench can be filled with an epitaxially grown semiconductor layer. Therefore, the structure is suited for being formed by the trench filling method.

A semiconductor device according to a fifth aspect of the invention is a device in which, in the device according to the first aspect of the invention, in at least a part of the parallel p-n layer laid out in the inactive region, the widths of the first conductivity type semiconductor layer and the second conductivity type semiconductor layer are smaller than the widths of the first conductivity type semiconductor layer and the second conductivity type semiconductor layer in the parallel p-n layer laid out in the active region, respectively.

According to the fifth aspect of the invention, in at least a part of the region to become the inactive region, the width and the pitch of the trench for forming the second conductivity type semiconductor layer in the parallel p-n layer are simply made smaller than the width and the pitch of the trench formed in the region to become the active region, respectively. Hence, by determining the aspect ratio of the trench, formed in at least a part of the region to become the inactive region, to such an extent that the trench can be formed and the trench can be filled with an epitaxially grown semiconductor layer, a structure is provided which is suited for being formed by the trench filling method. In the semiconductor device according to the fifth aspect of the invention, in at least a part of the parallel p-n layer laid out in the inactive region, the width of the first conductivity type semiconductor layer is better made smaller than that of the second conductivity type semiconductor layer.

In order to achieve the above object, a method of manufacturing a semiconductor device according to a sixth aspect of the invention is the method which, when manufacturing a semiconductor device in which a parallel p-n layer with first conductivity type semiconductor layers and second conductivity type semiconductor layers being alternately joined is provided on a first conductivity type low resistance semiconductor layer and the parallel p-n layer is laid out both in an active region in which a current flows in a turned-on state and in an inactive region around the active region, includes the steps of: carrying out epitaxial growth of a first conductivity type semiconductor layer on the first conductivity type low resistance semiconductor layer; depositing an insulator film on the surface of the epitaxially grown first conductivity type semiconductor layer; carrying out patterning of the insulator film to form a mask for forming trenches; by using the patterned insulator film as a mask, forming a plurality of trenches in a region to become an active region in the first conductivity type semiconductor layer and along with this, forming a plurality of trenches in a part of a region to become an inactive region in the first conductivity type semiconductor layer, the trenches having widths different from those of the trenches formed in the region to become the active region; carrying out epitaxial growth of a second conductivity type semiconductor layer in each of the trenches formed in the first conductivity type semiconductor layer to fill trenches having the largest widths with the second conductivity type semiconductor layers to a level equal to or higher than the level of the surface of the insulator film used as the mask for forming the trenches; and polishing the parallel p-n layer comprising the first conductivity type semiconductor layers and the second conductivity type semiconductor layers filling the trenches to planarize the surface of the parallel p-n layer.

According to the sixth aspect of the invention, in a part of the parallel p-n layer laid out in the inactive region, there can be formed second conductivity type semiconductor layers having widths different from those of the second conductivity type semiconductor layers in the parallel p-n layer laid out in the active region. Therefore, the total amount of impurities in the second conductivity type semiconductor layer in the parallel p-n layer in the inactive region is made increased to be larger than the total amount of impurities in the first conductivity type semiconductor layer. This enhances depletion in the inactive region to reduce the electric field strength in the inactive region, by which a semiconductor device can be obtained which is capable of ensuring a sufficiently high breakdown voltage. Moreover, by filling the trenches having the largest widths with the second conductivity type semiconductor layers under an over-epitaxial condition, trenches having different widths from one another can be filled by a single step of forming the trenches and a single step of filling the trenches.

A method of manufacturing a semiconductor device according to a seventh aspect of the invention is a method in which, in the method according to the sixth aspect of the invention, in the step of forming the trenches in the first conductivity type semiconductor layer, in a part of the region to become the inactive region, the trenches are formed so that the width of each of the trenches becomes larger than the spacing between the trenches.

According to the seventh aspect of the invention, in a part of the parallel p-n layer laid out in the inactive region, the width of the second conductivity type semiconductor layer becomes larger than the width of the first conductivity type semiconductor layer. Therefore, interdiffusion of impurities between the first conductivity type semiconductor layer and the second conductivity type semiconductor layer makes it possible to easily obtain a semiconductor device in which the total amount of impurities in the second conductivity type semiconductor layer is larger than that in the first conductivity type semiconductor layer.

A method of manufacturing a semiconductor device according to a eighth aspect of the invention is a method in which, in the method according to the seventh aspect of the invention, in the step of forming the trenches in the first conductivity type semiconductor layer, in a part of the region to become the inactive region, trenches having widths larger than those of the trenches formed in the region to become the active region are formed.

According to the eighth aspect of the invention, the aspect ratio of the trench formed in a part of the region to become the inactive region can be made lower than the aspect ratio of the trench in the region to become the active region. Therefore, the formation of the trench and the filling the trench with an epitaxially grown semiconductor layer can be easily carried out.

A method of manufacturing a semiconductor device according to a ninth aspect of the invention is a method which, in the method according to any one of the sixth aspect to the eighth aspect of the invention, further includes the step of removing a part of each of the second conductivity type semiconductor layers filling the trenches by an amount grown to a level higher than the surface of the insulator film used as a mask for forming the trench by polishing the part with the insulator film further used as a polishing stopper, the step being carried out between the step of carrying out epitaxial growth of the second conductivity type semiconductor layer to fill each of the trenches and the step of polishing the parallel p-n layer to planarize the surface thereof.

According to the ninth aspect of the invention, there can be eliminated variation in thicknesses of over-epitaxial parts of the second conductivity type semiconductor layers grown higher than the insulator layer when epitaxial growth of the second conductivity type semiconductor layer is carried out. Therefore, even though the width of the trench in the active region differ from that in the inactive region, the parallel p-n layer can be formed with a uniform depth. The manufacturing method can be also applied to the case in which the width of the trench in the active region is equal to that in the inactive region. In this case, the parallel p-n layer can be prevented from being formed with non-uniform depth due to variation in the epitaxial process.

A method of manufacturing a semiconductor device according to a tenth aspect of the invention is the method which, when manufacturing a semiconductor device in which a parallel p-n layer with first conductivity type semiconductor layers and second conductivity type semiconductor layers being alternately joined is provided on a first conductivity type low resistance semiconductor layer and the parallel p-n layer is laid out both in an active region in which a current flows in a turned-on state and in an inactive region around the active region, includes the steps of: carrying out epitaxial growth of a first conductivity type semiconductor layer on the first conductivity type low resistance semiconductor layer; depositing an insulator film on the surface of the epitaxially grown first conductivity type semiconductor layer; carrying out patterning of the insulator film to form a mask for forming trenches; by using the patterned insulator film as a mask, forming a plurality of trenches in a region to become an active region in the first conductivity type semiconductor layer and along with this, forming a plurality of trenches in a part of a region to become an inactive region in the first conductivity type semiconductor layer, the trenches being formed with a spacing different from that of the trenches formed in the region to become the active region; carrying out epitaxial growth of a second conductivity type semiconductor layer in each of the trenches formed in the first conductivity type semiconductor layer to fill trenches with the second conductivity type semiconductor layers to a level equal to or higher than the level of the surface of the insulator film used as the mask for forming the trenches; and polishing the parallel p-n layer comprising the first conductivity type semiconductor layers and the second conductivity type semiconductor layers filling the trenches to planarize the surface of the parallel p-n layer.

According to the tenth aspect of the invention, in a part of the parallel p-n layer laid out in the inactive region, there can be formed second conductivity type semiconductor layers arranged at spacing different from that of the second conductivity type semiconductor layers in the parallel p-n layer laid out in the active region. Therefore, the total amount of impurities in the second conductivity type semiconductor layer in the parallel p-n layer in the inactive region is made increased to be larger than the total amount of impurities in the first conductivity type semiconductor layer. This enhances depletion in the inactive region to reduce the electric field strength in the inactive region, by which a semiconductor device can be obtained which is capable of ensuring a sufficiently high breakdown voltage.

According to the invention, a semiconductor device provided with a super-junction structure can be obtained which can ensure a sufficiently high breakdown voltage. Moreover, a semiconductor device provided with a super-junction structure can be obtained which is suited for being manufactured by the trench filling method. Furthermore, the semiconductor device provided with the super-junction structure can be manufactured by the trench filling method.

BRIEF DESCRIPTION OF THE DRAWINGS

The invention will be described in greater detail with reference to certain preferred embodiments thereof and the accompanying drawings, wherein.

DESCRIPTION OF THE PREFERRED EMBODIMENT

Figure 1:
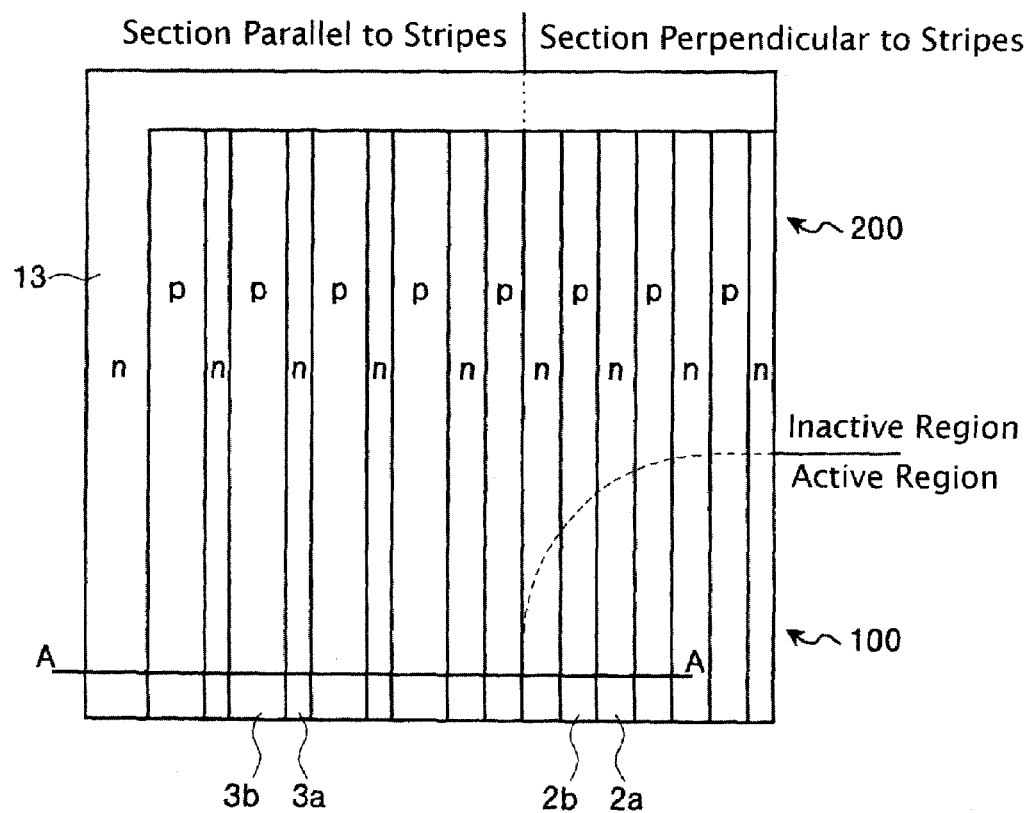
FIG. 1 is a partial plan view showing a principal section of a vertical MOSFET chip as a semiconductor device according to an embodiment 1 of the invention.

In the following, preferred embodiments of the invention will be explained in detail with reference to the attached drawings. In the following explanations and the attached drawings, a leading character "n" or "p" attached to names of layers and regions means that carriers in the layers and the regions are electrons or holes, respectively. Moreover, a sign "+" or "++" attached to the right and above of the leading character "n" or "p" represents that impurity concentration in the layer or the region is comparatively high, or further higher, respectively.

Furthermore, in all of the drawings, similar arrangements are denoted with the same reference numerals and signs with redundant explanations being omitted. Moreover, in the following explanations, a section along a side extending in the direction perpendicular to the stripes of the parallel p-n layer is to be simply expressed as "a section perpendicular to the stripes". Furthermore, a section along a side extending in the direction parallel to the stripes of the parallel p-n layer is to be simply expressed as "a section parallel to the stripes".

FIG. 1 is a partial plan view showing a principal section of a vertical MOSFET chip according to a first embodiment of the invention. In FIG. 1, illustrations of the surface layer of the parallel p-n layer and surface structures of elements formed thereon are omitted. As shown in FIG. 1, an active region 100, in which a current flows in the turned-on state of the MOSFET, is located in the central section of the chip formed in a rectangular shape, for example. The region 100 is further surrounded with an inactive region 200 provided in the peripheral section of the chip. The parallel p-n layer is formed to have a stripe-pattern-like plane figure in which n-semiconductor layers 2a and p-semiconductor layers 2b are alternately joined, and further n-semiconductor layers 3a and p-semiconductor layers 3b are alternately joined. The end section of the chip is provided as an n-semiconductor layer 13.

Here, for differentiating between the n-semiconductor layer 2a and the n-semiconductor layer 3a forming the parallel p-n layer, they are referred to as a first n-semiconductor layer 2a and a second n-semiconductor layer 3a, respectively. About the p-semiconductor layer 2b and the p-semiconductor layer 3b, they are similarly referred to as a first p-semiconductor layer 2b and a second p-semiconductor layer 3b, respectively. Moreover, the parallel p-n layer including the first n-semiconductor layer 2a and the first p-semiconductor layer 2b is referred to as a first parallel p-n layer. Similarly, the parallel p-n layer including the second n-semiconductor layer 3a and the second p-semiconductor layer 3b is referred to as a second parallel p-n layer.

The width of and the total amount of the impurity concentration in the first n-semiconductor layer 2a are approximately equal to the width of and the total amount of the impurity concentration in the first p-semiconductor layer 2b. The width of the second p-semiconductor layer 3b is larger than those of the second n-semiconductor layer and the first p-semiconductor layer 2b. The total amount of the impurities in the second p-semiconductor layer 3b is larger than that of the second n-semiconductor layer 3a. Moreover, The width of each of the first n-semiconductor layer 2a, the first p-semiconductor layer 2b, the second n-semiconductor layer 3a and the second p-semiconductor layer 3b is unchanged through its extending direction parallel to the stripes of the parallel p-n layer.

In the first embodiment, the parallel p-n layer in the active region 100 is made up of the first parallel p-n layer. Therefore, in the active region 100, charges are balanced. Moreover, in the inactive region 200, the parallel p-n layer in the section parallel to the stripes is made up of the first parallel p-n layer and the second parallel p-n layer. Therefore, in a part of the section parallel to the stripes in the inactive region 200, charges are brought into an unbalanced state. In the inactive region 200, the parallel p-n layer in the section perpendicular to the stripes is made up of the first parallel p-n layer continuously provided from the active region 100. When the MOSFET is in a turned-off state, the parallel p-n layer in the section perpendicular to the stripes in the inactive section 200 is operated as the lateral super-junction structure, which can sufficiently ensure a sufficiently high breakdown voltage.

Figure 2:
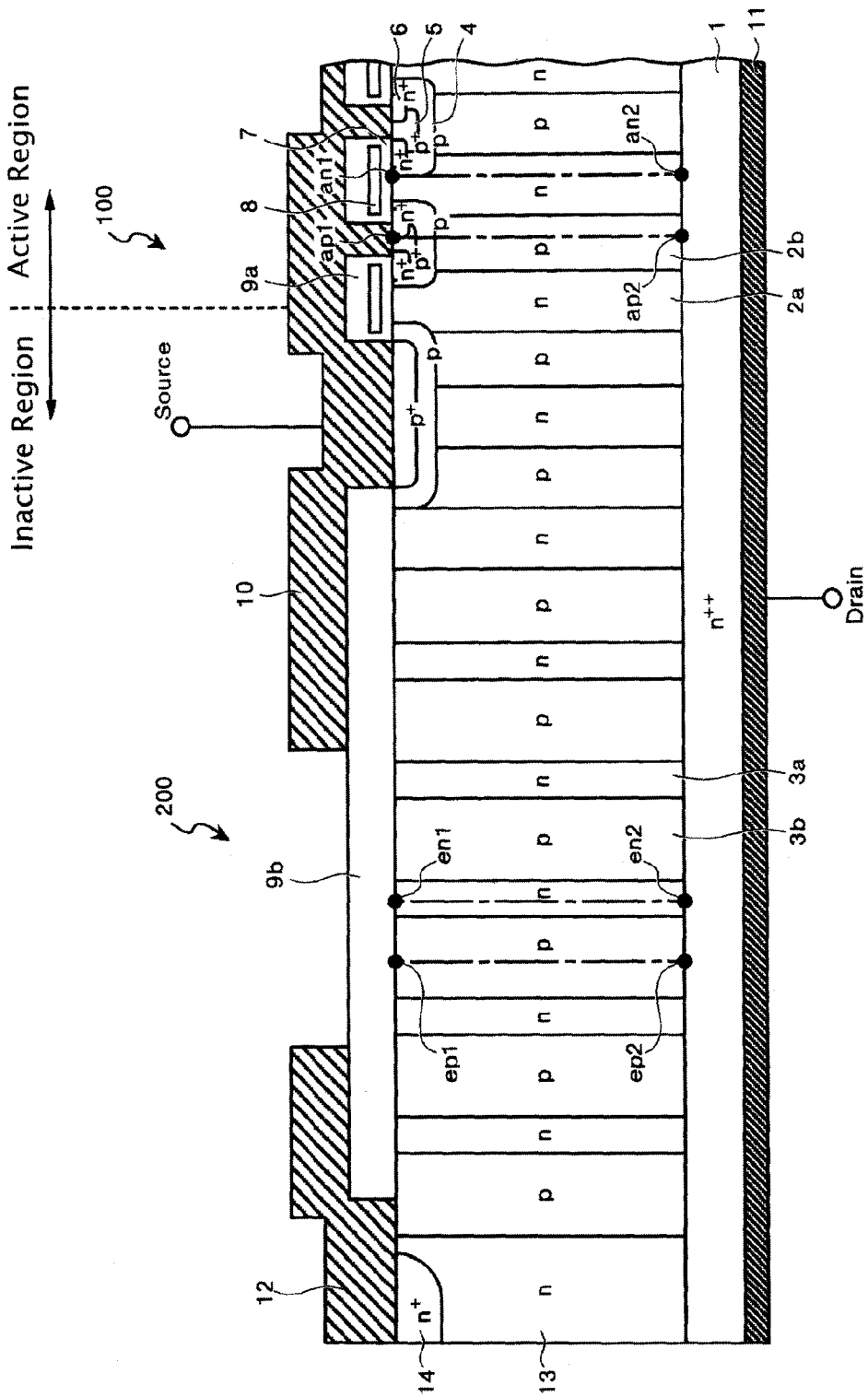
FIG. 2 is a vertical cross sectional view showing a cross sectional structure taken on the cutting line A-A in FIG. 1.

FIG. 2 is a vertical cross sectional view showing a cross sectional structure taken on the cutting line A-A traversing the active region and the inactive region in FIG. 1 in the direction perpendicular to the stripes. In FIG. 2, the right-hand section is the active region 100 driving a current as the MOSFET and the left-hand section is the inactive region 200 forming a peripheral voltage withstanding structure on the outside of the active region 100. Over the active region 100 and the inactive region 200, an $n^{++}$-drain layer 1 is provided. The n-semiconductor layers 2a and 3a, and the p-semiconductor layers 2b and 3b are provided on the surface of the $n^{++}$-drain layer 1.

On the element top surface side in the active region 100 and on the element top surface side of a portion near the boundary of the inactive region 200 with the active region 100, there is formed an element surface structure with n-channel MOSFETs. Each n-channel MOSFET includes a p-base region 4, a $p^{+}$-contact region 5, an $n^{+}$-source region 6, a gate insulator film 7, a gate electrode 8, an interlayer insulator film 9a of, for example, an oxide film, and a source electrode 10. On the bottom surface of the $n^{++}$-drain layer 1, a drain electrode 11 is provided.

The top surface of the inactive region 200 is coated with an interlayer insulator film 9b except for the portion near the boundary with the active region 100 and a chip end section. The source electrode 10 extends from the active region 100 to the inactive region 200 to cover halfway the interlayer insulator layer 9b covering the inactive region 200. While, at the end of the chip, a stopper electrode 12 is provided. The stopper electrode 12 is in contact with an $n^{+}$-semiconductor region 14 provided on the top surface layer of the n-semiconductor layer 13 in the chip end section and covers the chip end side portion of the interlayer insulator film 9b covering the inactive region 200.

As shown in FIG. 2, in the first embodiment, in the inactive region 200, the first parallel p-n layer is laid out in a region ranging from the boundary with the active region 100 to the section under the portion of the source electrode 10 close to its end. Furthermore, the second parallel p-n layer is laid out in a region ranging from the section under the portion of the source electrode 10 close to its end to the n-semiconductor layer 13. In other words, in the inactive region 200, the position of the boundary between the first parallel p-n layer and the second parallel p-n layer is at the thickest possible portion of the interlayer insulator film 9b covering the inactive region. The reference to the "thickest portion" of the interlayer insulator film 9b refers to the fact that the interlayer insulating film 9a is formed in an active region and is not as thick as the interlayer insulating film 9b. Moreover, the boundary is also positioned under the source electrode 10 extending over the interlayer insulator film 9b. This is for reducing electric field strength. The electric field strength, becoming the strongest on the outside of the source electrode 10, is reduced by laying out p-regions with total amounts of impurities increased to be larger than those in n-regions in the section where the electric field strength becomes the strongest to enhance depletion in the n-regions.

Next, explanations will be made about relations in impurity concentration distributions and in total amounts of impurities in the first parallel p-n layer and the second parallel p-n layer. For convenience of explanations, as shown in FIG. 2, in the first parallel p-n layer, the impurity concentration in the first n-semiconductor layer 2a is referred to as an1 both in the proximity of the boundary with the gate insulator film 7 in the active region 100 and in the proximity of the boundary with the interlayer insulator film 9b in the inactive region 200. In the proximity of the boundary with the n$^{++}$-drain layer 1, the impurity concentration in the first n-semiconductor layer 2a is further referred to as an2 both in the active region 100 and in the inactive region 200.

Moreover, in the first parallel p-n layer, the impurity concentration in the first p-semiconductor layer 2b is referred to as ap1 both in the proximity of the boundary with the source electrode 10 in the active region 100 and in the proximity of the boundary with the interlayer insulator film 9b in the inactive region 200. In the proximity of the boundary with the n$^{++}$-drain layer 1, the impurity concentration in the first p-semiconductor layer 2b is further referred to as ap2 both in the active region 100 and in the inactive region 200. In the same way, in the second parallel p-n layer, the impurity concentrations in the second n-semiconductor layer 3a and the second p-semiconductor layer 3b are referred to as en1 and ep1, respectively, in the proximity of the boundary with the interlayer insulator film 9b. In the proximity of the boundary with the n$^{++}$-drain layer 1, the impurity concentrations in the second n-semiconductor layer 3a and the second p-semiconductor layer 3b are referred to as en2 and ep2, respectively.

Figure 3:
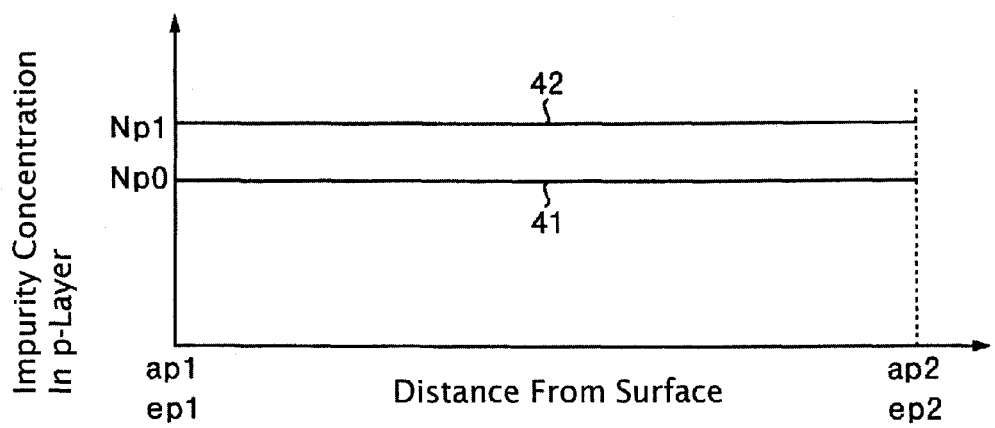
FIG. 3 is a diagram showing impurity concentration distributions in the depth direction in p-semiconductor layers of the semiconductor device according to the embodiment 1.
Figure 4:
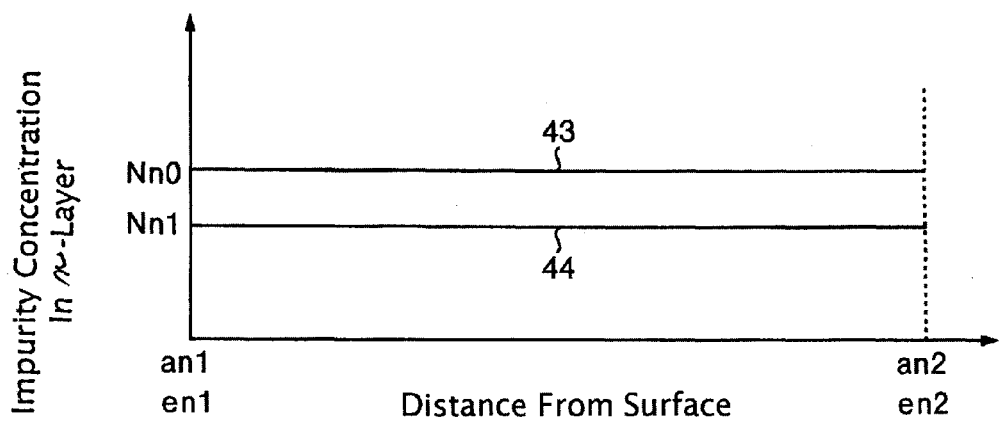
FIG. 4 is a diagram showing impurity concentration distributions in the depth direction in n-semiconductor layers of the semiconductor device according to the embodiment 1.

FIG. 3 is a diagram showing impurity concentration distributions in the depth direction in the p-semiconductor layers of the semiconductor device according to the embodiment 1. As shown in FIG. 3, both of the impurity concentration distribution in the depth direction in the first p-semiconductor layer 2b, denoted by numeral 41, and the impurity concentration distribution in the depth direction in the second p-semiconductor layer 3b, denoted by numeral 42, are uniform. Moreover, the value Np1 of the impurity concentration in the second p-semiconductor layer 3b is higher than the value Np0 of the impurity concentration in the first p-semiconductor layer 2b. Furthermore, FIG. 4 is a diagram showing impurity concentration distributions in the depth direction in the n-semiconductor layers of the semiconductor device according to the embodiment 1. As shown in FIG. 4, the impurity concentration distribution in the depth direction in the first n-semiconductor layer 2a, denoted by numeral 43, and the impurity concentration distribution in the depth direction in the second n-semiconductor layer 3a, denoted by numeral 44, are uniform. In addition, the value Nn1 of the impurity concentration in the second n-semiconductor layer 3a is lower than the value Nn0 of the impurity concentration in the first n-semiconductor layer 2a. The value Np0 of the impurity concentration in the first p-semiconductor layer 2b is approximately equal to the value Nn0 of the impurity concentration in the first n-semiconductor layer 2a, though the conductivity types of the impurities are different from each other.

Such impurity concentration distributions, as will be explained in the later given description of the embodiment 25, can be achieved by interdiffusion of impurities between the n-semiconductor layer and the p-semiconductor layer. The interdiffusion occurs when the element surface structures of the MOSFETs are formed via the high temperature process carried out after making epitaxial growth of the p-semiconductor layers in the trenches formed in the n-semiconductor layer. The interdiffusion of impurities causes the impurity concentrations in the p-semiconductor layer and the n-semiconductor layer to depend on the widths of the respective layers.

Figure 5:
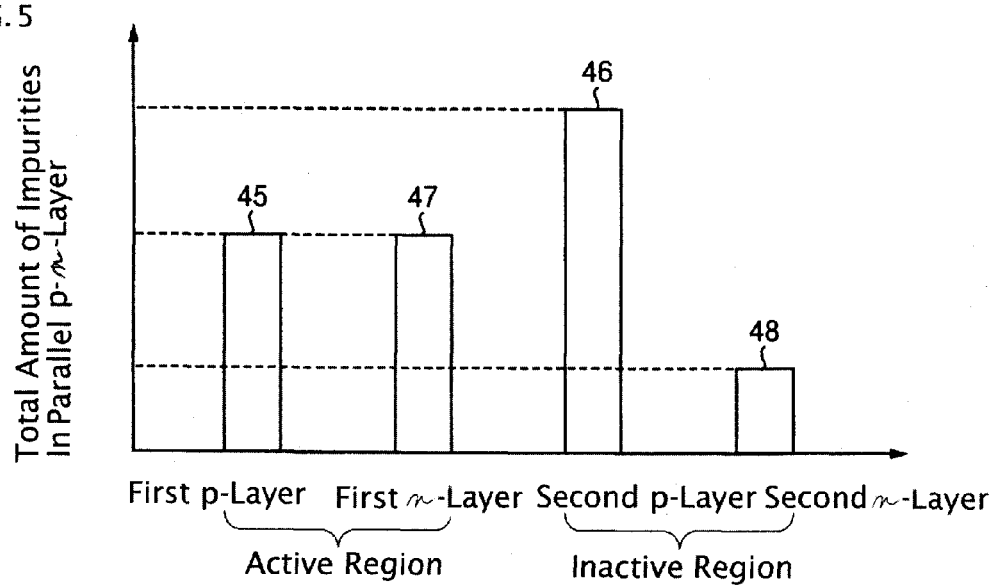
FIG. 5 is a diagram showing relations among total amounts of impurities in the p-semiconductor layers and the n-semiconductor layers in a parallel p-n layer in the semiconductor device according to the embodiment 1.

Here, the width of the first p-semiconductor layer 2b and the width of the first n-semiconductor layer 2a are approximately equal to each other. While, as explained above, the width of the second p-semiconductor layer 3b is larger than the width of the second n-semiconductor layer 3a. Therefore, relations among total amounts of impurities in the first n-semiconductor layer 2a, the first p-semiconductor layer 2b, the second n-semiconductor layer 3a and the second p-semiconductor layer 3b are as shown in FIG. 5. However, FIG. 5 only illustrates relations of large or small among total amounts of impurities in the semiconductor layers. Thus, the figure does not illustrate so far as how large or how small the total amounts of impurities are among them.

Namely, the total amount of impurities in the first p-semiconductor layer 2b, denoted by numeral 45, is approximately equal to the total amount of impurities in the first n-semiconductor layer 2a, denoted by numeral 47. Moreover, the total amount of impurities in the second p-semiconductor layer 3b, denoted by numeral 46, becomes larger than the total amount of impurities 45 in the first p-semiconductor layer 2b and the total amount of impurities 47 in the first n-semiconductor layer 2a. While, the total amount of impurities in the second n-semiconductor layer 3a, denoted by numeral 48, becomes smaller than the total amount of impurities 45 in the first p-semiconductor layer 2b and the total amount of impurities 47 in the first n-semiconductor layer 2a.

Although the invention is not particularly limited to the following, there will be shown dimensions of and impurity concentrations in some main parts as examples. The impurity concentration in the n$^{++}$-drain layer 1 is on the order of $2\times10^{18}$ cm$^{-3}$. In the first parallel p-n layer, the width of the first p-semiconductor layer 2b and the width of the first n-semiconductor layer 2a are both about 5 μm. The impurity concentration in the first p-semiconductor layer 2b and the impurity concentration in the first n-semiconductor layer 2a are both on the order of $4.5\times10^{15}$ cm$^{-3}$.

In the second parallel p-n layer, the width of the second p-semiconductor layer 3b and the width of the second n-semiconductor layer 3a are about 6 μm and about 4 μm, respectively. The impurity concentration in the second p-semiconductor layer 3b and the impurity concentration in the second n-semiconductor layer 3a are on the order of $5.5\times10^{15}$ cm$^{-3}$ and on the order of $3.0\times10^{15}$ cm$^{-3}$, respectively. The effective length of the parallel p-n layer in the depth direction is about 45 μm.

As explained above, since the charges in the parallel p-n layer laid out in the voltage withstanding structure section in the inactive region 200 are in an unbalanced state, it is considered that the breakdown voltage of the section directly below the source electrode 10 is lowered. However, the interlayer insulator film 9b provided directly below the source electrode 10 withstands the voltage equivalent to the lowered portion of the breakdown voltage to cause no lowering in the breakdown voltage in total. Moreover, on the outside of the end of the source electrode 10, the second n-semiconductor layer 3a in the second parallel p-n layer, having the width being narrow and the impurity concentration being lowered, causes a depletion layer easy to expand outward. Therefore, a sufficiently high breakdown voltage can be ensured.

The second embodiment is a vertical MOSFET chip in which, in the vertical MOSFET chip of the first embodiment, the impurity concentrations in the second p-semiconductor layer 3b and the second n-semiconductor layer 3a in the second parallel p-n layer are made approximately equal to those in the first p-semiconductor layer 2b and the first n-semiconductor layer 2a in the first parallel p-n layer. The plane structure of the parallel p-n layer is the same as that shown in FIG. 1. Moreover, the cross sectional structure taken on the cutting line A-A in FIG. 1 is the same as that shown in FIG. 2. Dimensions, impurity concentrations and the like in all parts are, unless otherwise notified, the same as those in the embodiment 1.

Figure 6:
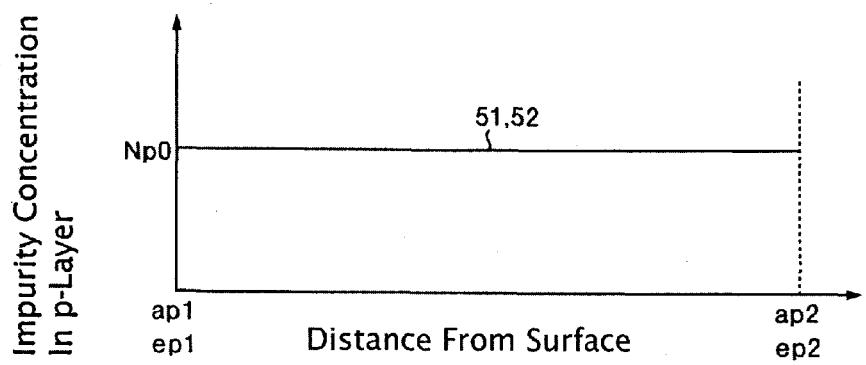
FIG. 6 is a diagram showing impurity concentration distributions in the depth direction in p-semiconductor layers of the semiconductor device according to the embodiment 2.
Figure 7:
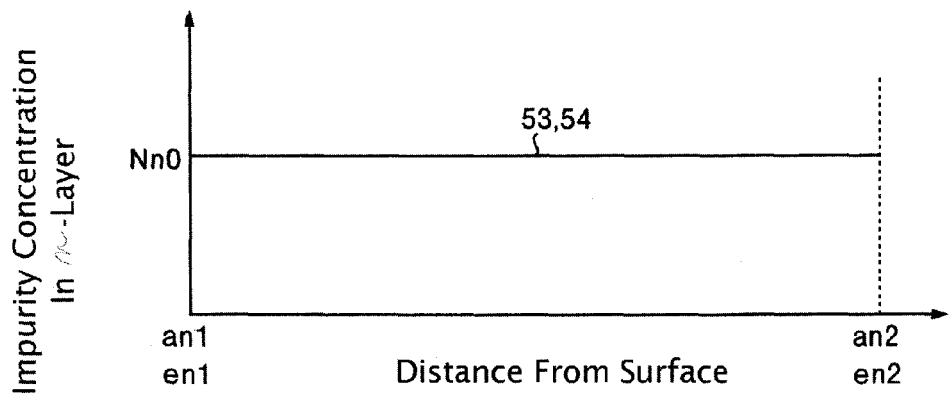
FIG. 7 is a diagram showing impurity concentration distributions in the depth direction in n-semiconductor layers of the semiconductor device according to the embodiment 2.

FIG. 6 is a diagram showing impurity concentration distributions in the depth direction in the p-semiconductor layers of the semiconductor device according to the embodiment 2. As shown in FIG. 6, both of the impurity concentration distribution in the depth direction in the first p-semiconductor layer 2b, denoted by numeral 51, and the impurity concentration distribution in the depth direction in the second p-semiconductor layer 3b, denoted by numeral 52, are uniform with impurity concentration values approximately equal to each other, each value being approximately equal to Np0. Moreover, FIG. 7 is a diagram showing impurity concentration distributions in the depth direction in the n-semiconductor layers of the semiconductor device according to the embodiment 2. As shown in FIG. 7, both of the impurity concentration distribution in the depth direction in the first n-semiconductor layer 2a, denoted by numeral 53, and the impurity concentration distribution in the depth direction in the second n-semiconductor layer 3a, denoted by numeral 54, are uniform with impurity concentration values approximately equal to each other, each value being approximately equal to Nn0. Furthermore, the value Np0 of the impurity concentration in each of the first p-semiconductor layer 2b and the second p-semiconductor layer 3b is approximately equal to the value Nn0 of the impurity concentration in each of the first n-semiconductor layer 2a and the second n-semiconductor layer 3a, though the conductivity types of the impurities are different from each other. For example, all of the first p-semiconductor layer 2b, the first n-semiconductor layer 2a, the second p-semiconductor layer 3b and the second n-semiconductor layer 3a have an impurity concentration of the order of $4.5 \times 10^{15}$ cm$^{-3}$.

Such impurity concentration distributions, as will be explained in the later given description of the embodiment 27, can be achieved by forming the element surface structures of the MOSFET under a low temperature process so as not to cause interdiffusion of impurities between the n-semiconductor layer and the p-semiconductor layer. The low temperature process is carried out after forming the p-semiconductor layers by epitaxial growth in the trenches formed in the n-semiconductor layer. This makes the impurity concentrations in the n-semiconductor layers and the p-semiconductor layers in the parallel p-n layer approximately equal to those of the substrate and the epitaxial layers filling the trenches, respectively, even though the widths of the p-semiconductor layers and the n-semiconductor layers in the parallel p-n layer differ from one another.

The width of the first p-semiconductor layer 2b and that of the first n-semiconductor layer 2a are approximately equal to each other. Thus, the total amount of impurities in the first p-semiconductor layer 2b and that in the first n-semiconductor layer 2a become approximately equal to each other. While, the width of the second p-semiconductor layer 3b is larger than that of the first p-semiconductor layer 2b. Thus, the total amount of impurities in the second p-semiconductor layer 3b becomes larger than that in the first p-semiconductor layer 2b. Moreover, the width of the second n-semiconductor layer 3a is smaller than that of the first n-semiconductor layer 2a. Thus, the total amount of impurities in the second n-semiconductor layer 3a becomes smaller than that in the first n-semiconductor layer 2a. Therefore, the relations of being large or small among total amounts of impurities in the first n-semiconductor layer 2a, the first p-semiconductor layer 2b, the second n-semiconductor layer 3a and the second p-semiconductor layer 3b in the embodiment 2, when illustrated without taking the degree of being large or small into consideration, become as shown in FIG. 5.

As explained above, in the embodiment 2, by forming the element surface structures of the MOSFET by a low temperature process, no interdiffusion of impurities due to heat history occurs to facilitate the control of the impurity concentrations in the parallel p-n layer. This therefore enables almost direct realization of a structure determined by performing numerical calculations such as computer simulations.

Figure 8:
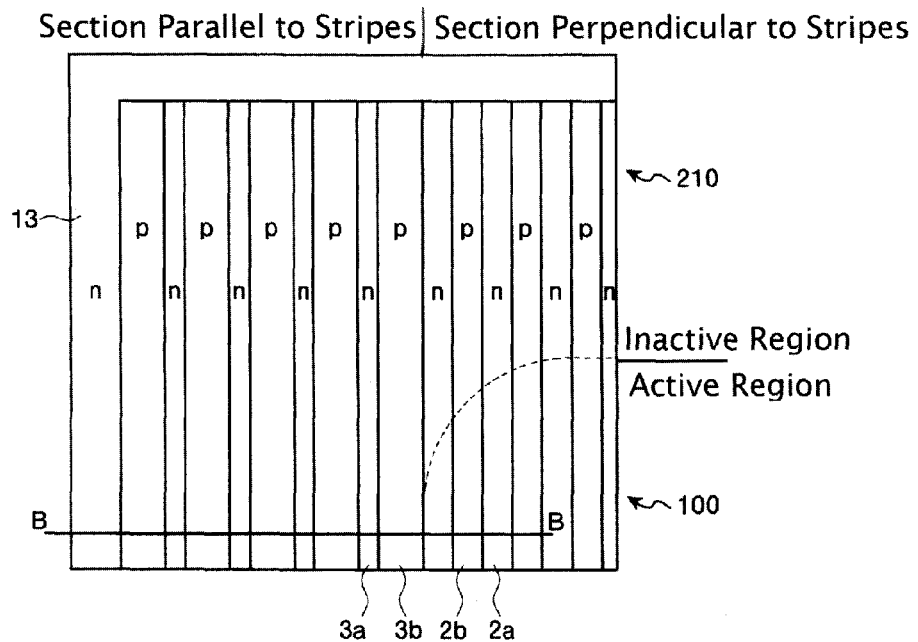
FIG. 8 is a partial plan view showing a principal section of a vertical MOSFET chip as a semiconductor device according to an embodiment 3 of the invention.
Figure 9:
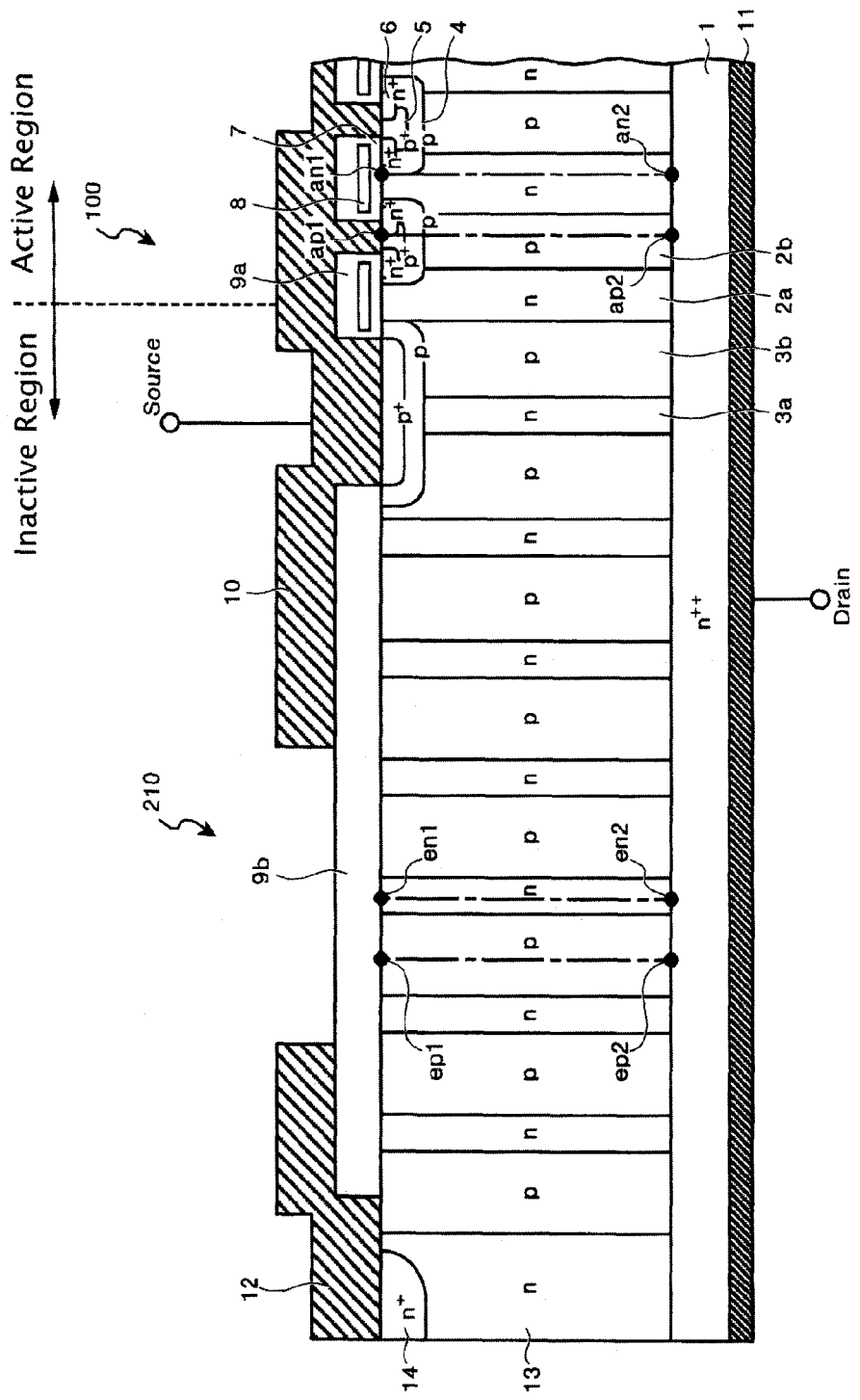
FIG. 9 is a vertical cross sectional view showing a cross sectional structure taken on the cutting line B-B in FIG. 8.

FIG. 8 is a partial plan view showing a principal section of a vertical MOSFET chip according to an embodiment 3 of the invention. In FIG. 8, illustrations of the surface layer of the parallel p-n layer and surface structures of elements formed thereon are omitted. FIG. 9 is a vertical cross sectional view showing a cross sectional structure taken on the cutting line B-B traversing the active region and the inactive region in FIG. 8 in the direction perpendicular to the stripes.

As shown in FIG. 8 and FIG. 9, the third embodiment is a vertical MOSFET chip in which, in the inactive region 210, the whole parallel p-n layer in the section parallel to the stripes is made up of the second parallel p-n layer with charges being in an unbalanced state. Therefore, in a portion of the inactive region 210 in the proximity of the boundary with the active region 100, the second parallel p-n layer is laid out also in a portion where the source electrode 10 is in contact with the semiconductor surface, that is, in a portion without the interlayer insulator film 9b. The arrangements other than the above, dimensions, impurity concentrations and the like in all parts are the same as those in the embodiment 1.

In the above-explained arrangement, the breakdown voltage in the depth direction is lowered in the second parallel p-n layer with unbalanced charges. Thus, an avalanche occurs at a portion at which the source electrode 10 is in contact with the semiconductor surface in the inactive region 210. Therefore, compared with the case in which avalanche breakdown occurs below the interlayer insulator film 9b, an avalanche current is efficiently pulled out from the source electrode 10 to cause no concentration of current, which enhances avalanche durability.

The fourth embodiment is a vertical MOSFET chip in which, in the vertical MOSFET chip of the third embodiment, the impurity concentrations in the second p-semiconductor layer 3b and the second n-semiconductor layer 3a in the second parallel p-n layer are made approximately equal to those in the first p-semiconductor layer 2b and the first n-semiconductor layer 2a in the first parallel p-n layer. The plane structure of the parallel p-n layer is the same as that shown in FIG. 8. Moreover, the cross sectional structure taken on the cutting line B-B in FIG. 8 is the same as that shown in FIG. 9. Dimensions, impurity concentrations and the like in all parts are, unless otherwise notified, the same as those in the embodiment 3.

The distribution in the depth direction of each of the impurity concentrations in the first p-semiconductor layer 2b and the second p-semiconductor layer 3b is as shown in FIG. 6. Moreover, the distribution in the depth direction of each of the impurity concentrations in the first n-semiconductor layer 2a and the second n-semiconductor layer 3a is as shown in FIG. 7. Furthermore, the value Np0 of the impurity concentration in each of the first p-semiconductor layer 2b and the second p-semiconductor layer 3b is approximately equal to the value Nn0 of the impurity concentration in each of the first n-semiconductor layer 2a and the second n-semiconductor layer 3a, though the conductivity types of the impurities are different from each other.

For example, all of the first p-semiconductor layer 2b, the first n-semiconductor layer 2a, the second p-semiconductor layer 3b and the second n-semiconductor layer 3a have an impurity concentration of the order of $4.5 \times 10^{15}$ cm$^{-3}$. As explained about the embodiment 2, the relations of being large or small among total amounts of impurities in the first n-semiconductor layer 2a, the first p-semiconductor layer 2b, the second n-semiconductor layer 3a and the second p-semiconductor layer 3b in the fourth embodiment, when illustrated without taking the degree of being large or small into consideration, become as shown in FIG. 5.

Embodiment 5

The fifth embodiment is a vertical MOSFET chip in which, the impurity concentration in the first p-semiconductor layer 2b in the first parallel p-n layer and the impurity concentration in the second p-semiconductor layer 3b in the second parallel p-n layer are made higher than those in the embodiment 1 to make the charges in the first parallel p-n layer in an unbalanced state also in the active region 100. The plane structure of the parallel p-n layer is the same as that shown in FIG. 1. Moreover, the cross sectional structure taken on the cutting line A-A in FIG. 1 is the same as that shown in FIG. 2. Dimensions, impurity concentrations and the like in all parts are, unless otherwise notified, the same as those in the embodiment 1.

Figure 10:
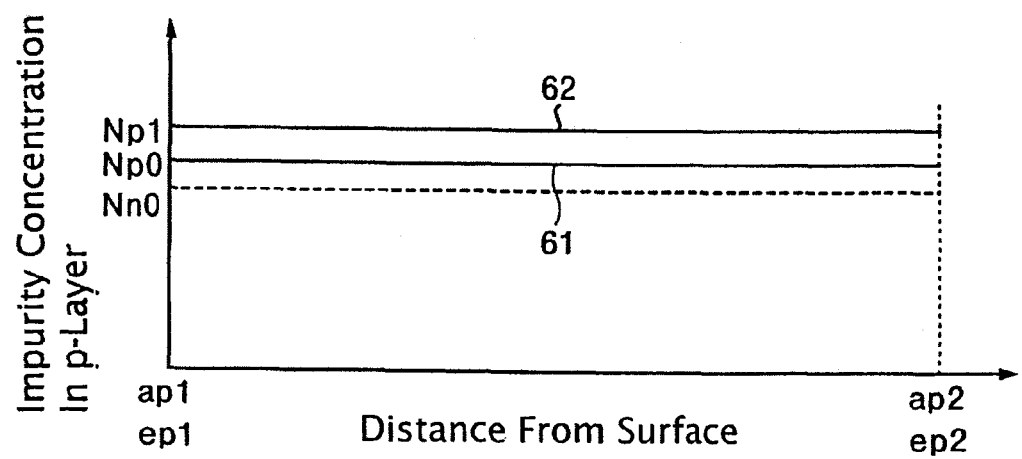
FIG. 10 is a diagram showing impurity concentration distributions in the depth direction in p-semiconductor layers of the semiconductor device according to the embodiment 5.
Figure 11:
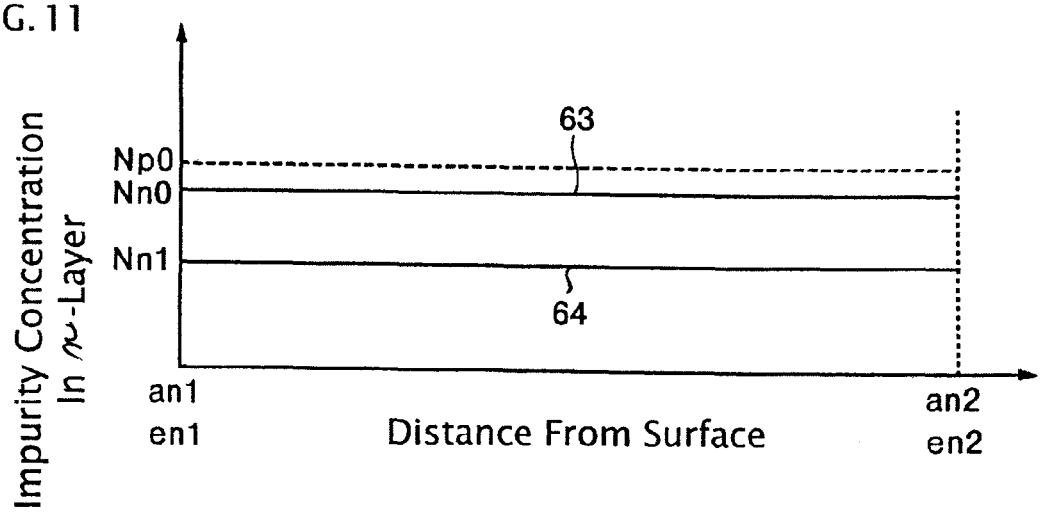
FIG. 11 is a diagram showing impurity concentration distributions in the depth direction in n-semiconductor layers of the semiconductor device according to the embodiment 5.

FIG. 10 is a diagram showing impurity concentration distributions in the depth direction in the p-semiconductor layers of the semiconductor device according to the embodiment 5. As shown in FIG. 10, both of the impurity concentration distribution in the depth direction in the first p-semiconductor layer 2b, denoted by numeral 61, and the impurity concentration distribution in the depth direction in the second p-semiconductor layer 3b, denoted by numeral 62, are uniform. Moreover, the value Np1 of the impurity concentration in the second p-semiconductor layer 3b is higher than the value Np0 of the impurity concentration in the first p-semiconductor layer 2b. Furthermore, FIG. 11 is a diagram showing impurity concentration distributions in the depth direction in the n-semiconductor layers of the semiconductor device according to the embodiment 5. As shown in FIG. 11, the impurity concentration distribution in the depth direction in the first n-semiconductor layer 2a, denoted by numeral 63, and the impurity concentration distribution in the depth direction in the second n-semiconductor layer 3a, denoted by numeral 64, are uniform. In addition, the value Nn1 of the impurity concentration in the second n-semiconductor layer 3a is lower than the value Nn0 of the impurity concentration in the first n-semiconductor layer 2a. The value Np0 of the impurity concentration in the first p-semiconductor layer 2b is higher than the value Nn0 of the impurity concentration in the first n-semiconductor layer 2a, though the conductivity types of the impurities are different from each other.

For example, the impurity concentrations in the first p-semiconductor layer 2b is on the order of $4.7 \times 10^{15}$ cm$^{-3}$, and the impurity concentration in the first n-semiconductor layer 2a is on the order of $4.5 \times 10^{15}$ cm$^{-3}$. The impurity concentration in the second p-semiconductor layer 3b is on the order of $5.8 \times 10^{15}$ cm$^{-3}$, and the impurity concentration in the second n-semiconductor layer 3a is on the order of $3.0 \times 10^{15}$ cm$^{-3}$.

Figure 12:
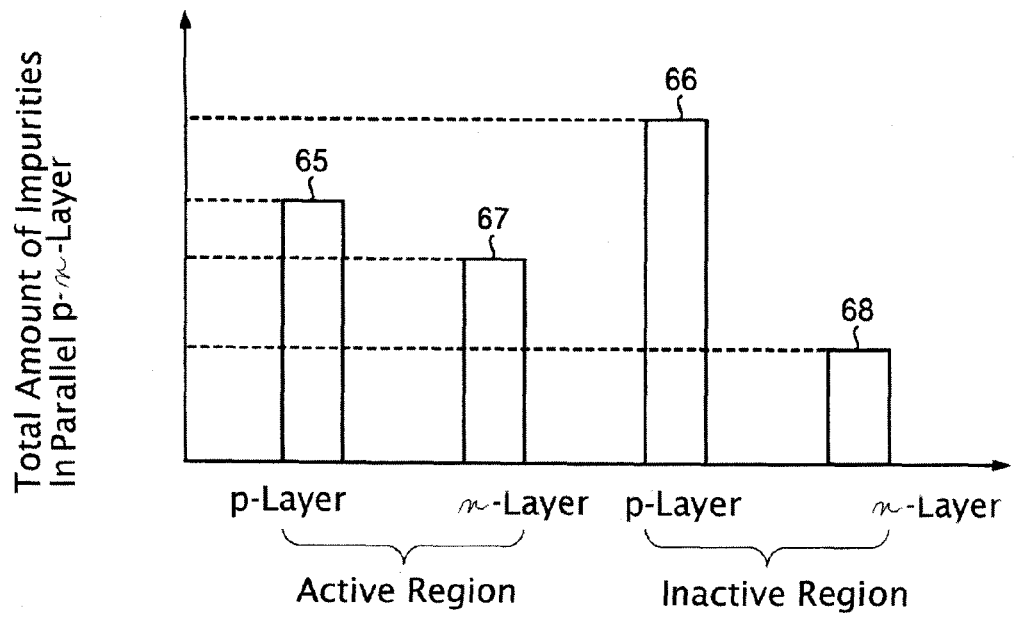
FIG. 12 is a diagram showing relations among total amounts of impurities in the p-semiconductor layers and the n-semiconductor layers in a parallel p-n layer in the semiconductor device according to the embodiment 5.

In the first p-semiconductor layer 2b and the first n-semiconductor layer 2a, their widths are approximately equal to each other, while the impurity concentrations in them differ from each other. Thus, as shown in FIG. 12 illustrating relations among total amounts of impurities in the p-semiconductor layers and the n-semiconductor layers in the parallel p-n layer, the total amount of impurities in the first p-semiconductor layer 2b, denoted by numeral 65, becomes larger than the total amount of impurities in the first n-semiconductor layer 2a, denoted by numeral 67. Moreover, the width of the second p-semiconductor layer 3b is larger than the width of the first p-semiconductor layer 2b. Thus, the total amount of impurities in the second p-semiconductor layer 3b, denoted by numeral 66, becomes larger than the total amount of impurities 65 in the first p-semiconductor layer 2b.

Furthermore, the width of the second n-semiconductor layer 3a is smaller than the width of the first n-semiconductor layer 2a. Thus, the total amount of impurities in the second n-semiconductor layer 3a, denoted by numeral 68, becomes smaller than the total amount of impurities 67 in the first n-semiconductor layer 2a. However, FIG. 12 only illustrates relations of large or small among total amounts of impurities in the semiconductor layers. Thus, the figure does not illustrate so far as how large or how small the total amounts of impurities are among them.

In the above-explained arrangement, in the inactive region 200, the impurity concentration in the second p-semiconductor layer 3b is higher than that in the embodiment 1 and the total amount of impurities in the second p-semiconductor layer 3b is larger than that in the embodiment 1. Thus, a depletion layer is made to expand in the inactive region 200 more easily than in the embodiment 1. This increases a breakdown voltage in the inactive region 200 to become higher than the breakdown voltage in the active region 100. Therefore, avalanche breakdown occurs in the active region 100, which makes concentration of an avalanche current hard to occur to enhance avalanche durability. Moreover, the impurity concentration made higher in the first p-semiconductor layer 2b in the active region 100 suppresses negative resistance component even though a hole current is accumulated when an avalanche current is generated. This further enhances avalanche durability.

The sixth embodiment is a vertical MOSFET chip in which, in the vertical MOSFET chip of the third embodiment, the impurity concentrations in the second p-semiconductor layer 3b and the second n-semiconductor layer 3a in the second parallel p-n layer are made approximately equal to those in the first p-semiconductor layer 2b and the first n-semiconductor layer 2a in the first parallel p-n layer, respectively. The plane structure of the parallel p-n layer is the same as that shown in FIG. 1. Moreover, the cross sectional structure taken on the cutting line A-A in FIG. 1 is the same as that shown in FIG. 2. Dimensions, impurity concentrations and the like in all parts are, unless otherwise notified, the same as those in the embodiment 5.

Figure 13:
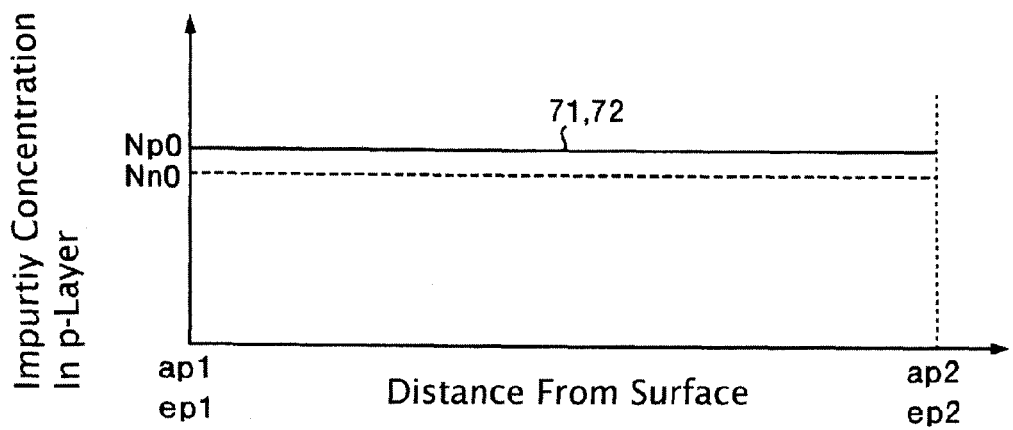
FIG. 13 is a diagram showing impurity concentration distributions in the depth direction in p-semiconductor layers of the semiconductor device according to the embodiment 6.
Figure 14:
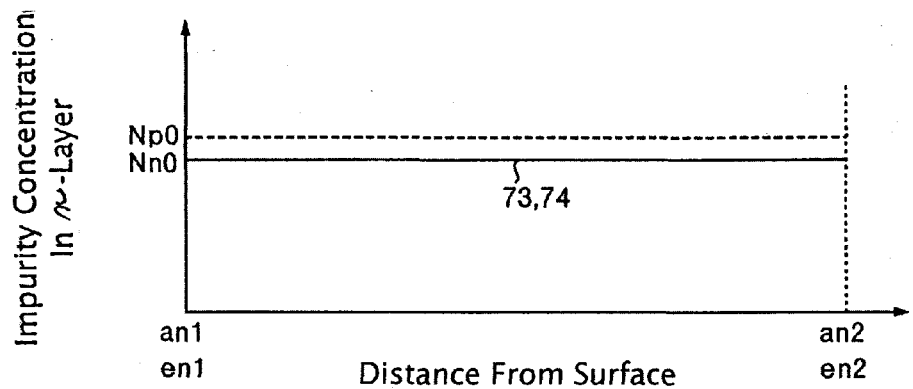
FIG. 14 is a diagram showing impurity concentration distributions in the depth direction in n-semiconductor layers of the semiconductor device according to the embodiment 6.

FIG. 13 is a diagram showing impurity concentration distributions in the depth direction in the p-semiconductor layers of the semiconductor device according to the embodiment 6. As shown in FIG. 13, both of the impurity concentration distribution in the depth direction in the first p-semiconductor layer 2b, denoted by numeral 71, and the impurity concentration distribution in the depth direction in the second p-semiconductor layer 3b, denoted by numeral 72, are uniform with impurity concentration values approximately equal to each other, each value being approximately equal to Np0. Moreover, FIG. 14 is a diagram showing impurity concentration distributions in the depth direction in the n-semiconductor layers of the semiconductor device according to the embodiment 6. As shown in FIG. 14, the impurity concentration distribution in the depth direction in the first n-semiconductor layer 2a, denoted by numeral 73, and the impurity concentration distribution in the depth direction in the second n-semiconductor layer 3a, denoted by numeral 74, are uniform with impurity concentration values approximately equal to each other, each value being approximately equal to Nn0. In addition, the value Np0 of the impurity concentration in each of the first p-semiconductor layer 2b and the second p-semiconductor layer 3b is higher than the value Nn0 of the impurity concentration in each of the first n-semiconductor layer 2a and the second n-semiconductor layer 3a, though the conductivity types of the impurities are different from each other.

For example, both of the first p-semiconductor layer 2b and the second p-semiconductor layer 3b have an impurity concentration of the order of $4.7 \times 10^{15}$ cm$^{-3}$. Both of the first n-semiconductor layer 2a and the second n-semiconductor layer 3a have an impurity concentration of the order of $4.5 \times 10^{15}$ cm$^{-3}$.

In the first p-semiconductor layer 2b and the first n-semiconductor layer 2a, their widths are approximately equal to each other, while the impurity concentrations in them differ from each other. Thus, the total amount of impurities in the first p-semiconductor layer 2b becomes larger than the total amount of impurities in the first n-semiconductor layer 2a. Moreover, the width of the second p-semiconductor layer 3b is larger than the width of the first p-semiconductor layer 2b. Thus, the total amount of impurities in the second p-semiconductor layer 3b becomes larger than the total amount of impurities in the first p-semiconductor layer 2b. While, the width of the second n-semiconductor layer 3a is smaller than the width of the first n-semiconductor layer 2a. Thus, the total amount of impurities in the second n-semiconductor layer 3a becomes smaller than the total amount of impurities in the first n-semiconductor layer 2a. Therefore, the relations of being large or small among total amounts of impurities in the first n-semiconductor layer 2a, the first p-semiconductor layer 2b, the second n-semiconductor layer 3a and the second p-semiconductor layer 3b in the embodiment 6, when illustrated without taking the degree of being large or small into consideration, become as shown in FIG. 12.

The seventh embodiment is a vertical MOSFET chip in which, in the vertical MOSFET chip of the embodiment 3, the whole parallel p-n layer in the section parallel to the stripes in the inactive region 210 is made up of the second parallel p-n layer with charges being in an unbalanced state. The plane structure of the parallel p-n layer is the same as that shown in FIG. 8. Moreover, the cross sectional structure taken on the cutting line B-B in FIG. 8 is the same as that shown in FIG. 9. Dimensions, impurity concentrations and the like in all parts are, unless otherwise notified, the same as those in the third embodiment.

The eighth embodiment is a vertical MOSFET chip in which, in the vertical MOSFET chip of the embodiment 3, the whole parallel p-n layer in the section parallel to the stripes in the inactive region 210 is made up of the second parallel p-n layer with charges being in an unbalanced state. Along with this, the impurity concentrations in the second p-semiconductor layer 3b and the second n-semiconductor layer 3a in the second parallel p-n layer are made approximately equal to those in the first p-semiconductor layer 2b and the first n-semiconductor layer 2a in the first parallel p-n layer, respectively. The plane structure of the parallel p-n layer is the same as that shown in FIG. 8. Moreover, the cross sectional structure taken on the cutting line B-B in FIG. 8 is the same as that shown in FIG. 9. Dimensions, impurity concentrations and the like in all parts are, unless otherwise notified, the same as those in the third embodiment.

The distribution in the depth direction of each of the impurity concentrations in the first p-semiconductor layer 2b and the second p-semiconductor layer 3b, denoted by numerals 71 and 72 respectively, is as shown in FIG. 13. Moreover, the distribution in the depth direction of each of the impurity concentrations in the first n-semiconductor layer 2a and the second n-semiconductor layer 3a, denoted by numerals 73 and 74 respectively, is as shown in FIG. 14. In addition, the value Np0 of the impurity concentration in each of the first p-semiconductor layer 2b and the second p-semiconductor layer 3b is higher than the value Nn0 of the impurity concentration in each of the first n-semiconductor layer 2a and the second n-semiconductor layer 3a.

For example, both of the first p-semiconductor layer 2b and the second p-semiconductor layer 3b have an impurity concentration of the order of $4.7 \times 10^{15}$ cm$^{-3}$. Both of the first n-semiconductor layer 2a and the second n-semiconductor layer 3a have an impurity concentration of the order of $4.5 \times 10^{15}$ cm$^{-3}$. Moreover, as was explained in the description of the sixth embodiment, the relations of being large or small among total amounts of impurities in the first n-semiconductor layer 2a, the first p-semiconductor layer 2b, the second n-semiconductor layer 3a and the second p-semiconductor layer 3b in the embodiment 8, when illustrated without taking the degree of being large or small into consideration, become as shown in FIG. 12.

Figure 15:
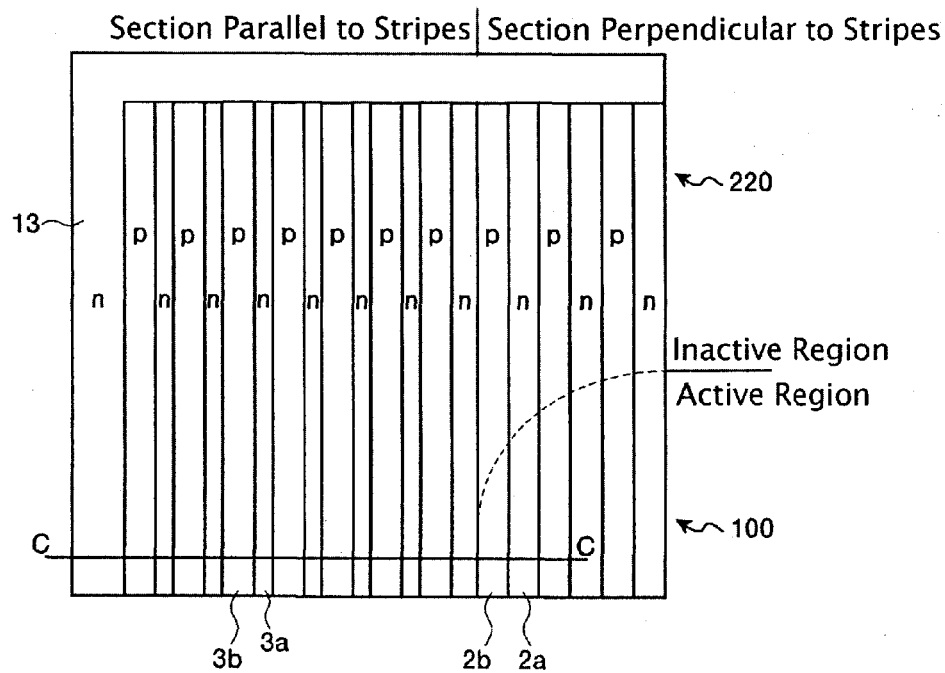
FIG. 15 is a partial plan view showing a principal section of a vertical MOSFET chip as a semiconductor device according to an embodiment 9 of the invention.
Figure 16:
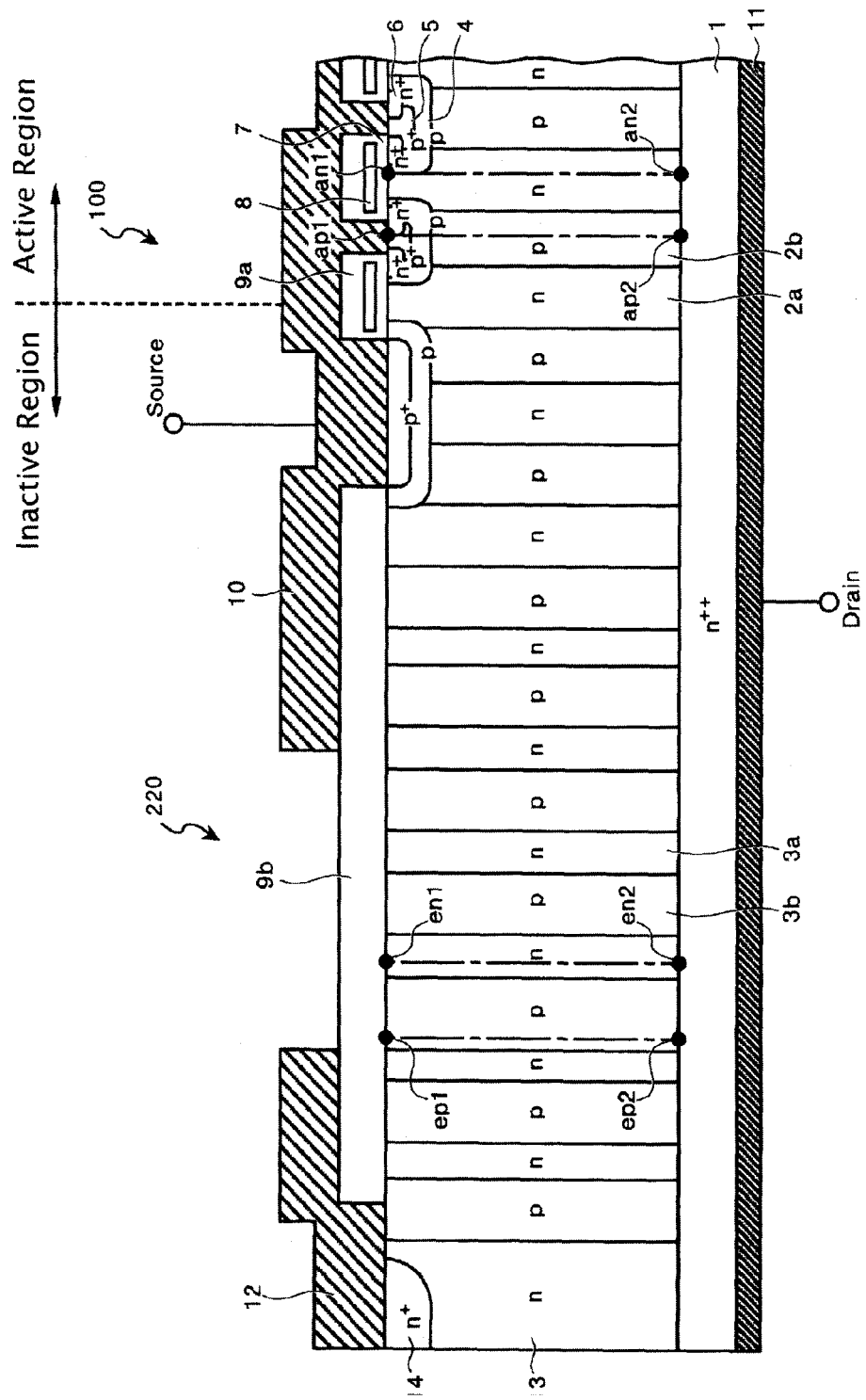
FIG. 16 is a vertical cross sectional view showing a cross sectional structure taken on the cutting line C-C in FIG. 15.

FIG. 15 is a partial plan view showing a principal section of a vertical MOSFET chip according to an embodiment 9 of the invention. In FIG. 15, illustrations of the surface layer of the parallel p-n layer and surface structures of elements formed thereon are omitted. FIG. 16 is a vertical cross sectional view showing a cross sectional structure taken on the cutting line C-C traversing the active region and the inactive region in FIG. 15 in the direction perpendicular to the stripes.

As shown in FIG. 15 and FIG. 16, the ninth embodiment is a vertical MOSFET chip in which, in the second parallel p-n layer in the section parallel to the stripes in the inactive region 220, the width of the second p-semiconductor layer 3b is made equal to that of the first p-semiconductor layer 2b. While, the width of the second n-semiconductor layer 3a is made smaller than the width of the first n-semiconductor layer 2a in the first parallel p-n layer. Therefore, in the second parallel p-n layer, the state of interdiffusion of impurities between the second n-semiconductor layer 3a and the second p-semiconductor layer 3b is made different from that in the first embodiment. This makes impurity concentrations in both of the second n-semiconductor layer 3a and the second p-semiconductor layer 3b different from those in the embodiment 1. The arrangements other than the above, dimensions, impurity concentrations and the like in all parts are, unless otherwise notified, the same as those in the embodiment 1.

The distribution in the depth direction of each of the impurity concentrations in the first p-semiconductor layer 2b and the second p-semiconductor layer 3b is as shown in FIG. 3. Moreover, the distribution in the depth direction of each of the impurity concentrations in the first n-semiconductor layer 2a and the second n-semiconductor layer 3a is as shown in FIG. 4. Furthermore, the value Np0 of the impurity concentration in the first p-semiconductor layer 2b is approximately equal to the value Nn0 of the impurity concentration in the first n-semiconductor layer 2a, though the conductivity types of the impurities are different from each other.

For example, the impurity concentrations in the second p-semiconductor layer 3b is on the order of $5.0 \times 10^{15}$ cm$^{-3}$, and the impurity concentration in the second n-semiconductor layer 3a is on the order of $2.0 \times 10^{15}$ cm$^{-3}$. Moreover, the width of the second n-semiconductor layer 3a is about 3.5 µm, and the width of the second p-semiconductor layer 3b is about 5.0 µm. The relations of being large or small among total amounts of impurities in the first n-semiconductor layer 2a, the first p-semiconductor layer 2b, the second n-semiconductor layer 3a and the second p-semiconductor layer 3b, when illustrated without taking the degree of being large or small into consideration, become as shown in FIG. 5.

In forming the parallel p-n layer with the above-explained structure, the width of each of trenches for forming the first p-semiconductor layer 2b becomes equal to the width of each of trenches for forming the second p-semiconductor layer 3b. This facilitates a process for carrying out trench etching and a process for carrying out epitaxial growth of filling the trenches with the p-semiconductor layers to reduce variations in forming the parallel p-n layer.

The tenth embodiment is a vertical MOSFET chip in which, in the vertical MOSFET chip of the ninth embodiment, the impurity concentrations in the second p-semiconductor layer 3b and the second n-semiconductor layer 3a in the second parallel p-n layer are made approximately equal to those in the first p-semiconductor layer 2b and the first n-semiconductor layer 2a in the first parallel p-n layer. The plane structure of the parallel p-n layer is the same as that shown in FIG. 15. Moreover, the cross sectional structure taken on the cutting line C-C in FIG. 15 is the same as that shown in FIG. 16. Dimensions, impurity concentrations and the like in all parts are, unless otherwise notified, the same as those in the embodiment 9.

The distribution in the depth direction of each of the impurity concentrations in the first p-semiconductor layer 2b and the second p-semiconductor layer 3b is as shown in FIG. 6. Moreover, the distribution in the depth direction of each of the impurity concentrations in the first n-semiconductor layer 2a and the second n-semiconductor layer 3a is as shown in FIG. 7. Furthermore, the value Np0 of the impurity concentration in each of the first p-semiconductor layer 2b and the second p-semiconductor layer 3b is approximately equal to the value Nn0 of the impurity concentration in each of the first n-semiconductor layer 2a and the second n-semiconductor layer 3a, though the conductivity types of the impurities are different from each other. For example, all of the first p-semiconductor layer 2b, the first n-semiconductor layer 2a, the second p-semiconductor layer 3b and the second n-semiconductor layer 3a have an impurity concentration of the order of $4.5 \times 10^{15}$ cm$^{-3}$.

Figure 17:
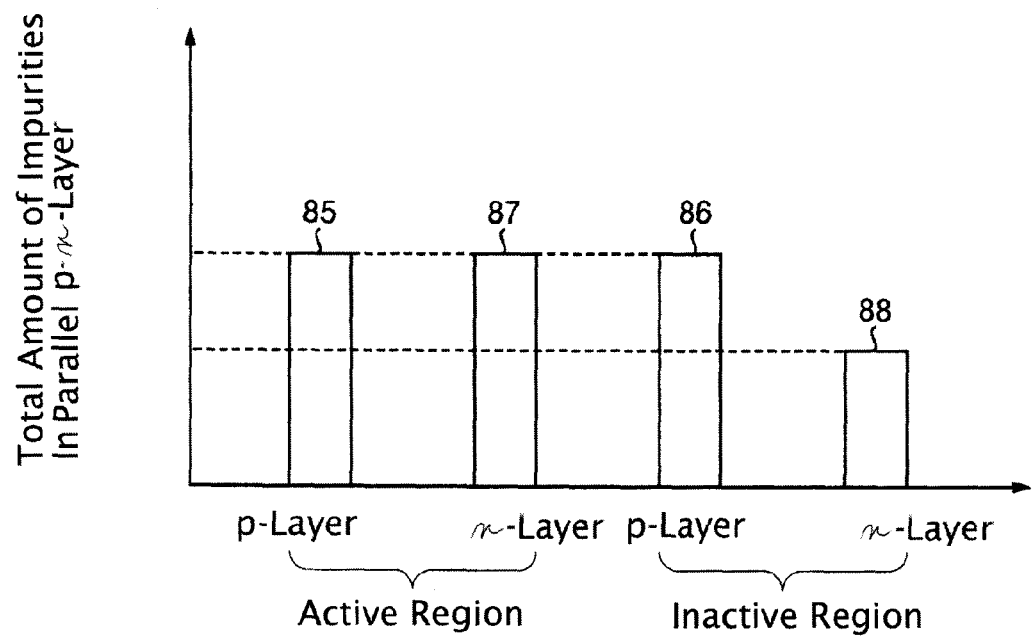
FIG. 17 is a diagram showing relations among total amounts of impurities in p-semiconductor layers and n-semiconductor layers in a parallel p-n layer in the semiconductor device according to the embodiment 10.

The relations of being large or small among total amounts of impurities in the first n-semiconductor layer 2a, the first p-semiconductor layer 2b, the second n-semiconductor layer 3a and the second p-semiconductor layer 3b, when illustrated without taking the degree of being large or small into consideration, become as shown in FIG. 17. However, FIG. 17 only illustrates relations of large or small among total amounts of impurities in the semiconductor layers. Thus, the figure does not illustrate so far as how large or how small the total amounts of impurities are among them. The width of the first p-semiconductor layer 2b, that of the first n-semiconductor layer 2a and that of the second p-semiconductor layer 3b are approximately equal to one another. Thus, the total amount of impurities in the first p-semiconductor layer 2b, denoted by numeral 85, the total amount of impurities in the first n-semiconductor layer 2a, denoted by numeral 87, and the total amount of impurities in the second p-semiconductor layer 3b, denoted by numeral 86, become approximately equal to one another. While, the width of the second n-semiconductor layer 3a is smaller than that of the first n-semiconductor layer 2a. Thus, the total amount of impurities in the second n-semiconductor layer 3a, denoted by numeral 88, becomes smaller than the total amount of impurities 87 in the first n-semiconductor layer 2a.

Figure 18:
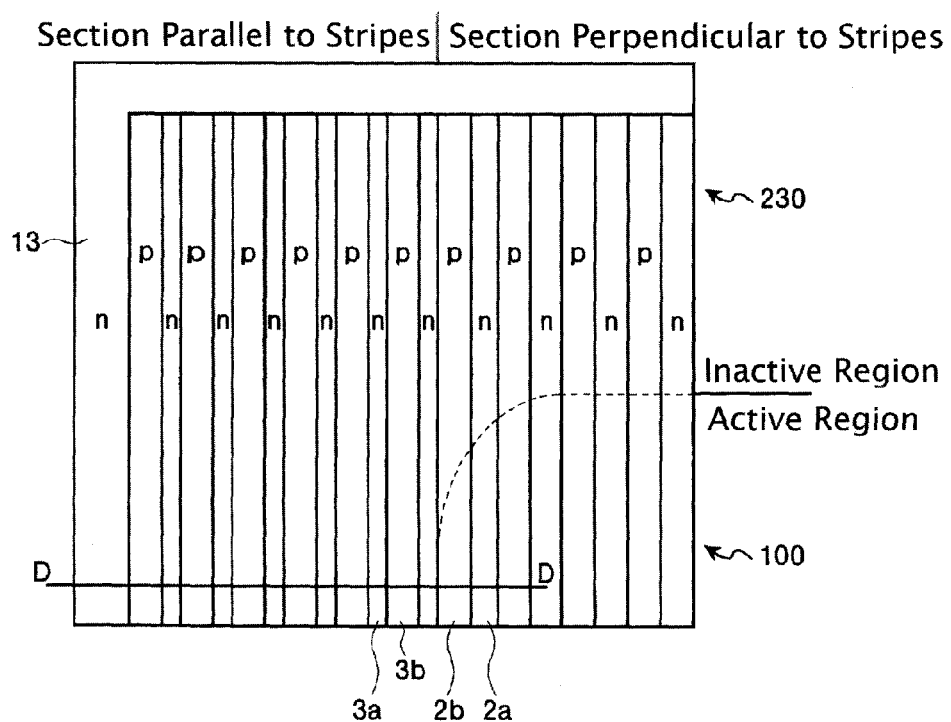
FIG. 18 is a partial plan view showing a principal section of a vertical MOSFET chip as a semiconductor device according to an embodiment 11 of the invention.
Figure 19:
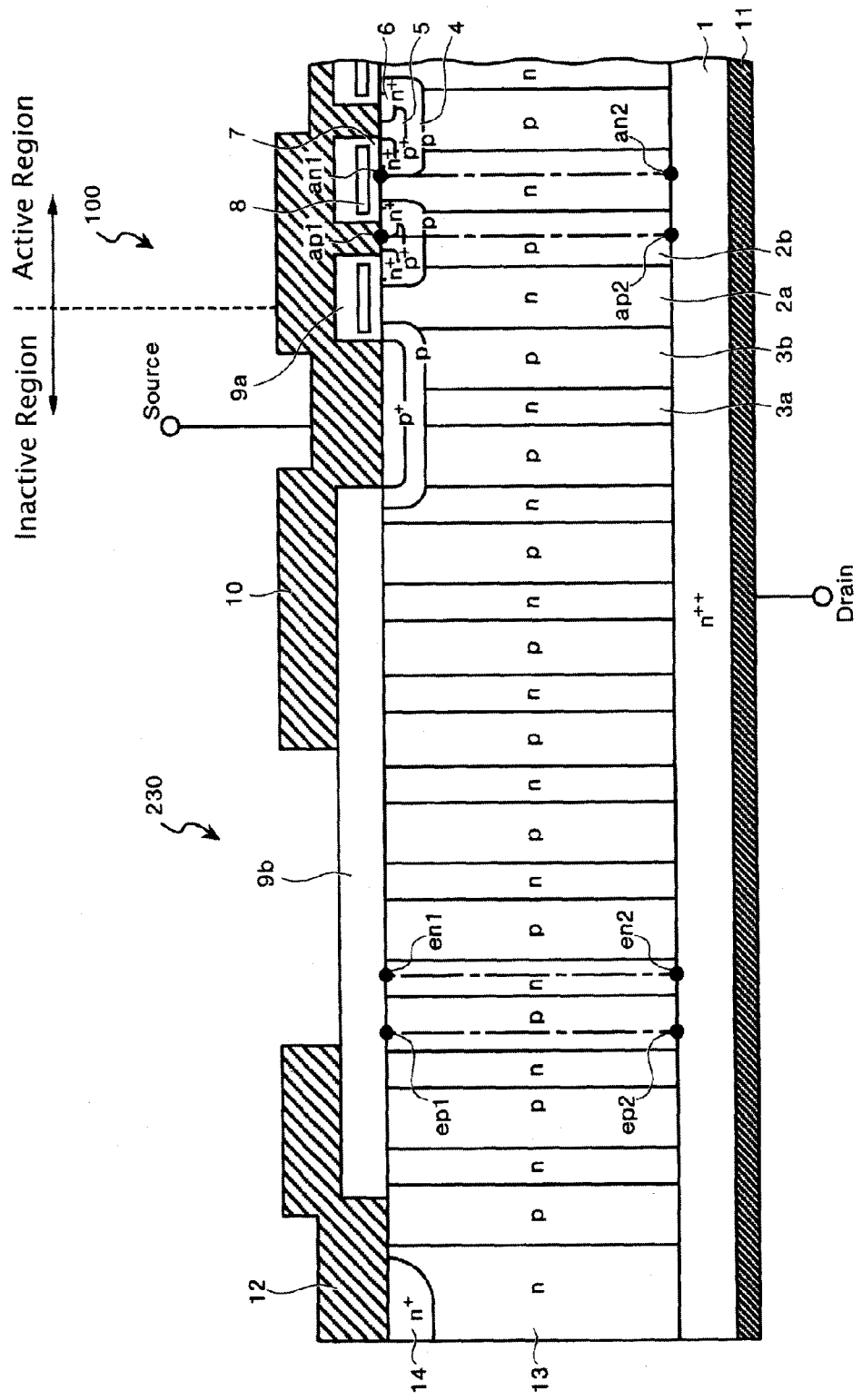
FIG. 19 is a vertical cross sectional view showing a cross sectional structure taken on the cutting line D-D in FIG. 18.

FIG. 18 is a partial plan view showing a principal section of a vertical MOSFET chip according to an eleventh embodiment of the invention. In FIG. 18, illustrations of the surface layer of the parallel p-n layer and surface structures of elements formed thereon are omitted. FIG. 19 is a vertical cross sectional view showing a cross sectional structure taken on the cutting line D-D traversing the active region and the inactive region in FIG. 18 in the direction perpendicular to the stripes.

As shown in FIG. 18 and FIG. 19, the eleventh embodiment is a vertical MOSFET chip in which, in the inactive region 230, the whole parallel p-n layer in the section parallel to the stripes is made up of the second parallel p-n layer with charges being in an unbalanced state. Along with this, the width of the second p-semiconductor layer 3b is made equal to that of the first p-semiconductor layer 2b. While, the width of the second n-semiconductor layer 3a is made smaller than the width of the first n-semiconductor layer 2a. The arrangements other than the above, dimensions, impurity concentrations and the like in all parts are the same as those in the ninth embodiment.

The twelfth embodiment is a vertical MOSFET chip in which, in the vertical MOSFET chip of the eleventh embodiment, the impurity concentrations in the second p-semiconductor layer 3b and the second n-semiconductor layer 3a in the second parallel p-n layer are made approximately equal to those in the first p-semiconductor layer 2b and the first n-semiconductor layer 2a in the first parallel p-n layer. The plane structure of the parallel p-n layer is the same as that shown in FIG. 18. Moreover, the cross sectional structure taken on the cutting line D-D in FIG. 18 is the same as that shown in FIG. 19. Dimensions, impurity concentrations and the like in all parts are, unless otherwise notified, the same as those in the embodiment 11.

The distribution in the depth direction of each of the impurity concentrations in the first p-semiconductor layer 2b and the second p-semiconductor layer 3b is as shown in FIG. 6. Moreover, the distribution in the depth direction of each of the impurity concentrations in the first n-semiconductor layer 2a and the second n-semiconductor layer 3a is as shown in FIG. 7. Furthermore, the value Np0 of the impurity concentration in each of the first p-semiconductor layer 2b and the second p-semiconductor layer 3b is approximately equal to the value Nn0 of the impurity concentration in each of the first n-semiconductor layer 2a and the second n-semiconductor layer 3a, though the conductivity types of the impurities are different from each other.

For example, all of the first p-semiconductor layer 2b, the first n-semiconductor layer 2a, the second p-semiconductor layer 3b and the second n-semiconductor layer 3a have an impurity concentration of the order of $4.5 \times 10^{15}$ cm$^{-3}$. The relations of being large or small among total amounts of impurities in the first n-semiconductor layer 2a, the first p-semiconductor layer 2b, the second n-semiconductor layer 3a and the second p-semiconductor layer 3b, when illustrated without taking the degree of being large or small into consideration, become as shown in FIG. 17.

The thirteenth embodiment is a vertical MOSFET chip in which, the impurity concentration in the first p-semiconductor layer 2b in the first parallel p-n layer and the impurity concentration in the second p-semiconductor layer 3b in the second parallel p-n layer are made higher than those in the embodiment 9 to make the charges in the first parallel p-n layer in an unbalanced state also in the active region 100. The plane structure of the parallel p-n layer is the same as that shown in FIG. 15. Moreover, the cross sectional structure taken on the cutting line C-C in FIG. 15 is the same as that shown in FIG. 16. Dimensions, impurity concentrations and the like in all parts are, unless otherwise notified, the same as those in the ninth embodiment.

The distribution in the depth direction of each of the impurity concentrations in the first p-semiconductor layer 2$b$ and the second p-semiconductor layer 3$b$ is as shown in FIG. 10. Moreover, the distribution in the depth direction of each of the impurity concentrations in the first n-semiconductor layer 2$a$ and the second n-semiconductor layer 3$a$ is as shown in FIG. 11. The value Np0 of the impurity concentration in the first p-semiconductor layer 2$b$ is higher than the value Nn0 of the impurity concentration in the first n-semiconductor layer 2$a$, though the conductivity types of the impurities are different from each other.

For example, the impurity concentrations in the first p-semiconductor layer 2$b$ is on the order of $4.7\times10^{15}$ cm$^{-3}$, and the impurity concentration in the first n-semiconductor layer 2$a$ is on the order of $4.5\times10^{15}$ cm$^{-3}$. The impurity concentration in the second p-semiconductor layer 3$b$ is on the order of $5.3\times10^{15}$ cm$^{-3}$, and the impurity concentration in the second n-semiconductor layer 3$a$ is on the order of $1.9\times10^{15}$ cm$^{-3}$. The relations of being large or small among total amounts of impurities in the first n-semiconductor layer 2$a$, the first p-semiconductor layer 2$b$, the second n-semiconductor layer 3$a$ and the second p-semiconductor layer 3$b$, when illustrated without taking the degree of being large or small into consideration, become as shown in FIG. 12.

The fourteenth embodiment is a vertical MOSFET chip in which, in the vertical MOSFET chip of the thirteenth embodiment, the impurity concentrations in the second p-semiconductor layer 3$b$ and the second n-semiconductor layer 3$a$ in the second parallel p-n layer are made approximately equal to those in the first p-semiconductor layer 2$b$ and the first n-semiconductor layer 2$a$ in the first parallel p-n layer, respectively. The plane structure of the parallel p-n layer is the same as that shown in FIG. 15. Moreover, the cross sectional structure taken on the cutting line C-C in FIG. 15 is the same as that shown in FIG. 16. Dimensions, impurity concentrations and the like in all parts are, unless otherwise notified, the same as those in the thirteenth embodiment.

The distribution in the depth direction of each of the impurity concentrations in the first p-semiconductor layer 2$b$ and the second p-semiconductor layer 3$b$ is as shown in FIG. 13. Moreover, the distribution in the depth direction of each of the impurity concentrations in the first n-semiconductor layer 2$a$ and the second n-semiconductor layer 3$a$ is as shown in FIG. 14. In addition, the value Np0 of the impurity concentration in each of the first p-semiconductor layer 2$b$ and the second p-semiconductor layer 3$b$ is higher than the value Nn0 of the impurity concentration in each of the first n-semiconductor layer 2$a$ and the second n-semiconductor layer 3$a$.

For example, both of the first p-semiconductor layer 2$b$ and the second p-semiconductor layer 3$b$ have an impurity concentration of the order of $4.7\times10^{15}$ cm$^{-3}$. Both of the first n-semiconductor layer 2$a$ and the second n-semiconductor layer 3$a$ have an impurity concentration of the order of $4.5\times10^{15}$ cm$^{-3}$.

Figure 20:
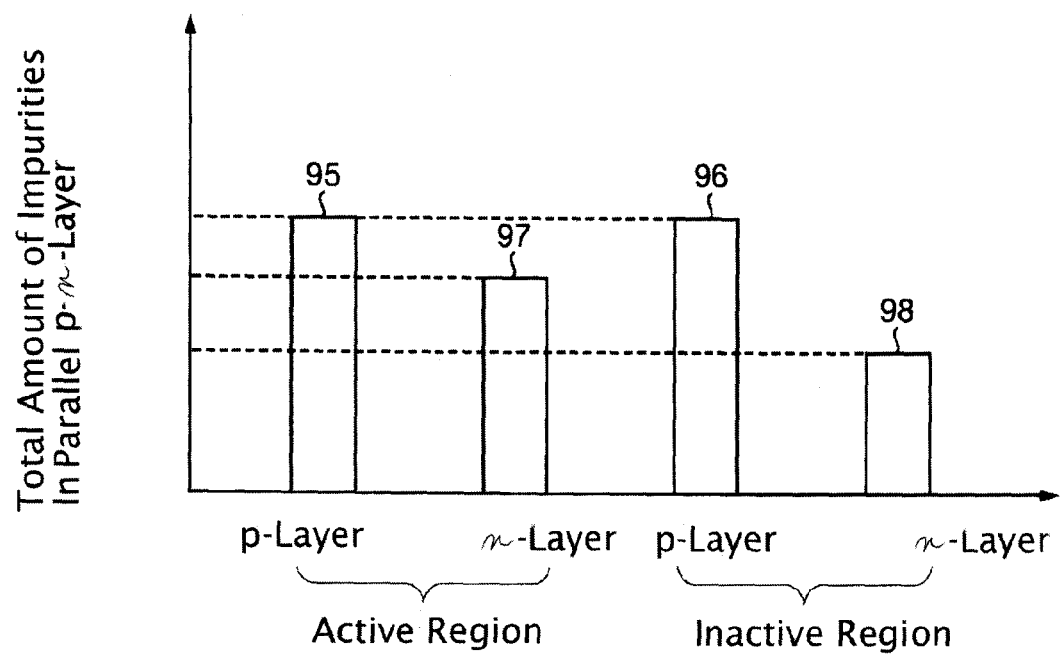
FIG. 20 is a diagram showing relations among total amounts of impurities in p-semiconductor layers and n-semiconductor layers in a parallel p-n layer in the semiconductor device according to the embodiment 14.

The relations of being large or small among total amounts of impurities in the first n-semiconductor layer 2$a$, the first p-semiconductor layer 2$b$, the second n-semiconductor layer 3$a$ and the second p-semiconductor layer 3$b$, when illustrated without taking the degree of being large or small into consideration, become as shown in FIG. 20. However, FIG. 20 only illustrates relations of large or small among total amounts of impurities in the semiconductor layers. Thus, the figure does not illustrate so far as how large or how small the total amounts of impurities are among them.

In the first p-semiconductor layer 2$b$ and the first n-semiconductor layer 2$a$, their widths are approximately equal to each other, while the impurity concentrations in them differ from each other. Thus, the total amount of impurities in the first p-semiconductor layer 2$b$, denoted by numeral 95, becomes larger than the total amount of impurities in the first n-semiconductor layer 2$a$, denoted by numeral 97. The width of the first p-semiconductor layer 2$b$ and that of the second p-semiconductor layer 3$b$ are approximately equal to each other. Thus, the total amount of impurities 95 in the first p-semiconductor layer 2$b$ and the total amount of impurities in the second p-semiconductor layer 3$b$, denoted by numeral 96, become approximately equal to each other. While, the width of the second n-semiconductor layer 3$a$ is smaller than that of the first n-semiconductor layer 2$a$. Thus, the total amount of impurities in the second n-semiconductor layer 3$a$, denoted by numeral 98, becomes smaller than the total amount of impurities 97 in the first n-semiconductor layer 2$a$.

The fifteenth embodiment is a vertical MOSFET chip in which, in the vertical MOSFET chip of the eleventh embodiment, the whole parallel p-n layer in the section parallel to the stripes in the inactive region 230 is made up of the second parallel p-n layer with charges being in an unbalanced state. The plane structure of the parallel p-n layer is the same as that shown in FIG. 18. Moreover, the cross sectional structure taken on the cutting line D-D in FIG. 18 is the same as that shown in FIG. 19. Dimensions, impurity concentrations and the like in all parts are, unless otherwise notified, the same as those in the eleventh embodiment.

The sixteenth embodiment is a vertical MOSFET chip in which, in the vertical MOSFET chip of the eleventh embodiment, the whole parallel p-n layer in the section parallel to the stripes in the inactive region 230 is made up of the second parallel p-n layer with charges being in an unbalanced state. Along with this, the impurity concentrations in the second p-semiconductor layer 3$b$ and the second n-semiconductor layer 3$a$ in the second parallel p-n layer are made approximately equal to those in the first p-semiconductor layer 2$b$ and the first n-semiconductor layer 2$a$ in the first parallel p-n layer, respectively. The plane structure of the parallel p-n layer is the same as that shown in FIG. 18. Moreover, the cross sectional structure taken on the cutting line D-D in FIG. 18 is the same as that shown in FIG. 19. Dimensions, impurity concentrations and the like in all parts are, unless otherwise notified, the same as those in the eleventh embodiment.

The distribution in the depth direction of each of the impurity concentrations in the first p-semiconductor layer 2$b$ and the second p-semiconductor layer 3$b$ is as shown in FIG. 13. Moreover, the distribution in the depth direction of each of the impurity concentrations in the first n-semiconductor layer 2$a$ and the second n-semiconductor layer 3$a$ is as shown in FIG. 14. In addition, the value Np0 of the impurity concentration in each of the first p-semiconductor layer 2$b$ and the second p-semiconductor layer 3$b$ is higher than the value Nn0 of the impurity concentration in each of the first n-semiconductor layer 2$a$ and the second n-semiconductor layer 3$a$.

For example, both of the first p-semiconductor layer 2$b$ and the second p-semiconductor layer 3$b$ have an impurity concentration of the order of $4.7\times10^{15}$ cm$^{-3}$. Both of the first n-semiconductor layer 2$a$ and the second n-semiconductor layer 3$a$ have an impurity concentration of the order of $4.5\times10^{15}$ cm$^{-3}$. Moreover, the relations of being large or small among total amounts of impurities in the first n-semiconductor layer 2$a$, the first p-semiconductor layer 2$b$, the second n-semiconductor layer 3$a$ and the second p-semiconductor layer 3b, when illustrated without taking the degree of being large or small into consideration, become as shown in FIG. 20.

Figure 21:
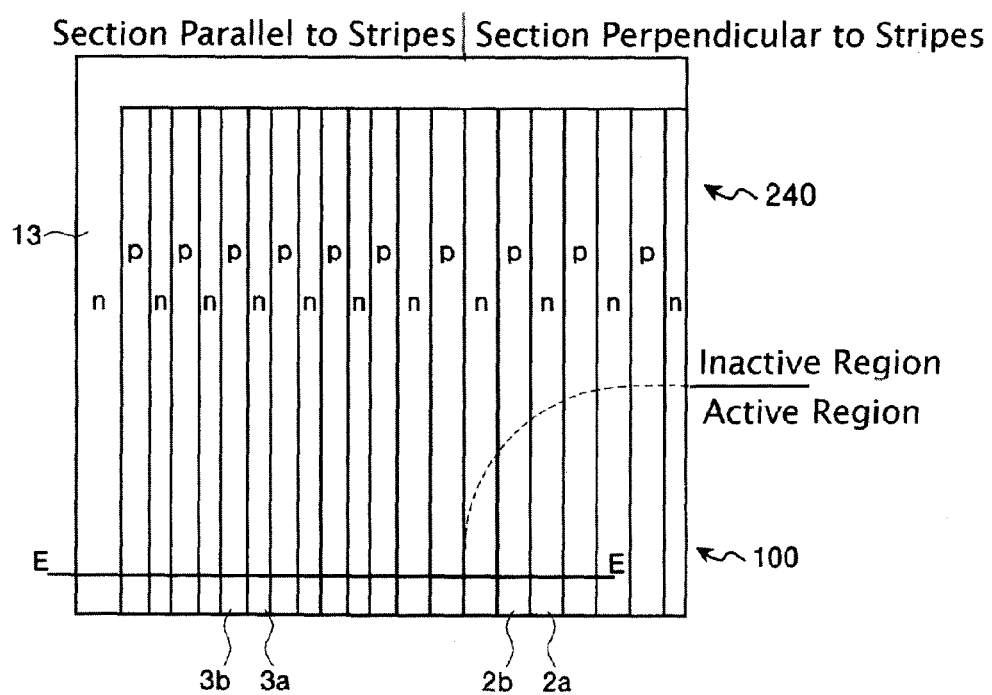
FIG. 21 is a partial plan view showing a principal section of a vertical MOSFET chip as a semiconductor device according to an embodiment 17 of the invention.
Figure 22:
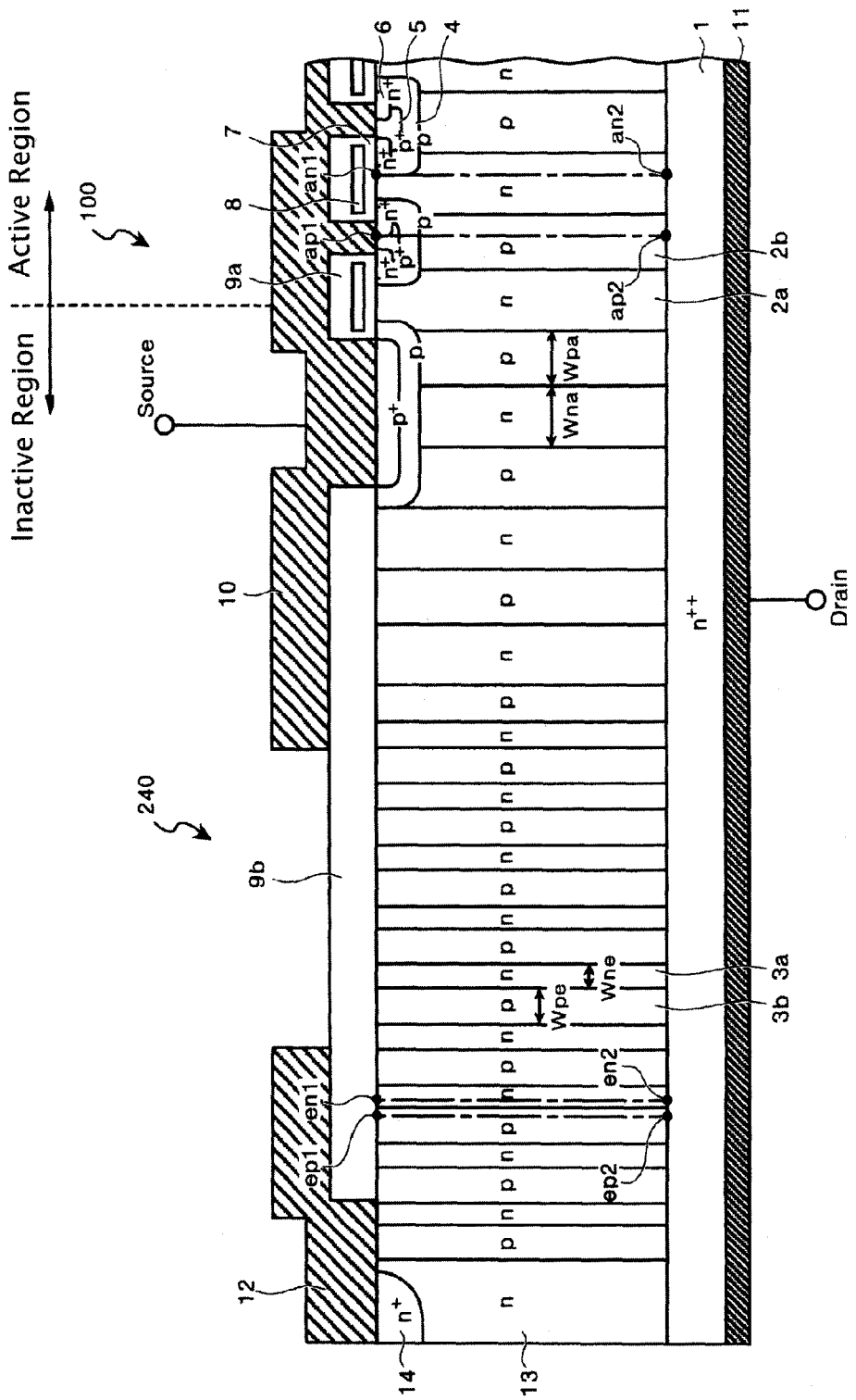
FIG. 22 is a vertical cross sectional view showing a cross sectional structure taken on the cutting line E-E in FIG. 21.

FIG. 21 is a partial plan view showing a principal section of a vertical MOSFET chip according to an embodiment 17 of the invention. In FIG. 21, illustrations of the surface layer of the parallel p-n layer and surface structures of elements formed thereon are omitted. FIG. 22 is a vertical cross sectional view showing a cross sectional structure taken on the cutting line E-E traversing the active region and the inactive region in FIG. 21 in the direction perpendicular to the stripes.

As shown in FIG. 21 and FIG. 22, the seventeenth embodiment is a vertical MOSFET chip in which, in the second parallel p-n layer in the section parallel to the stripes in the inactive region 240, the dimension Wne of the width of the second n-semiconductor layer 3a and the dimension Wpe of the width of the second p-semiconductor layer 3b are made smaller than the dimension Wna of the width of the first n-semiconductor layer 2a and the dimension Wpa of the width of the first p-semiconductor layer 2b in the active region, respectively. Furthermore, the dimension Wne of the width of the second n-semiconductor layer 3a is made smaller than the dimension Wpe of the width of the second p-semiconductor layer 3b to bring the charges in the second parallel p-n layer to be in an unbalanced state.

Figure 23:
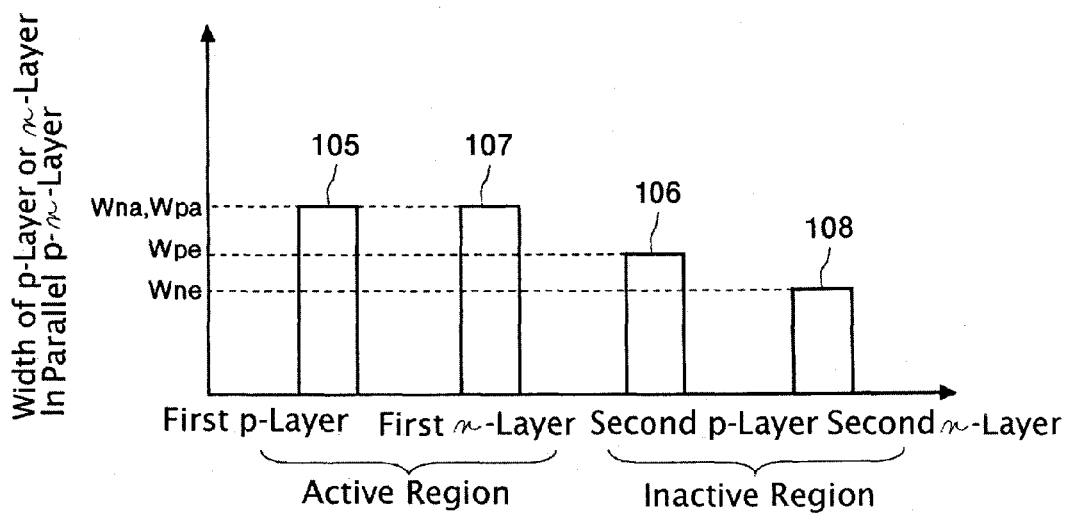
FIG. 23 is a diagram schematically showing relations among widths of p-semiconductor layers and n-semiconductor layers in a parallel p-n layer in the semiconductor device according to the embodiment 17.

In FIG. 23, there are schematically shown the relations among the widths of the n-semiconductor layers 2a and 3a and the p-semiconductor layers 2b and 3b in the parallel p-n layer. As shown in FIG. 23, in the embodiment 17, the dimension Wpa of the width of the first p-semiconductor layer 2b, denoted by numeral 105, and the dimension Wna of the width of the first n-semiconductor layer 2a, denoted by numeral 107, are equal to each other. The dimension Wpe of the width of the second p-semiconductor layer 3b, denoted by numeral 106, is smaller than the dimension Wpa of the width of the first p-semiconductor layer 2b and the dimension Wna of the width of the first n-semiconductor layer 2a. The dimension Wne of the width of the second n-semiconductor layer 3a, denoted by numeral 108, is smaller than the dimension Wpe of the width of the second p-semiconductor layer 3b.

Therefore, in the second parallel p-n layer, the state of interdiffusion of impurities between the second n-semiconductor layer 3a and the second p-semiconductor layer 3b is made different from that in the first embodiment. This makes impurity concentrations in both of the second n-semiconductor layer 3a and the second p-semiconductor layer 3b different from those in the first embodiment. The arrangements other than the above, dimensions, impurity concentrations and the like in all parts are, unless otherwise notified, the same as those in the first embodiment.

Figure 24:
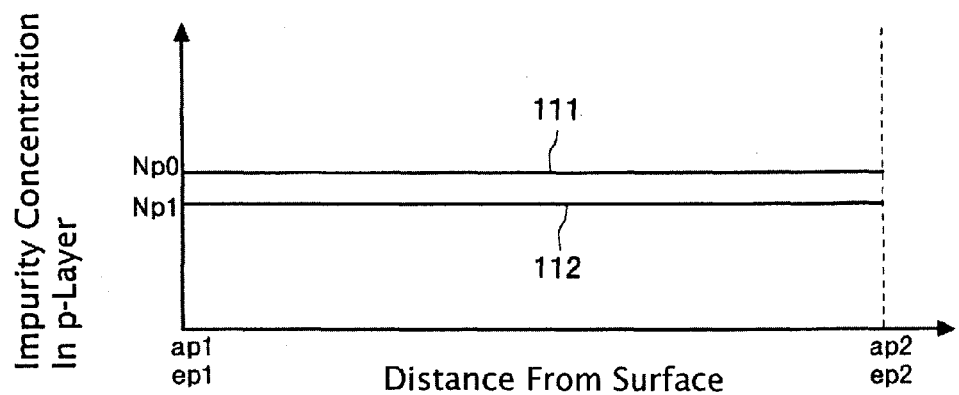
FIG. 24 is a diagram showing impurity concentration distributions in the depth direction in p-semiconductor layers of the semiconductor device according to the embodiment 17.
Figure 25:
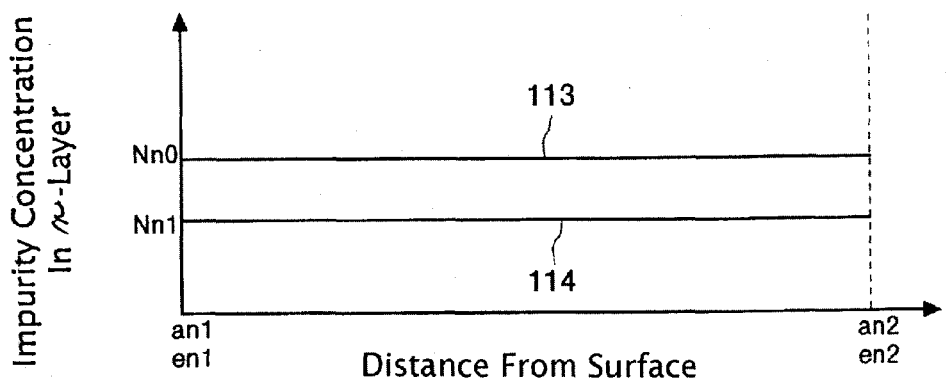
FIG. 25 is a diagram showing impurity concentration distributions in the depth direction in n-semiconductor layers of the semiconductor device according to the embodiment 17.

FIG. 24 is a diagram showing impurity concentration distributions in the depth direction in the p-semiconductor layers of the semiconductor device according to the embodiment 17. As shown in FIG. 24, both of the impurity concentration distribution in the depth direction in the first p-semiconductor layer 2b, denoted by numeral 111, and the impurity concentration distribution in the depth direction in the second p-semiconductor layer 3b, denoted by numeral 112, are uniform. Moreover, the value Np1 of the impurity concentration in the second p-semiconductor layer 3b is lower than the value Np0 of the impurity concentration in the first p-semiconductor layer 2b. Furthermore, FIG. 25 is a diagram showing impurity concentration distributions in the depth direction in the n-semiconductor layers of the semiconductor device according to the seventeenth embodiment. As shown in FIG. 25, the impurity concentration distribution in the depth direction in the first n-semiconductor layer 2a, denoted by numeral 113, and the impurity concentration distribution in the depth direction in the second n-semiconductor layer 3a, denoted by numeral 114, are uniform. In addition, the value Nn1 of the impurity concentration in the second n-semiconductor layer 3a is lower than the value Nn0 of the impurity concentration in the first n-semiconductor layer 2a. The value Np0 of the impurity concentration in the first p-semiconductor layer 2b is approximately equal to the value Nn0 of the impurity concentration in the first n-semiconductor layer 2a, though the conductivity types of the impurities are different from each other.

For example, the impurity concentrations in the second p-semiconductor layer 3b is on the order of $3.5 \times 10^{15}$ cm$^{-3}$, and the impurity concentration in the second n-semiconductor layer 3a is on the order of $2.0 \times 10^{15}$ cm$^{-3}$. Moreover, the width of the second n-semiconductor layer 3a is about 2.5 μm, and the width of the second p-semiconductor layer 3b is about 3.5 μm.

In the first p-semiconductor layer 2b and the first n-semiconductor layer 2a, both of their widths and impurity concentrations are approximately equal to each other. Thus, the total amount of impurities in the first p-semiconductor layer 2b, denoted by numeral 115, and the total amount of impurities in the first n-semiconductor layer 2a, denoted by numeral 117, become approximately equal to each other. While, the width of the second p-semiconductor layer 3b is smaller than that of the first p-semiconductor layer 2b, and the impurity concentration in the second p-semiconductor layer 3b is lower than the impurity concentration in the first p-semiconductor layer 2b. Thus, the total amount of impurities in the second p-semiconductor layer 3b, denoted by numeral 116, becomes smaller than the total amount of impurities 115 in the first p-semiconductor layer 2b.

Moreover, the width of the second n-semiconductor layer 3a is smaller than that of the first n-semiconductor layer 2a, and the impurity concentration in the second n-semiconductor layer 3a is lower than that in the first n-semiconductor layer 2a. Thus, the total amount of impurities in the second n-semiconductor layer 3a, denoted by numeral 118, becomes smaller than the total amount of impurities 117 in the first n-semiconductor layer 2a. Furthermore, the width of the second n-semiconductor layer 3a is smaller than that of the second p-semiconductor layer 3b, and the impurity concentration in the second n-semiconductor layer 3a is lower than that in the second p-semiconductor layer 3b. Thus, the total amount of impurities 118 in the second n-semiconductor layer 3a becomes smaller than the total amount of impurities 116 in the second p-semiconductor layer 3b. However, FIG. 26 only illustrates relations of large or small among total amounts of impurities in the semiconductor layers. Thus, the figure does not illustrate so far as how large or how small the total amounts of impurities are among them.

According to the embodiment 17, in the parallel p-n layer located on the outside of the end of the source electrode 10, the widths of the second n-semiconductor layer 3a and the second p-semiconductor layer 3b are smaller than the widths of the first n-semiconductor layer 2a and the first p-semiconductor layer 2b in the active region 100, respectively. This makes a depletion layer liable to expand to easily ensure a high breakdown voltage. Since the width of the second n-semiconductor layer 3a is smaller than the widths of the first n-semiconductor layer 2a, the impurity concentration becomes higher and the total amount of impurities becomes larger in the second p-semiconductor layer 3b compared with those in the second n-semiconductor layer 3a. Therefore, the second p-semiconductor layer 3b performs a role of expanding a depletion layer outward like a guard ring to more easily ensure a high breakdown voltage.

Moreover, compared with a structure in which the width of the second p-semiconductor layer 3b is larger than that of the first p-semiconductor layer 2b, the structure according to the seventeenth embodiment provides the second p-semiconductor layer 3b a lowered impurity concentration. This suppresses expansion of the depletion layer to some extent, by which a width necessary for the voltage withstanding structure section can be shortened. Furthermore, since the charges in the parallel p-n layer laid out in the voltage withstanding structure section in the inactive region 240 are in an unbalanced state, it is considered that the breakdown voltage of the section directly below the source electrode 10 is lowered. However, the interlayer insulator film 9b provided directly below the source electrode 10 withstands the voltage equivalent to the lowered portion of the breakdown voltage to cause no lowering in the breakdown voltage in total. In addition, when the structure of the vertical MOSFET chip according to the embodiment 17 is formed by the trench filling method, in the inactive region 240, the trench for forming the second p-semiconductor layer 3b is provided with the width larger than that of the second n-semiconductor layer 3a. Therefore, the aspect ratio of the trench is made lower by an amount corresponding to the increase in the width than in the case in which the widths of the layer 3b and the layer 3a are made equal to each other. This reduces the degree of difficulty of the process, that is, facilitates the manufacture.

The eighteenth embodiment is a vertical MOSFET chip in which, in the vertical MOSFET chip of the seventeenth embodiment, the impurity concentrations in the second p-semiconductor layer 3b and the second n-semiconductor layer 3a in the second parallel p-n layer are made approximately equal to those in the first p-semiconductor layer 2b and the first n-semiconductor layer 2a in the first parallel p-n layer. The plane structure of the parallel p-n layer is the same as that shown in FIG. 21. Moreover, the cross sectional structure taken on the cutting line E-E in FIG. 21 is the same as that shown in FIG. 22. Dimensions, impurity concentrations and the like in all parts are, unless otherwise notified, the same as those in the seventeenth embodiment.

Figure 27:
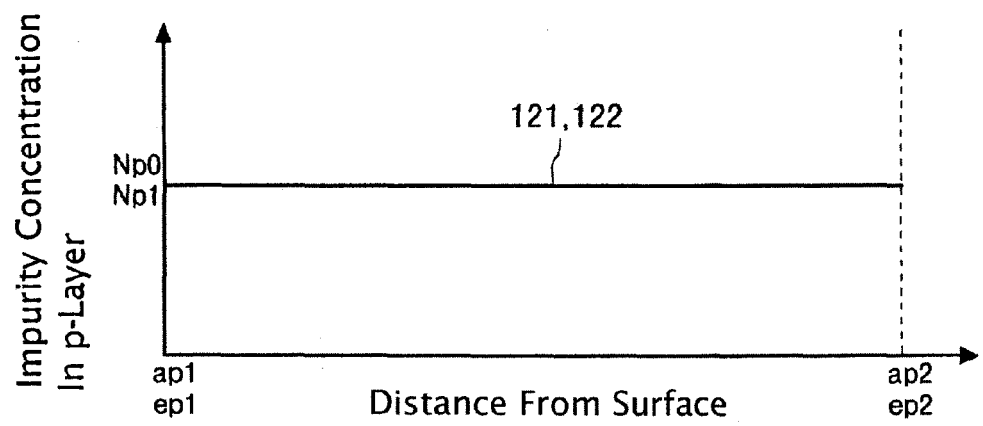
FIG. 27 is a diagram showing impurity concentration distributions in the depth direction in p-semiconductor layers of a semiconductor device according to the embodiment 18.
Figure 28:
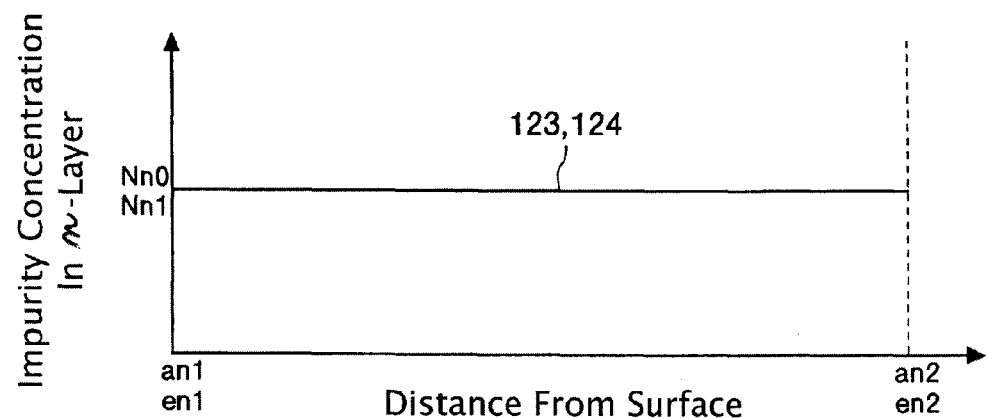
FIG. 28 is a diagram showing impurity concentration distributions in the depth direction in n-semiconductor layers of the semiconductor device according to the embodiment 18.

The distribution in the depth direction of the impurity concentration in the first p-semiconductor layer 2b, denoted by numeral 121, and the distribution in the depth direction of the second p-semiconductor layer 3b, denoted by numeral 122, are as shown in FIG. 27. Moreover, the distribution in the depth direction of the impurity concentrations in the first n-semiconductor layer 2a, denoted by numeral 123, and the distribution in the depth direction of the second n-semiconductor layer 3a, denoted by numeral 124, are as shown in FIG. 28. Furthermore, the value Np0 of the impurity concentration in the first p-semiconductor layer 2b, the value Np1 of the impurity concentration in the second p-semiconductor layer 3b, the value Nn0 of the impurity concentration in the first n-semiconductor layer 2a and the value Nn1 of the impurity concentration in the second n-semiconductor layer 3a are approximately equal to one another, though the conductivity types of the impurities are different from one another. For example, all of the first p-semiconductor layer 2b, the first n-semiconductor layer 2a, the second p-semiconductor layer 3b and the second n-semiconductor layer 3a have an impurity concentration of the order of $4.5 \times 10^{15}$ cm$^{-3}$.

Such impurity concentration distributions, as was explained also in the description of the second embodiment, can be achieved by forming the element surface structures of the MOSFET under a low temperature process. This makes the impurity concentrations in the n-semiconductor layers and the p-semiconductor layers in the parallel p-n layer approximately equal to those of the substrate and the epitaxial layers filling the trenches, respectively, even though the widths of the p-semiconductor layers and the n-semiconductor layers in the parallel p-n layer differ from one another.

Figure 26:
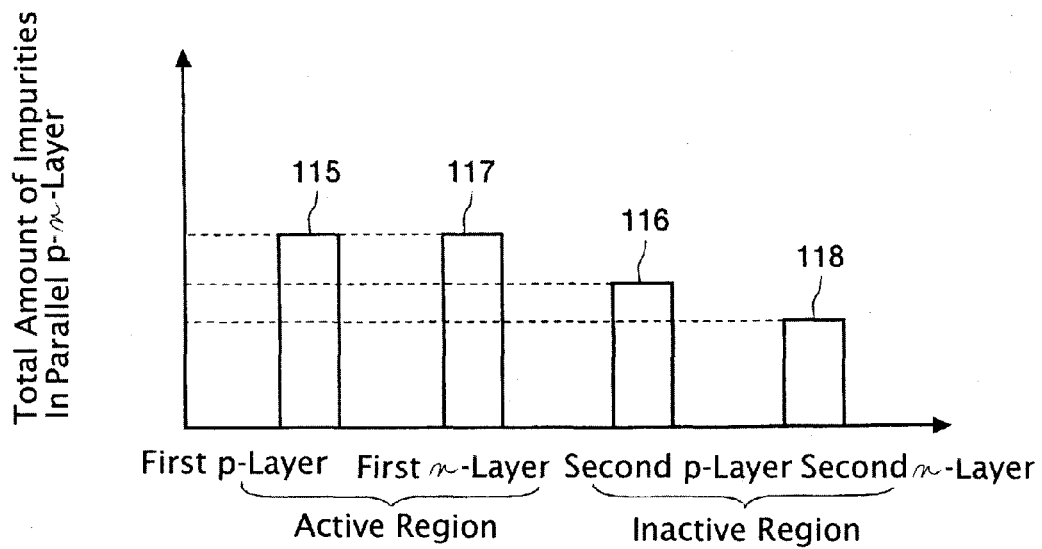
FIG. 26 is a diagram showing relations among total amounts of impurities in the p-semiconductor layers and the n-semiconductor layers in a parallel p-n layer in the semiconductor device according to the embodiment 17.

The relations of being large or small among total amounts of impurities in the first n-semiconductor layer 2a, the first p-semiconductor layer 2b, the second n-semiconductor layer 3a and the second p-semiconductor layer 3b, when illustrated without taking the degree of being large or small into consideration, become as shown in FIG. 26. The width of the first p-semiconductor layer 2b and that of the first n-semiconductor layer 2a are approximately equal to each other. Thus, the total amount of impurities 115 in the first p-semiconductor layer 2b and the total amount of impurities 117 in the first n-semiconductor layer 2a become approximately equal to each other. While, the width of the second p-semiconductor layer 3b is smaller than the width of the first p-semiconductor layer 2b. Thus, the total amount of impurities 116 in the second p-semiconductor layer 3b becomes smaller than the total amount of impurities 115 in the first p-semiconductor layer 2b.

Moreover, the width of the second n-semiconductor layer 3a is smaller than the width of the first n-semiconductor layer 2a. Thus, the total amount of impurities 118 in the second n-semiconductor layer 3a becomes smaller than the total amount of impurities 117 in the first n-semiconductor layer 2a. Furthermore, the width of the second n-semiconductor layer 3a is smaller than the width of the second p-semiconductor layer 3b. Thus, the total amount of impurities 118 in the second n-semiconductor layer 3a becomes smaller than the total amount of impurities 116 in the second p-semiconductor layer 3b. According to the eighteenth embodiment, no interdiffusion of impurities due to heat history occurs to facilitate the control of the impurity concentrations in the parallel p-n layer. This therefore enables almost direct realization of a structure determined by performing numerical calculations such as computer simulations.

Figure 29:
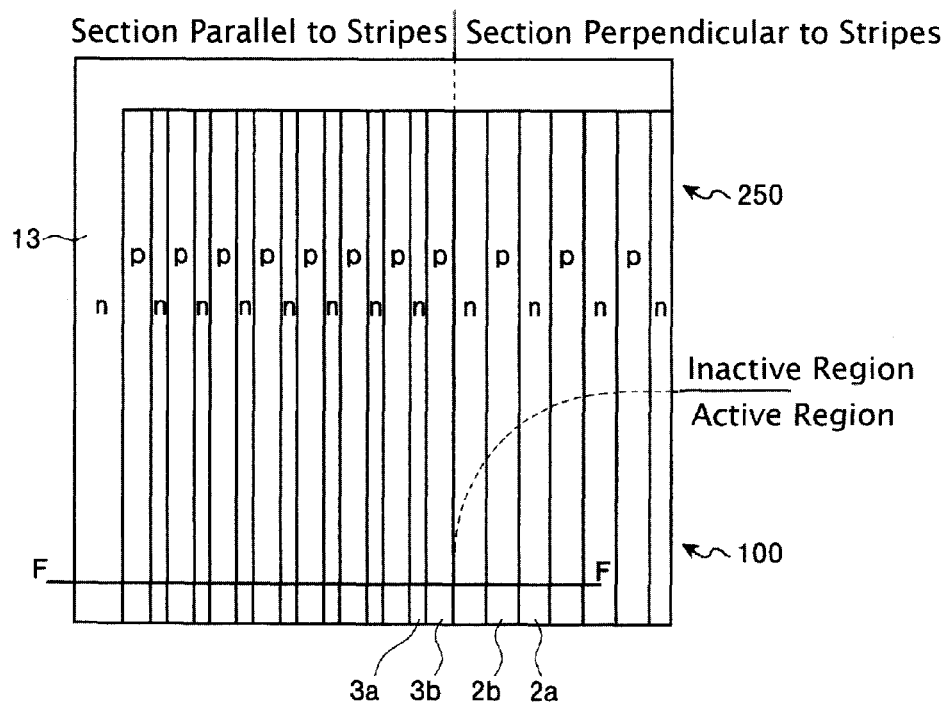
FIG. 29 is a partial plan view showing a principal section of a vertical MOSFET chip as a semiconductor device according to an embodiment 19 of the invention.
Figure 30:
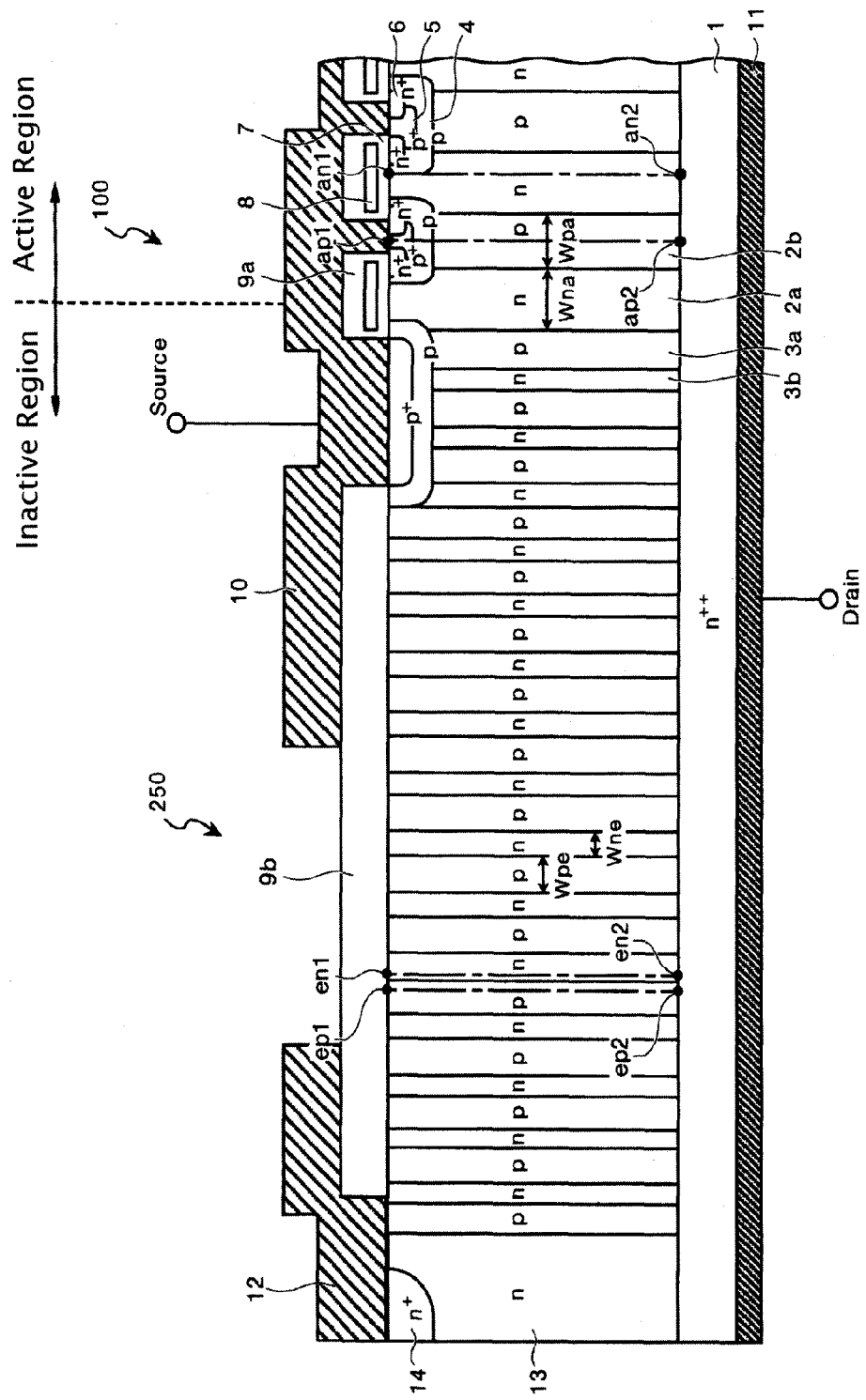
FIG. 30 is a vertical cross sectional view showing a cross sectional structure taken on the cutting line F-F in FIG. 29.

FIG. 29 is a partial plan view showing a principal section of a vertical MOSFET chip according to an embodiment 19 of the invention. In FIG. 29, illustrations of the surface layer of the parallel p-n layer and surface structures of elements formed thereon are omitted. FIG. 30 is a vertical cross sectional view showing a cross sectional structure taken on the cutting line F-F traversing the active region and the inactive region in FIG. 29 in the direction perpendicular to the stripes.

As shown in FIG. 29 and FIG. 30, the nineteenth embodiment is a vertical MOSFET chip in which, in the inactive region 250, the whole parallel p-n layer in the section parallel to the stripes is made up of the second parallel p-n layer with charges being in an unbalanced state. In particular, in a portion of the inactive region 250 in the proximity of the boundary with the active region 100, the second parallel p-n layer is laid out also in a portion where the source electrode 10 is in contact with the semiconductor surface, that is, in a portion without the interlayer insulator film 9b. The arrangements other than the above, dimensions, impurity concentrations and the like in all parts are the same as those in the embodiment 17.

According to the nineteenth embodiment, like in the third embodiment, the breakdown voltage in the depth direction is lowered in the second parallel p-n layer with unbalanced charges. Thus, an avalanche occurs at a portion at which the source electrode 10 is in contact with the semiconductor surface in the inactive region 250. Therefore, compared with the case in which avalanche breakdown occurs below the interlayer insulator film 9b, an avalanche current is efficiently pulled out from the source electrode 10 to cause no concentration of current, which enhances avalanche durability.

The twentieth embodiment is a vertical MOSFET chip in which, in the vertical MOSFET chip of the nineteenth embodiment, the impurity concentrations in the second p-semiconductor layer 3b and the second n-semiconductor layer 3a in the second parallel p-n layer are made approximately equal to those in the first p-semiconductor layer 2b and the first n-semiconductor layer 2a in the first parallel p-n layer. The plane structure of the parallel p-n layer is the same as that shown in FIG. 29. Moreover, the cross sectional structure taken on the cutting line F-F in FIG. 29 is the same as that shown in FIG. 30. Dimensions, impurity concentrations and the like in all parts are, unless otherwise notified, the same as those in the nineteenth embodiment.

The distribution in the depth direction of each of the impurity concentrations in the first p-semiconductor layer 2b and the second p-semiconductor layer 3b is as shown in FIG. 27. Moreover, the distribution in the depth direction of each of the impurity concentrations in the first n-semiconductor layer 2a and the second n-semiconductor layer 3a is as shown in FIG. 28. Furthermore, the value Np0 of the impurity concentration in the first p-semiconductor layer 2b, the value Np1 of the impurity concentration in the second p-semiconductor layer 3b, the value Nn0 of the impurity concentration in the first n-semiconductor layer 2a and the value Nn1 of the impurity concentration in the second n-semiconductor layer 3a are approximately equal to one another, though the conductivity types of the impurities are different from one another, with a value, for example, of the order of $4.5 \times 10^{15}$ cm$^{-3}$.

The relations of being large or small among total amounts of impurities in the first n-semiconductor layer 2a, the first p-semiconductor layer 2b, the second n-semiconductor layer 3a and the second p-semiconductor layer 3b, when illustrated without taking the degree of being large or small into consideration, become as shown in FIG. 26. According to the twentieth embodiment, like in the eighteenth embodiment and the nineteenth embodiment, the impurity concentrations are easily controlled to enhance avalanche durability.

The twenty-first embodiment is a vertical MOSFET chip in which, the impurity concentration in the first p-semiconductor layer 2b in the first parallel p-n layer and the impurity concentration in the second p-semiconductor layer 3b in the second parallel p-n layer are made higher than those in the embodiment 17 to make the charges in the first parallel p-n layer in an unbalanced state also in the active region 100. The plane structure of the parallel p-n layer is the same as that shown in FIG. 21. Moreover, the cross sectional structure taken on the cutting line E-E in FIG. 21 is the same as that shown in FIG. 22. Dimensions, impurity concentrations and the like in all parts are, unless otherwise notified, the same as those in the seventeenth embodiment.

Figure 31:
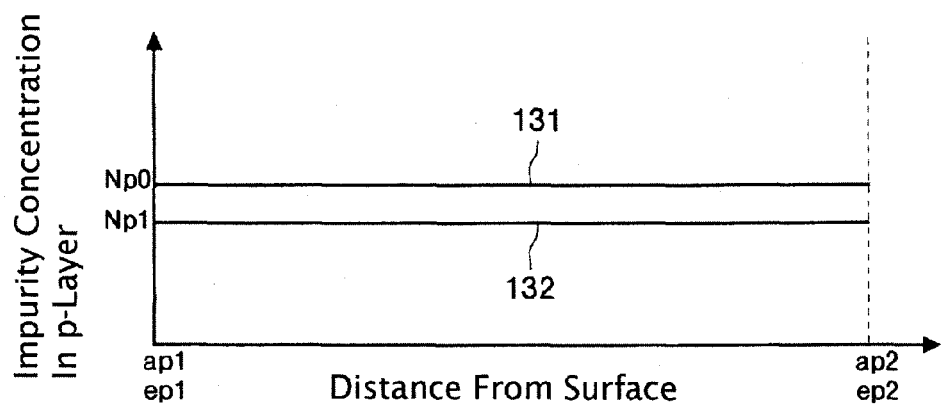
FIG. 31 is a diagram showing impurity concentration distributions in the depth direction in p-semiconductor layers of a semiconductor device according to the embodiment 21.
Figure 32:
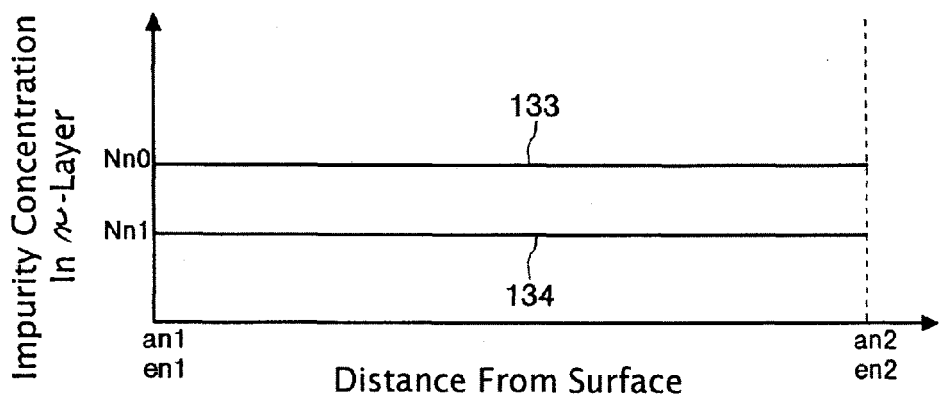
FIG. 32 is a diagram showing impurity concentration distributions in the depth direction in n-semiconductor layers of the semiconductor device according to the embodiment 21.

FIG. 31 is a diagram showing impurity concentration distributions in the depth direction in the p-semiconductor layers of the semiconductor device according to the embodiment 21. As shown in FIG. 31, both of the impurity concentration distribution in the depth direction in the first p-semiconductor layer 2b, denoted by numeral 131, and the impurity concentration distribution in the depth direction in the second p-semiconductor layer 3b, denoted by numeral 132, are uniform. Moreover, the value Np1 of the impurity concentration in the second p-semiconductor layer 3b is lower than the value Np0 of the impurity concentration in the first p-semiconductor layer 2b. Furthermore, FIG. 32 is a diagram showing impurity concentration distributions in the depth direction in the n-semiconductor layers of the semiconductor device according to the embodiment 21. As shown in FIG. 32, the impurity concentration distribution in the depth direction in the first n-semiconductor layer 2a, denoted by numeral 133, and the impurity concentration distribution in the depth direction in the second n-semiconductor layer 3a, denoted by numeral 134, are uniform.

In addition, the value Nn1 of the impurity concentration in the second n-semiconductor layer 3a is lower than the value Nn0 of the impurity concentration in the first n-semiconductor layer 2a. Furthermore, the value Np0 of the impurity concentration in the first p-semiconductor layer 2b and the value Np1 of the impurity concentration in the second p-semiconductor layer 3b are higher than the value Nn0 of the impurity concentration in the first n-semiconductor layer 2a and the impurity concentration Nn1 in the second n-semiconductor layer 3a, respectively, though the conductivity types of the impurities are different from one another.

For example, the impurity concentrations in the first p-semiconductor layer 2b is on the order of $4.7 \times 10^{15}$ cm$^{-3}$, and the impurity concentration in the first n-semiconductor layer 2a is on the order of $4.5 \times 10^{15}$ cm$^{-3}$. The impurity concentration in the second p-semiconductor layer 3b is on the order of $3.7 \times 10^{15}$ cm$^{-3}$, and the impurity concentration in the second n-semiconductor layer 3a is on the order of $2.0 \times 10^{15}$ cm$^{-3}$.

Figure 33:
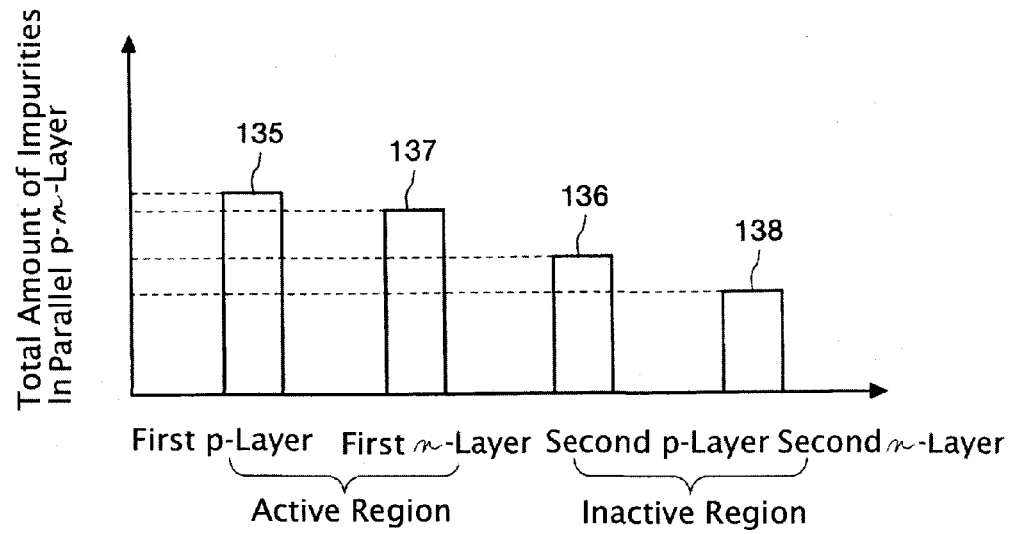
FIG. 33 is a diagram showing relations among total amounts of impurities in the p-semiconductor layers and the n-semiconductor layers in a parallel p-n layer in the semiconductor device according to the embodiment 21.

The relations of being large or small among total amounts of impurities in the first n-semiconductor layer 2a, the first p-semiconductor layer 2b, the second n-semiconductor layer 3a and the second p-semiconductor layer 3b, when illustrated without taking the degree of being large or small into consideration, become as shown in FIG. 33. However, FIG. 33 only illustrates relations of large or small among total amounts of impurities in the semiconductor layers. Thus, the figure does not illustrate so far as how large or how small the total amounts of impurities are among them.

In the first p-semiconductor layer 2b and the first n-semiconductor layer 2a, their widths are approximately equal to each other, while the impurity concentrations in them differ from each other. Thus, the total amount of impurities in the first p-semiconductor layer 2b, denoted by numeral 135, becomes larger than the total amount of impurities in the first n-semiconductor layer 2a, denoted by numeral 137. Moreover, the width of the second p-semiconductor layer 3b is smaller than that of the first p-semiconductor layer 2b, and the impurity concentration in the second p-semiconductor layer 3b is lower than that in the first p-semiconductor layer 2b. Thus, the total amount of impurities in the second p-semiconductor layer 3b, denoted by numeral 136, becomes smaller than the total amount of impurities 135 in the first p-semiconductor layer 2b.

Furthermore, the width of the second n-semiconductor layer 3a is smaller than that of the first n-semiconductor layer 2a, and the impurity concentration in the second n-semiconductor layer 3a is lower than that in the first n-semiconductor layer 2a. Thus, the total amount of impurities in the second n-semiconductor layer 3a, denoted by numeral 138, becomes smaller than the total amount of impurities 137 in the first n-semiconductor layer 2a. In addition, the width of the second n-semiconductor layer 3a is smaller than that of the second p-semiconductor layer 3b, and the impurity concentration in the second n-semiconductor layer 3a is lower than that in the second p-semiconductor layer 3b. Thus, the total amount of impurities 138 in the second n-semiconductor layer 3a becomes smaller than the total amount of impurities 136 in the second p-semiconductor layer 3b.

According to the twenty-first embodiment, in the inactive region 240, the impurity concentration in the second p-semiconductor layer 3b is higher than that in the seventeenth embodiment and the total amount of impurities in the second p-semiconductor layer 3b is larger than that in the seventeenth embodiment. Thus, a depletion layer is made to expand in the inactive region 240 more easily than in the seventeenth embodiment. This increases a breakdown voltage in the inactive region 240 to become close to the breakdown voltage in the active region 100. Thus, avalanche breakdown becomes liable to occur in the active region 100. Therefore, concentration of an avalanche current becomes hard to occur to enhance avalanche durability. Moreover, the impurity concentration made higher in the first p-semiconductor layer 2b in the active region 100 suppresses negative resistance component even though a hole current is accumulated when an avalanche current is generated. This further enhances avalanche durability.

The twenty-second embodiment is a vertical MOSFET chip in which, in the vertical MOSFET chip of the embodiment 21, the impurity concentrations in the second p-semiconductor layer 3b and the second n-semiconductor layer 3a in the second parallel p-n layer are made approximately equal to those in the first p-semiconductor layer 2b and the first n-semiconductor layer 2a in the first parallel p-n layer, respectively. The plane structure of the parallel p-n layer is the same as that shown in FIG. 21. Moreover, the cross sectional structure taken on the cutting line E-E in FIG. 21 is the same as that shown in FIG. 22. Dimensions, impurity concentrations and the like in all parts are, unless otherwise notified, the same as those in the twenty-first embodiment.

Figure 34:
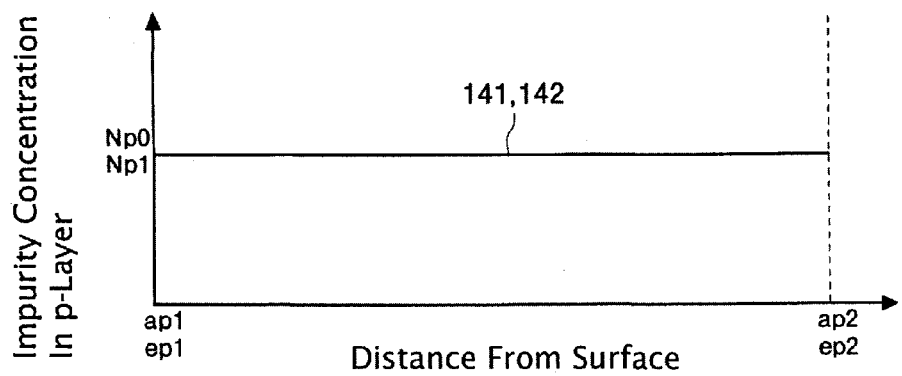
FIG. 34 is a diagram showing impurity concentration distributions in the depth direction in p-semiconductor layers of a semiconductor device according to the embodiment 22.
Figure 35:
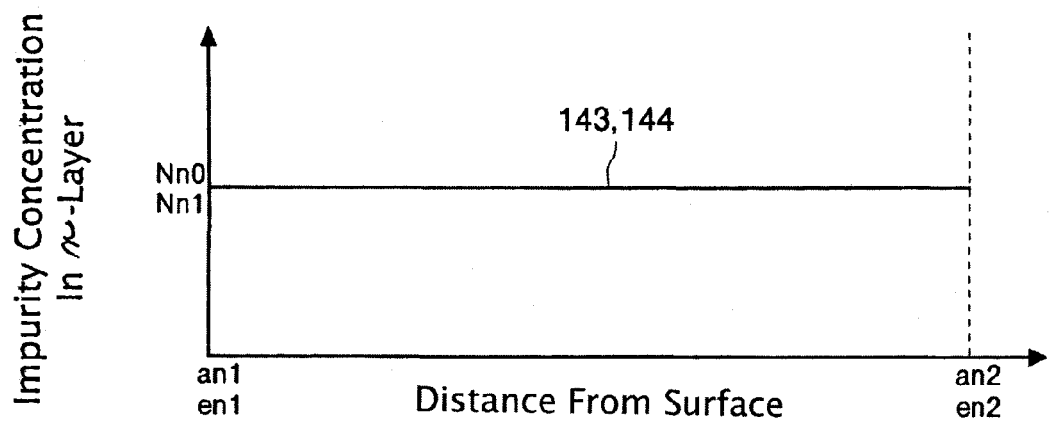
FIG. 35 is a diagram showing impurity concentration distributions in the depth direction in n-semiconductor layers of the semiconductor device according to the embodiment 22.

The distribution in the depth direction of the impurity concentration in the first p-semiconductor layer 2b, denoted by numeral 141, and the distribution in the depth direction of the impurity concentration in the second p-semiconductor layer 3b, denoted by numeral 142, are as shown in FIG. 34. Moreover, the distribution in the depth direction of the impurity concentrations in the first n-semiconductor layer 2a, denoted by numeral 143, and the distribution in the depth direction of the impurity concentrations in the second n-semiconductor layer 3a, denoted by numeral 144, are as shown in FIG. 35. In addition, the value Np0 of the impurity concentration in the first p-semiconductor layer 2b and the value Np1 of the impurity concentration in the second p-semiconductor layer 3b are higher than the value Nn0 of the impurity concentration in the first n-semiconductor layer 2a and the value Nn1 of the impurity concentration in the second n-semiconductor layer 3a, though the conductivity types of the impurities are different from one another.

For example, both of the first p-semiconductor layer 2b and the second p-semiconductor layer 3b have an impurity concentration of the order of $4.7 \times 10^{15}$ cm$^{-3}$. Both of the first n-semiconductor layer 2a and the second n-semiconductor layer 3a have an impurity concentration of the order of $4.5 \times 10^{15}$ cm$^{-3}$. Such impurity concentration distributions, as was explained also in the description of the embodiment 2, can be achieved by forming the element surface structures of the MOSFET under a low temperature process.

The relations of being large or small among total amounts of impurities in the first n-semiconductor layer 2a, the first p-semiconductor layer 2b, the second n-semiconductor layer 3a and the second p-semiconductor layer 3b, when illustrated without taking the degree of being large or small into consideration, become as shown in FIG. 33. According to the twenty-second embodiment, the same advantage as that of the twenty-first embodiment can be obtained. Moreover, like in the eighteenth embodiment, no interdiffusion of impurities due to heat history occurs to facilitate the control of the impurity concentrations in the parallel p-n layer.

The twenty-third embodiment is a vertical MOSFET chip in which, in the vertical MOSFET chip of the embodiment 21, the whole parallel p-n layer in the section parallel to the stripes in the inactive region 250 is made up of the second parallel p-n layer with charges being in an unbalanced state. The plane structure of the parallel p-n layer is the same as that shown in FIG. 29. Moreover, the cross sectional structure taken on the cutting line F-F in FIG. 29 is the same as that shown in FIG. 30. Dimensions, impurity concentrations and the like in all parts are, unless otherwise notified, the same as those in the embodiment 21. According to the twenty-third embodiment, the same advantage as that of the twenty-first embodiment can be obtained. Furthermore, the same advantage as that of the nineteenth embodiment can be obtained.

The twenty-forth embodiment is a vertical MOSFET chip in which, in the vertical MOSFET chip of the embodiment 22, the whole parallel p-n layer in the section parallel to the stripes in the inactive region 250 is made up of the second parallel p-n layer with charges being in an unbalanced state. The plane structure of the parallel p-n layer is the same as that shown in FIG. 29. Moreover, the cross sectional structure taken on the cutting line F-F in FIG. 29 is the same as that shown in FIG. 30. Dimensions, impurity concentrations and the like in all parts are, unless otherwise notified, the same as those in the twenty-second embodiment. According to the twenty-fourth embodiment, the same advantage as that of the twenty-second embodiment can be obtained. Furthermore, the same advantage as that of the twentieth embodiment can be obtained.

Figure 36:
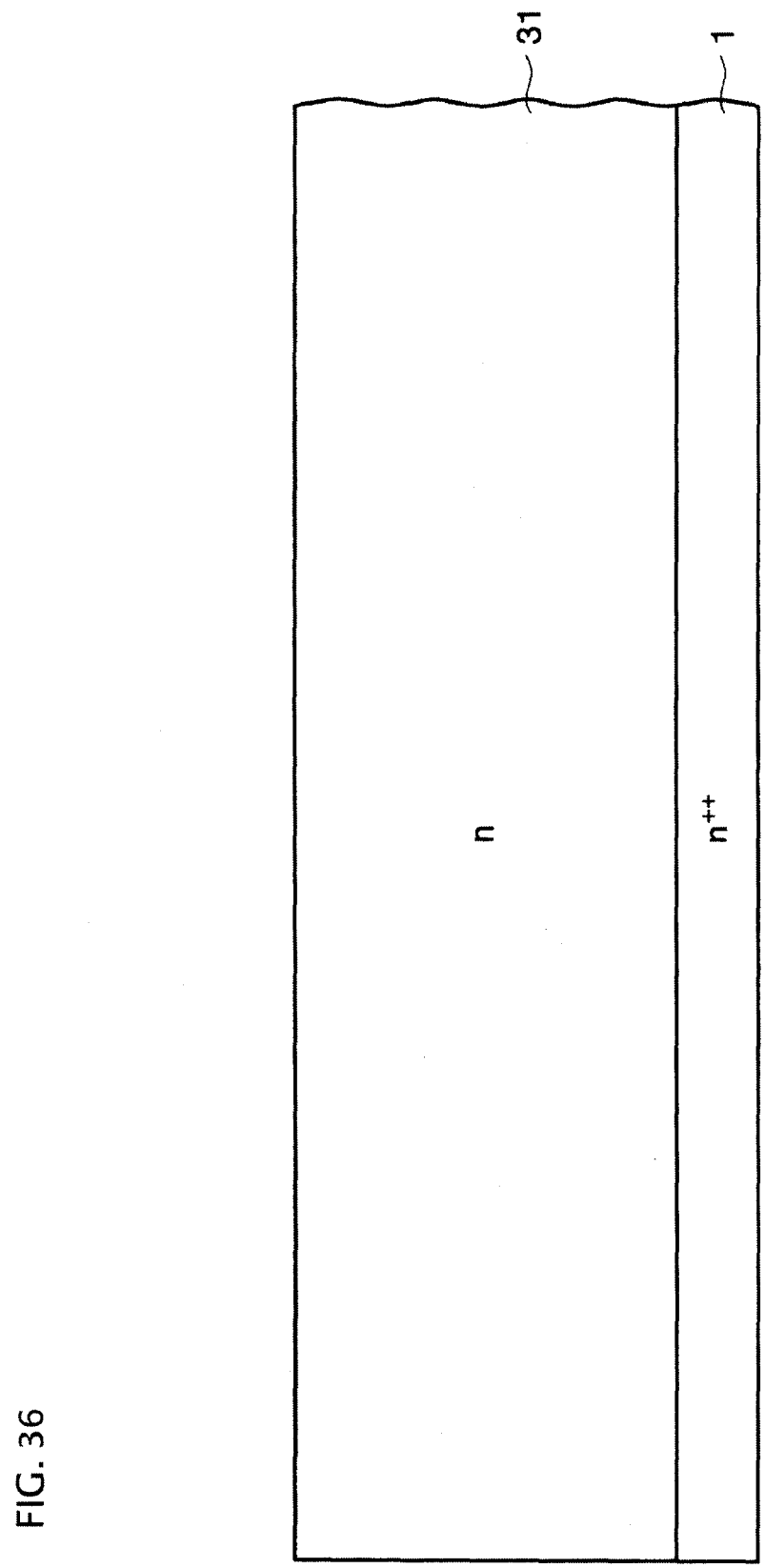
FIG. 36 is a vertical cross sectional view showing a structure of a semiconductor device in the course of being manufactured by a method according to an embodiment 25 of the invention with an n-epitaxial layer being formed on a n-semiconductor substrate.

The twenty-fifth embodiment is a method of manufacturing a semiconductor device which can be applied when manufacturing the semiconductor device according to the above-explained first, third, fifth or seventh embodiments. FIGS. 36 to 41 are cross sectional views showing respective structures of the semiconductor device in the main steps in its manufacturing process. First, an n-type low resistance semiconductor substrate is prepared which becomes an n$^{++}$-drain layer 1. At this time, the direction of crystal plane of the semiconductor substrate is taken as the (100)-plane or equivalent to this. Moreover, the impurity concentration of the semiconductor substrate is taken as on the order of $2.0 \times 10^{18}$ cm$^{-3}$. On the prepared semiconductor substrate, an n-epitaxial layer 31 is formed with a thickness of about 50 μm. The impurity concentration of the n-epitaxial layer 31 is taken as on the order of $6.0 \times 10^{15}$ cm$^{-3}$. A state up to this is shown in FIG. 36.

Next to this, an oxide film (or an insulator film such as a nitride film) 32, becoming a hard mask for trench etching, is formed with a thickness of 1.6 μm or more, for example, 2.4 μm. The thickness of the oxide film 32 is appropriately selected on the basis of the selectivity for the oxide film and silicon in trench etching so that the oxide film is left even though trenches with desired depth are formed. For example, when trenches each with a depth of about 50 μm are formed, an oxide film with a thickness of the order of 2.4 μm is left with a sufficient thickness even after the trench etching.

Then, patterning of the oxide film 32 is carried out by lithography to form hard masks. For the region in which the first parallel p-n layer is laid out, each opening width in the oxide film 32 is taken as, for example, 5 μm and each width of the oxide film 32 between the openings is taken as 5 μm, for example. In other words, the hard masks each having the width of 5 μm are spaced 5 μm apart, for example. The region in which the first parallel p-n layer is laid out includes, in the embodiment 1 and the embodiment 5, the regions to become the active region 100, a part of the section parallel to the stripes in the inactive region 200 and the section perpendicular to the stripes in the inactive region 200. Moreover, in the embodiment 3 and the embodiment 7, the region includes the regions to become the active region 100 and the section perpendicular to the stripes in the inactive region 210.

Meanwhile, for the region in which the second parallel p-n layer is laid out, each opening width in the oxide film 32 is enlarged. Along with this, each width of the oxide film 32 between the openings is reduced. Specifically, for example, with each opening width in the oxide film 32 taken as 6 μm and each width of the oxide film 32 between the openings taken as 4 μm, hard masks each having the width of 4 μm are spaced 6 μm apart. The region in which the second parallel p-n layer is laid out is, in the embodiment 1 and the embodiment 5, the region to become a part of the section parallel to the stripes in the inactive region 200. Moreover, in the embodiment 3 and the embodiment 7, the region includes the whole region to become the section parallel to the stripes in the inactive region 210.

Figure 37:
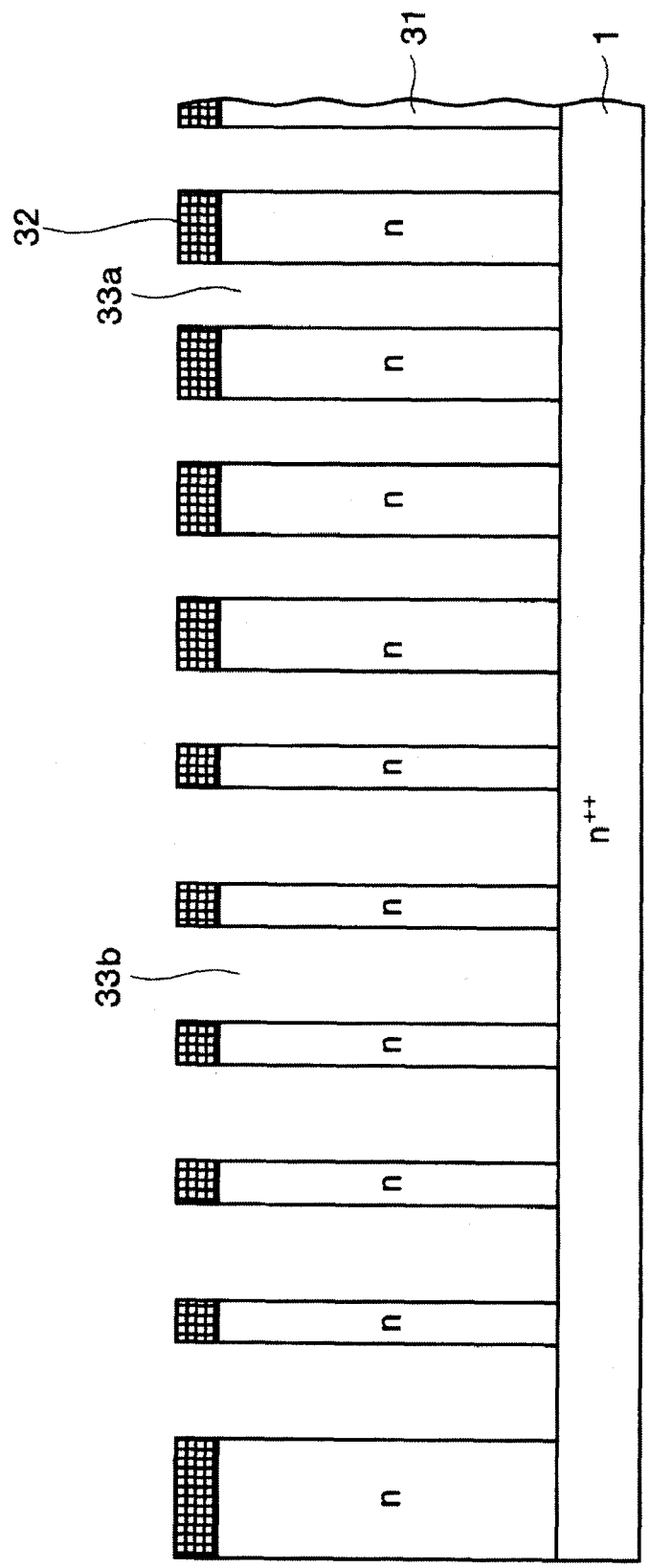
FIG. 37 is a vertical cross sectional view showing the structure of the semiconductor device in the course of being manufactured by the method according to the embodiment 25 with trenches being formed in the n-epitaxial layer.

Following this, trench etching is carried out to form in the epitaxial layer 31 trenches having a depth of about 50 μm, trenches 33a having an opening width of 5 μm and trenches 33b having an opening width of 6 μm, for example. At this time, the trenches 33a and 33b are formed so that the direction of crystal plane of the side face of each of the formed trenches becomes the (010)-plane or a plane equivalent to this. About the hard masks for the trenches, they are also patterned so that the trenches 33a and 33b are formed with the trench side faces each having such direction of crystal plane. The state up to this is shown in FIG. 37.

Then, the trenches 33a and 33b, each with the side face having such direction of crystal plane, are filled with boron-doped p-epitaxial layers 34a and 34b, respectively. The impurity concentration in each of the p-epitaxial layers 34a and 34b is, in the first embodiment and the third embodiment, on the order of $6.0 \times 10^{15}$ cm$^{-3}$, for example, and in the fifth embodiment and the seventh embodiment, on the order of $6.3 \times 10^{15}$ cm$^{-3}$, for example. The p-epitaxial layers 34a and 34b are made grown until they become to have a thickness equal to or more than one-half the opening width of the trench 33b having the larger width. For example, the time for carrying out the epitaxial growth is taken as the time required for the p-epitaxial layers 34a and 34b grown to a thickness of 4 μm.

Figure 38:
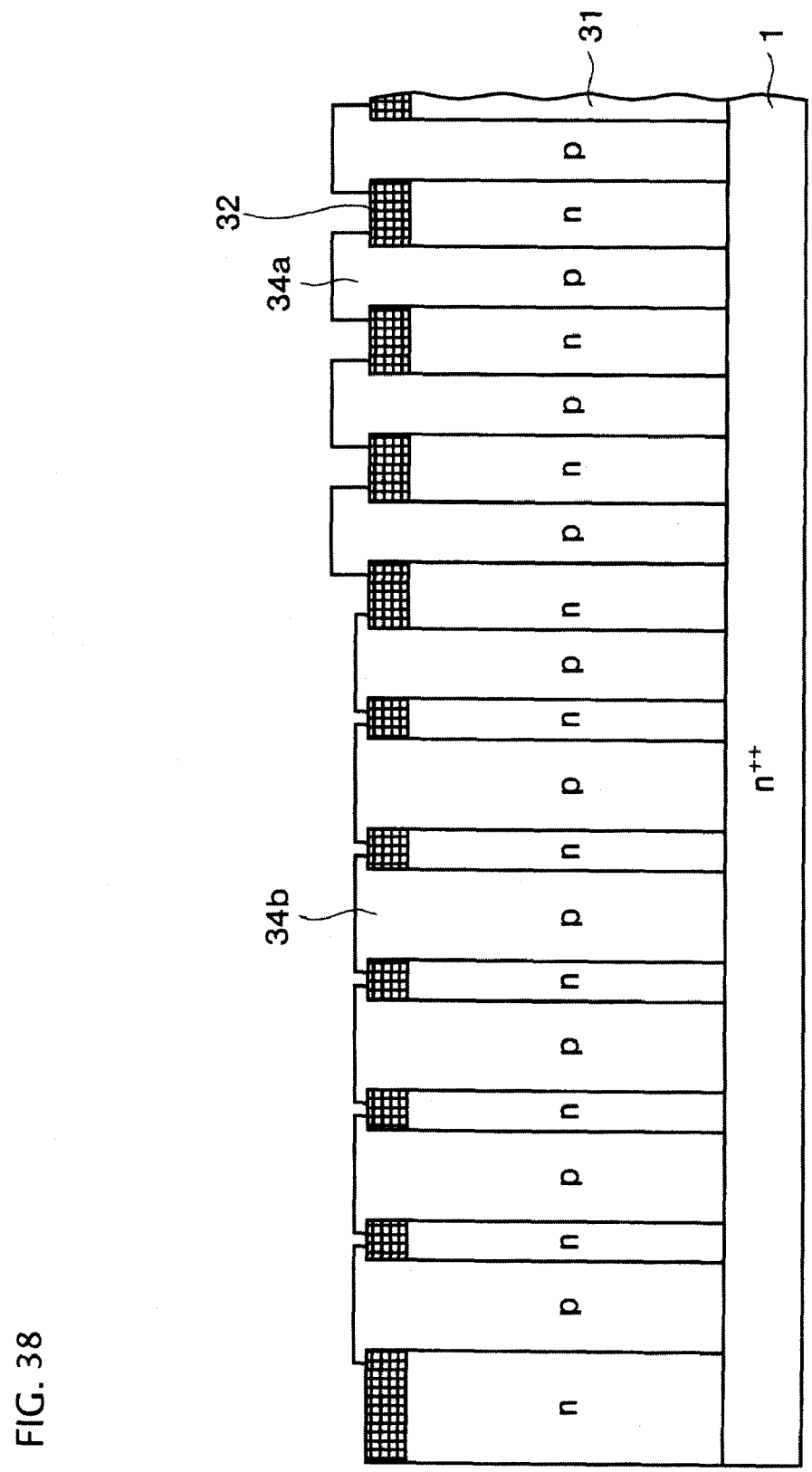
FIG. 38 is a vertical cross sectional view showing the structure of the semiconductor device in the course of being manufactured by the method according to the embodiment 25 with the trenches being filled with p-epitaxial layers.

This enables the p-epitaxial layers 34b not only to fill the trenches 33b, each having the larger opening width, with no void being presented but also to be made grown to a level above the level of the surfaces of the oxide films 32 after the trenches 33b are formed. This is similar to the trenches 33a each having the smaller opening width. In the trenches 33a, the p-epitaxial layers 34a are made grown with no void being presented to fill the trenches 33a and to be further made grown to a level above the level of the surfaces of the oxide films 32 after the trenches 33a are formed. The p-epitaxial layers 34a, filling the trenches 33a each having the smaller opening width, are grown higher than the p-epitaxial layers 34b filling the trenches 33b each having the larger opening width. In this way, there are variations in the thicknesses of the p-epitaxial layers 34a and 34b grown above the surfaces of the oxide films 32. The variations, however, are removed in the step of polishing such as CMP (Chemical Mechanical Polishing) carried out later. The state up to this is shown in FIG. 38.

Figure 39:
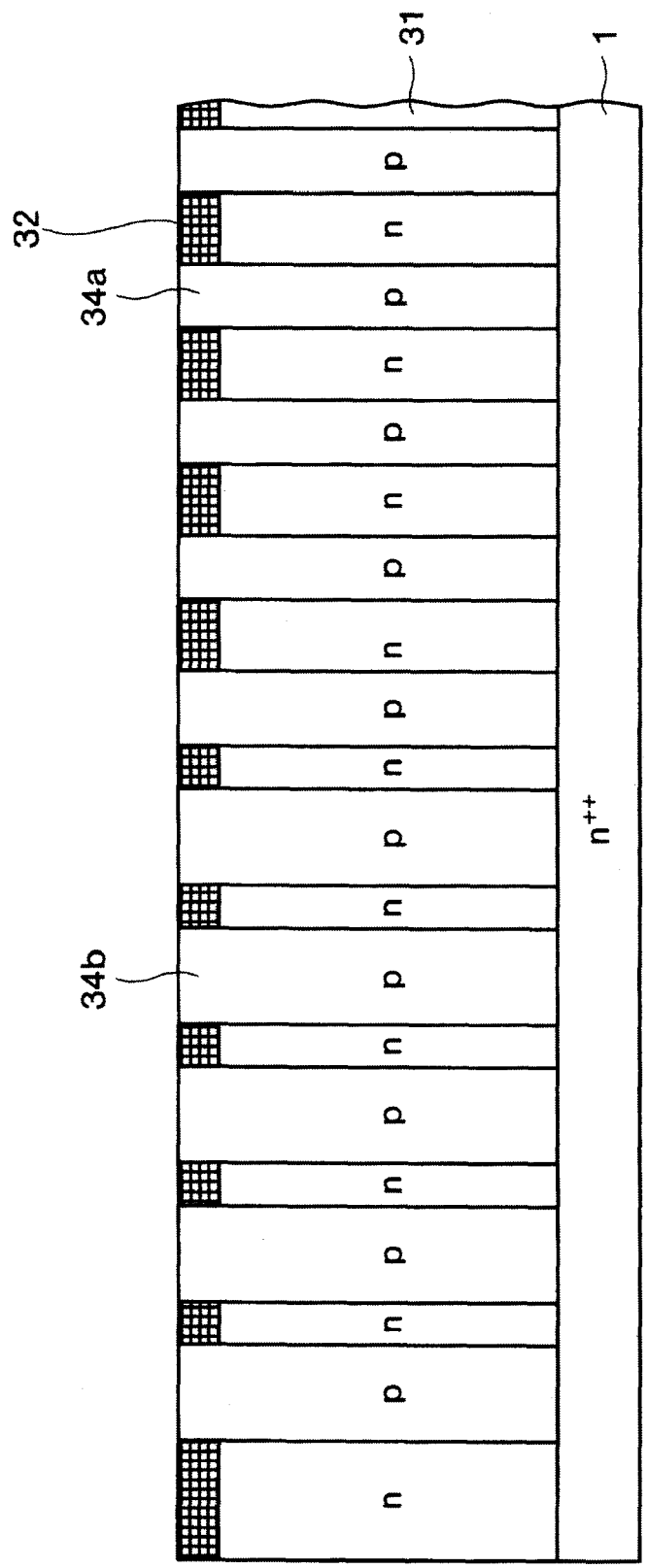
FIG. 39 is a vertical cross sectional view showing the structure of the semiconductor device in the course of being manufactured by the method according to the embodiment 25 with portions of the p-epitaxial layers grown above the surfaces of oxide films being removed by polishing.

The polishing step is first carried out with the oxide films 32, used as the hard masks for the trench etching, also used as polishing stoppers. Thus, portions of the epitaxial layers 34a and 34b grown to the level above the level of the surfaces of the oxide films 32 are removed. The polishing step thus carried out can therefore eliminate variations in the thicknesses of the p-epitaxial layers 34a and 34b caused by difference in the opening width between the trench 33a and the trench 33b. Hence, the variations occurred in the epitaxial process can be minimized. Therefore, even though the opening widths of the trench 33a and the trench 33b differ from each other, the parallel p-n layer can be formed with a uniform depth. The state up to this is shown in FIG. 39.

Figure 40:
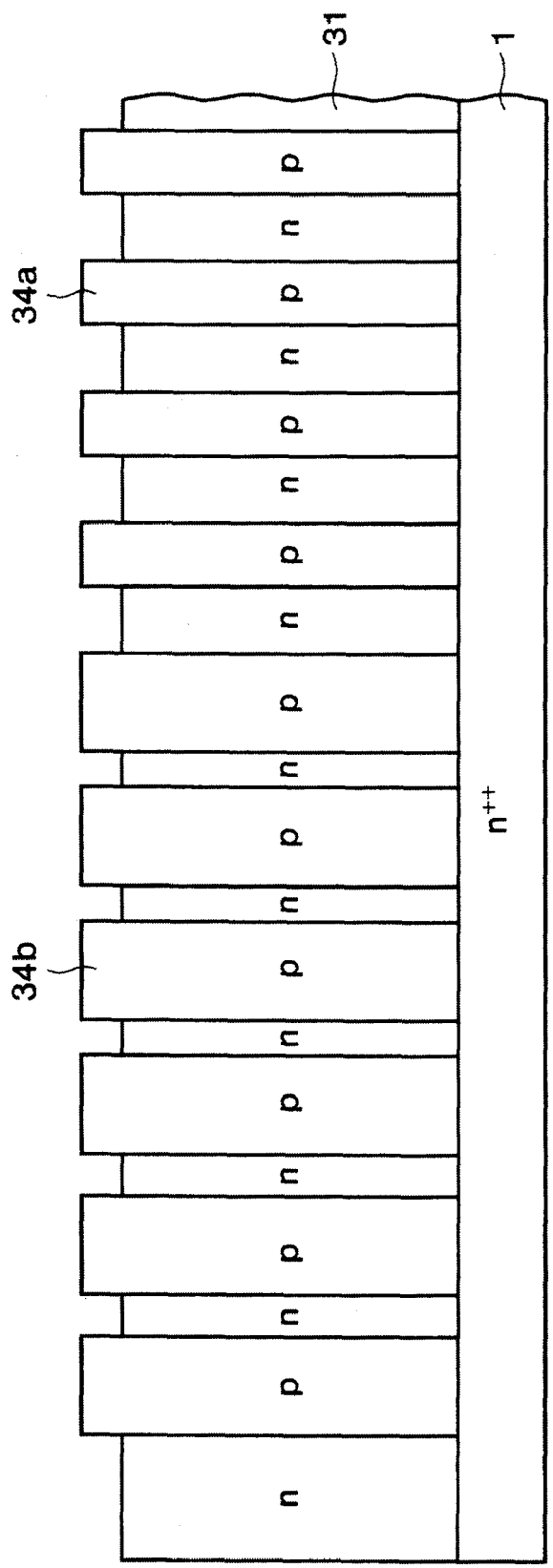
FIG. 40 is a vertical cross sectional view showing the structure of the semiconductor device in the course of being manufactured by the method according to the embodiment 25 with the oxide films being removed.

In the next, as shown in FIG. 40, the oxide films 32 are removed. Thereafter, mirror polishing of the surface is carried out to eliminate unevenness on the surface caused by the removal of the oxide films 32. The amount of polishing is, for example, on the order of 1.0 μm, though the invention is not particularly limited to this. This is because the thickness of the oxide film 32 of the order of 0.5 μm is left after the polishing is carried out with the oxide film 32 used as the polishing stopper. Therefore, the final length in the depth direction of the parallel p-n layer becomes on the order of 49 μm.

Figure 41:
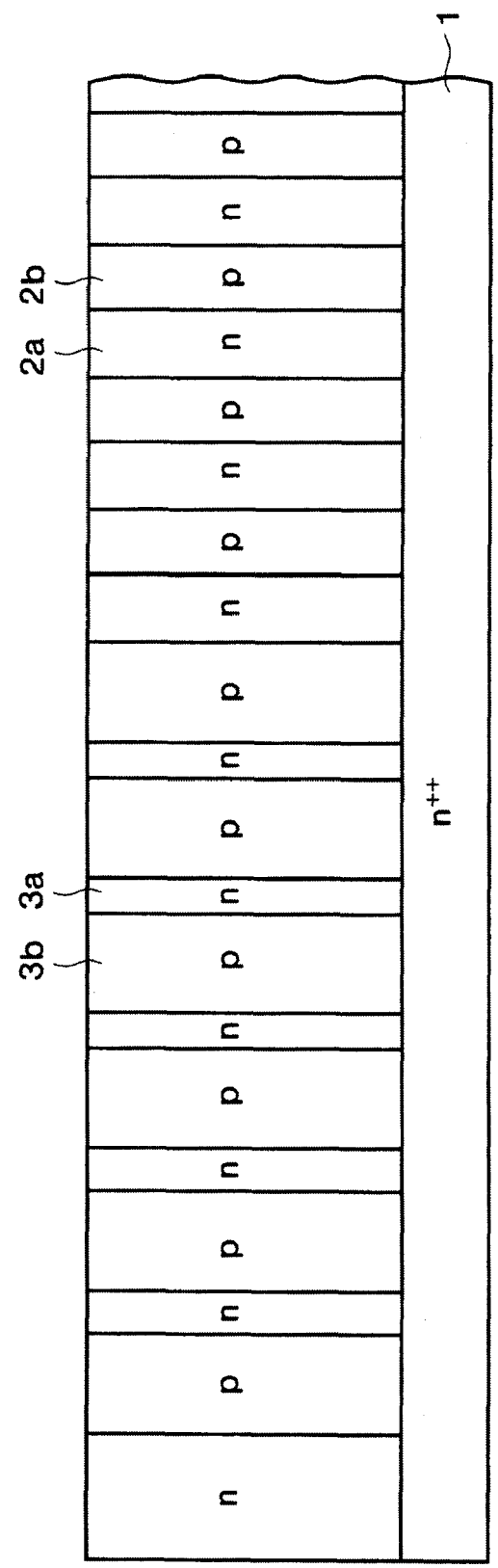
FIG. 41 is a vertical cross sectional view showing the structure of the semiconductor device in the course of being manufactured by the method according to the embodiment 25 with both of the surfaces of the n- and p-epitaxial layers being polished to be provided as a super-junction semiconductor substrate.

In this way, as shown in FIG. 41, a super-junction semiconductor substrate is completed which has the first parallel p-n layer and the second parallel p-n layer. The first parallel p-n layer includes the first n-semiconductor layers 2a of the n-epitaxial layer 31 and the first p-semiconductor layers 2b of the p-epitaxial layer 34a being alternately arranged. The second parallel p-n layer includes the second n-semiconductor layers 3a of the n-epitaxial layer 31 and the second p-semiconductor layers 3b of the p-epitaxial layer 34a being alternately arranged.

With the use of the super-junction semiconductor substrate, the element surface structure, the peripheral voltage withstanding structure, the drain electrode and the like of the MOSFET are formed. At this time, the surface structure is formed at relatively high temperatures, for example, of the order of 1000 to 1100° C. This causes interdiffusion of impurities to complete the semiconductor device according to the first, third, fifth and seventh embodiments in which the second parallel p-n layer and the first parallel layer differ from each other in impurity concentrations. The second parallel p-n layer has the second p-semiconductor layer 3b with the larger width, and the first parallel p-n layer has the first p-semiconductor layer 2b with the width equal to that of the first n-semiconductor layer 2a. Since the processes of manufacturing the element surface structure, the peripheral voltage withstanding structure and the like of the MOSFET are well-known, the explanation about them will be omitted.

By applying the above-explained manufacturing method, it becomes only necessary to change the opening widths of a part of the trenches when forming the trenches and to determine the thickness of the epitaxial layer filling each of the trenches to the trench with the largest opening width. Therefore, compared with the case of forming the trenches with the same width and the same spacing in all of the regions to become the active region and the inactive region, the semiconductor device can be manufactured with little increase in cost. The oxide films 32 and the epitaxial layers 34a and 34b can be polished together to finish the surface into the mirror surface without dividing the polishing step into the polishing step of using the oxide films 32 as the polishing stoppers and the polishing step of carrying out mirror polishing of the surface.

The manufacturing method according to the twenty-fifth embodiment can also be applied to the case of manufacturing the semiconductor device according to the above-explained seventeenth, nineteenth, twenty-first and twenty-third embodiments. In the case, however, the width of the trench 33b, formed in the region where the second parallel p-n layer is laid out, is made smaller than that of the trench 33a, formed in the region where the first parallel p-n layer is laid out.

The twenty-sixth embodiment is a method of manufacturing a semiconductor device that can be applied when manufacturing the semiconductor device according to the above-explained ninth, eleventh, thirteenth and fifteenth embodiments. FIGS. 42 to 46 are cross sectional views showing respective structures of the semiconductor device in the main steps in its manufacturing process. First, like in the twenty-fifth embodiment, an n-type low resistance semiconductor substrate is prepared which becomes an n++-drain layer 1. In the n-type low resistance semiconductor substrate, the direction of crystal plane is taken as the (100)-plane or equivalent to this and the impurity concentration of the semiconductor substrate is taken as on the order of $2.0 \times 10^{18}$ cm$^{-3}$. Moreover, as shown in FIG. 36, on the semiconductor substrate, an n-epitaxial layer 31 is formed with a thickness of about 50 μm. The impurity concentration of the n-epitaxial layer 31 is taken as on the order of $6.0 \times 10^{15}$ cm$^{-3}$.

Next to this, an oxide film (or an insulator film such as a nitride film) 32, becoming a hard mask for trench etching, is formed. The thickness of the oxide film 32 is similar to that in the embodiment 25. Then, hard masks are formed by carrying out patterning of the oxide film 32. For the region in which the first parallel p-n layer is laid out, the hard masks each having a width of 5 μm are spaced 5 μm apart, for example. The region in which the first parallel p-n layer is laid out includes, in the ninth embodiment and the thirteenth embodiment, the regions to become the active region 100, a part of the section parallel to the stripes in the inactive region 220 and the section perpendicular to the stripes in the inactive region 220. Moreover, in the eleventh embodiment and the fifteenth embodiment, the region includes the regions to become the active region 100 and the section perpendicular to the stripes in the inactive region 230.

Figure 42:
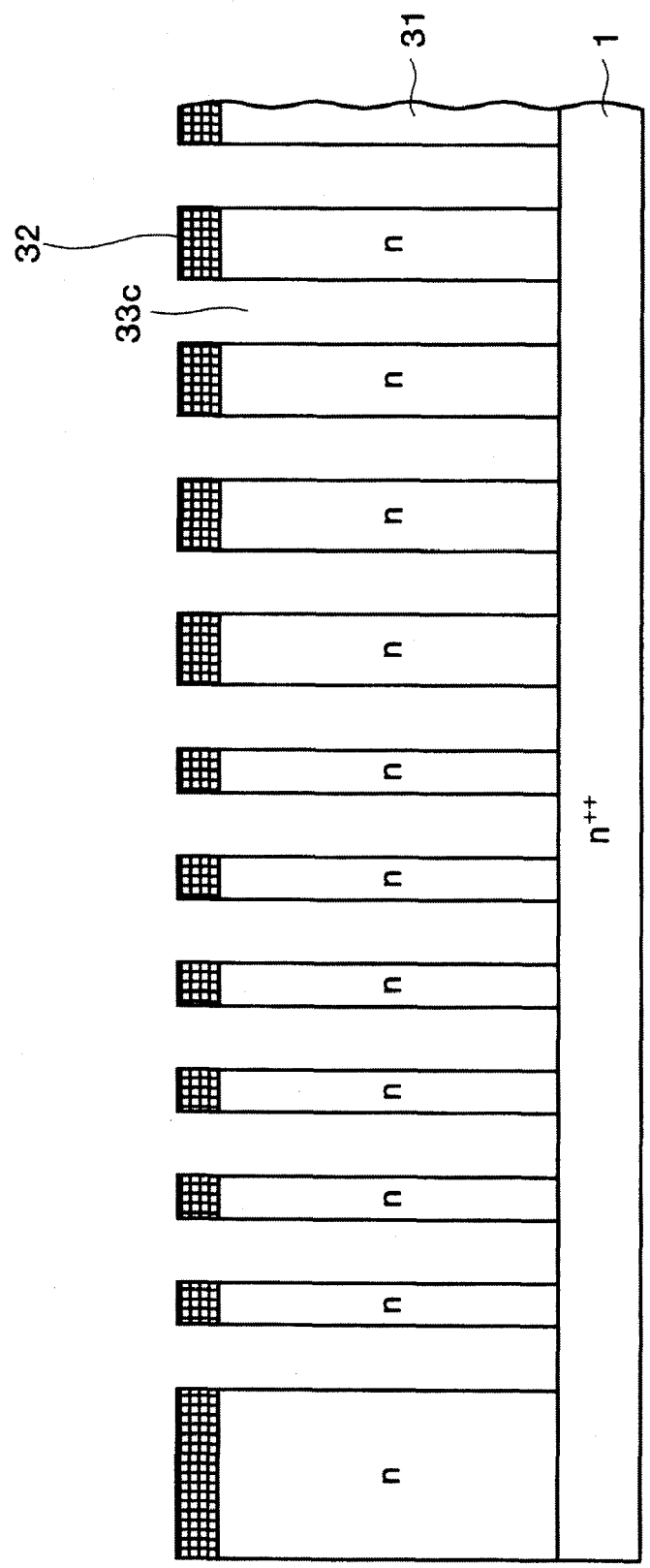
FIG. 42 is a vertical cross sectional view showing a structure of a semiconductor device in the course of being manufactured by a method according to an embodiment 26 of the invention with trenches being formed in the n-epitaxial layer.

Meanwhile, for the region in which the second parallel p-n layer is laid out, hard masks each having the width of 3.5 μm are spaced 5 μm apart, for example. Thus, the spacing (pitch) between the arranged hard masks is different from that in the first parallel p-n layer. The region in which the second parallel p-n layer is laid out is, in the ninth embodiment and the thirteenth embodiment, the region to become a part of the section parallel to the stripes in the inactive region 220. Moreover, in the embodiment 11 and the embodiment 15, the region is the whole region to become the section parallel to the stripes in the inactive region 230. Following this, trench etching is carried out to form in the epitaxial layer 31 trenches 33c having a depth of about 50 μm and an opening width of 5 μm, for example. Since all of the trenches 33c have the same opening widths, the depths of the trenches can be easily controlled. The direction of crystal plane of the side face of each of the trenches is the same as that in the twenty-fifth embodiment. The state up to this is shown in FIG. 42.

Figure 43:
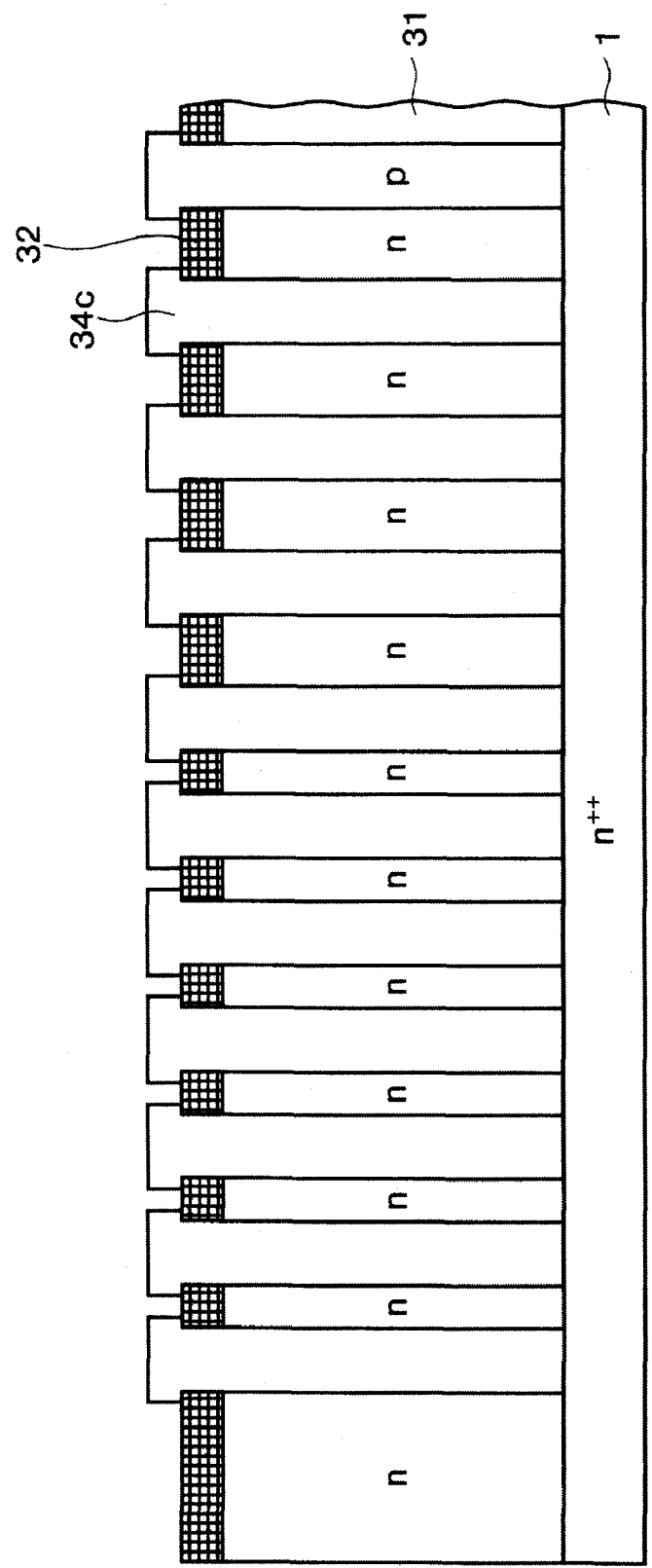
FIG. 43 is a vertical cross sectional view showing the structure of the semiconductor device in the course of being manufactured by the method according to the embodiment 26 with the trenches being filled with p-epitaxial layers.

Then, the trenches 33c are filled with boron-doped p-epitaxial layers 34c with the p-epitaxial layers 34c made grown to a thickness of one half or more the opening width of the trench 33c. In this case, the p-epitaxial layer 34c filling each of the trenches 33c is grown to a height approximately equal to the others which height is above the surfaces of the oxide films 32 after the trenches were formed. The impurity concentration in each of the p-epitaxial layers 34c is, in the ninth embodiment and the eleventh embodiment, on the order of $6.0 \times 10^{15}$ cm$^{-3}$, for example, and in the embodiment 13 and the embodiment 15, on the order of $6.3 \times 10^{15}$ cm$^{-3}$, for example. The state up to this is shown in FIG. 43.

Figure 44:
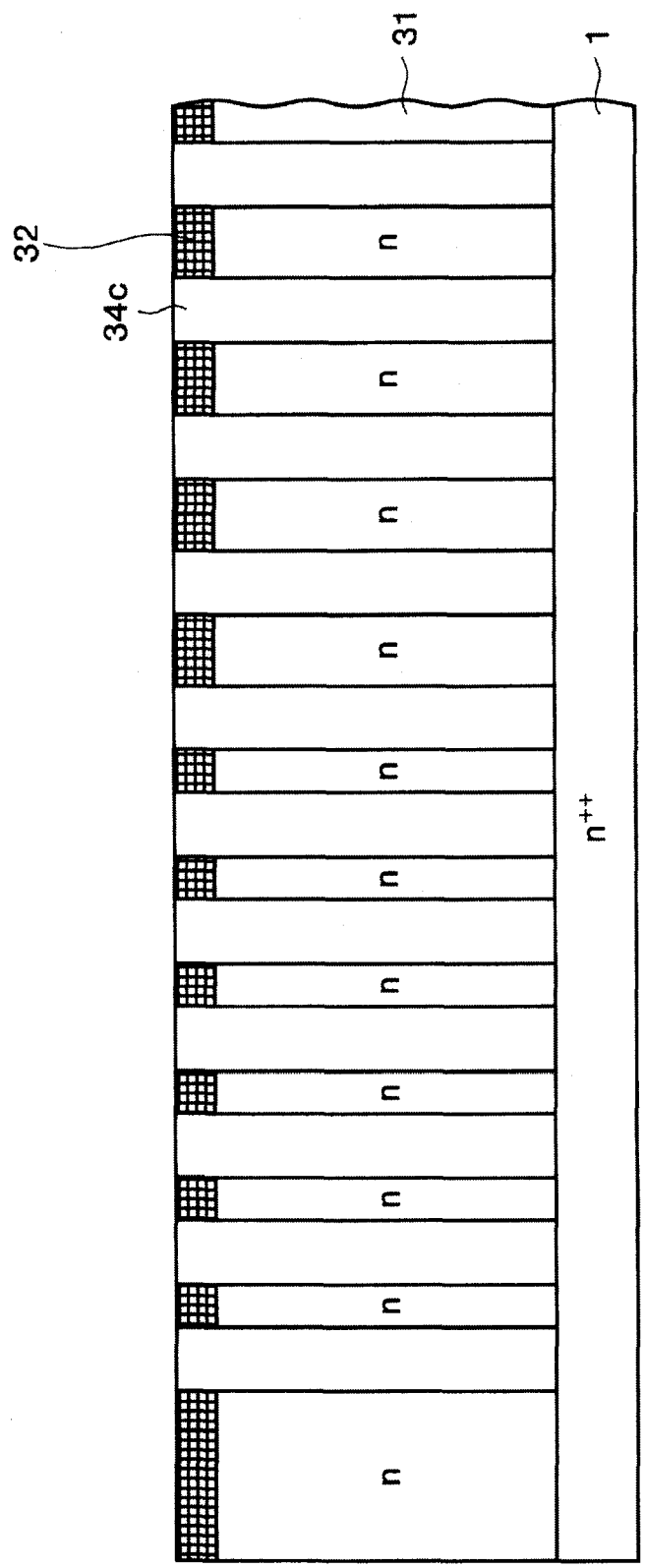
FIG. 44 is a vertical cross sectional view showing the structure of the semiconductor device in the course of being manufactured by the method according to the embodiment 26 with portions of the p-epitaxial layers grown above the surfaces of oxide films being removed by polishing.

Following this, polishing is carried out. The polishing is first carried out with the oxide films 32 used as polishing stoppers. Thus, portions of the epitaxial layers 34c grown to the level above the level of the surfaces of the oxide films 32 are removed. At this time, since the p-epitaxial layers 34c are grown to heights approximately equal to one another, variations in heights in polishing the p-epitaxial layers 34c can be reduced. Therefore, the parallel p-n layer can be formed with a uniform depth. The state up to this is shown in FIG. 44.

Figure 45:
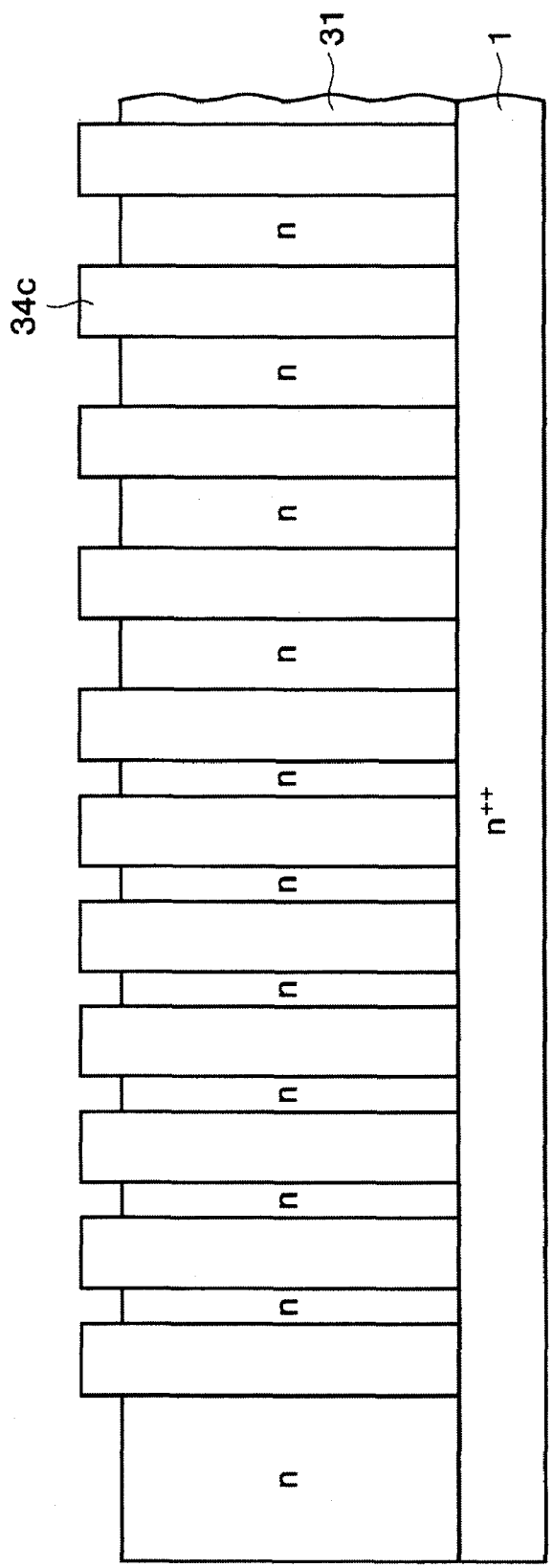
FIG. 45 is a vertical cross sectional view showing the structure of the semiconductor device in the course of being manufactured by the method according to the embodiment 26 with the oxide films being removed.
Figure 46:
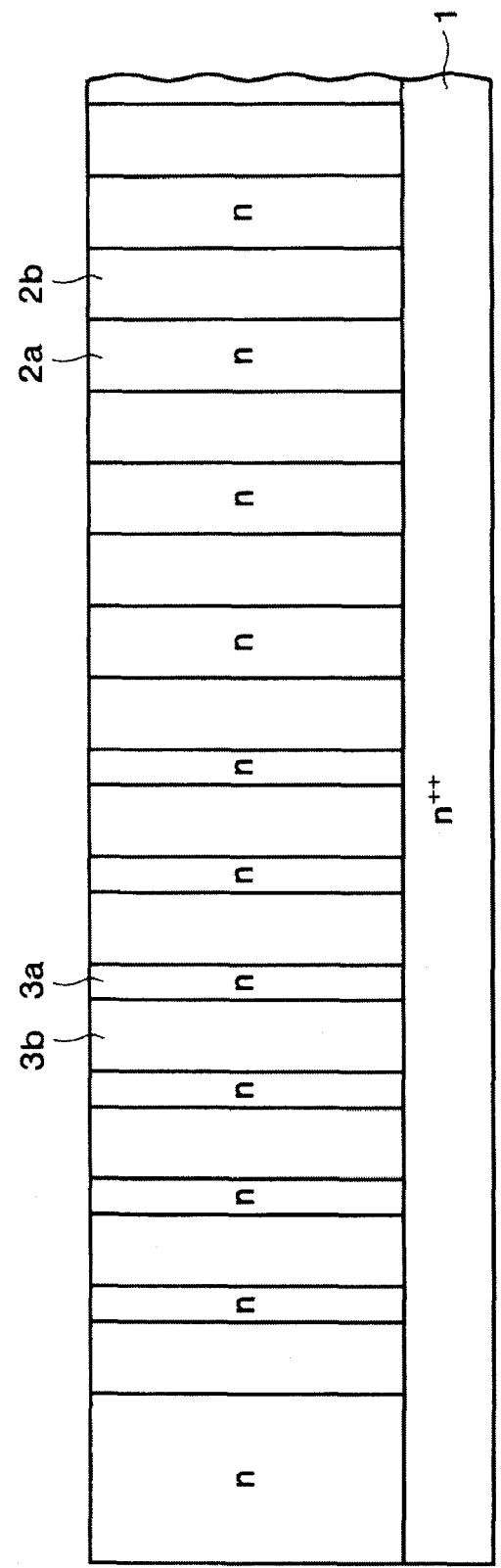
FIG. 46 is a vertical cross sectional view showing the structure of the semiconductor device in the course of being manufactured by the method according to the embodiment 26 with both of the surfaces of the n- and p-epitaxial layers being polished to be provided as a super-junction semiconductor substrate.
Figure 47:
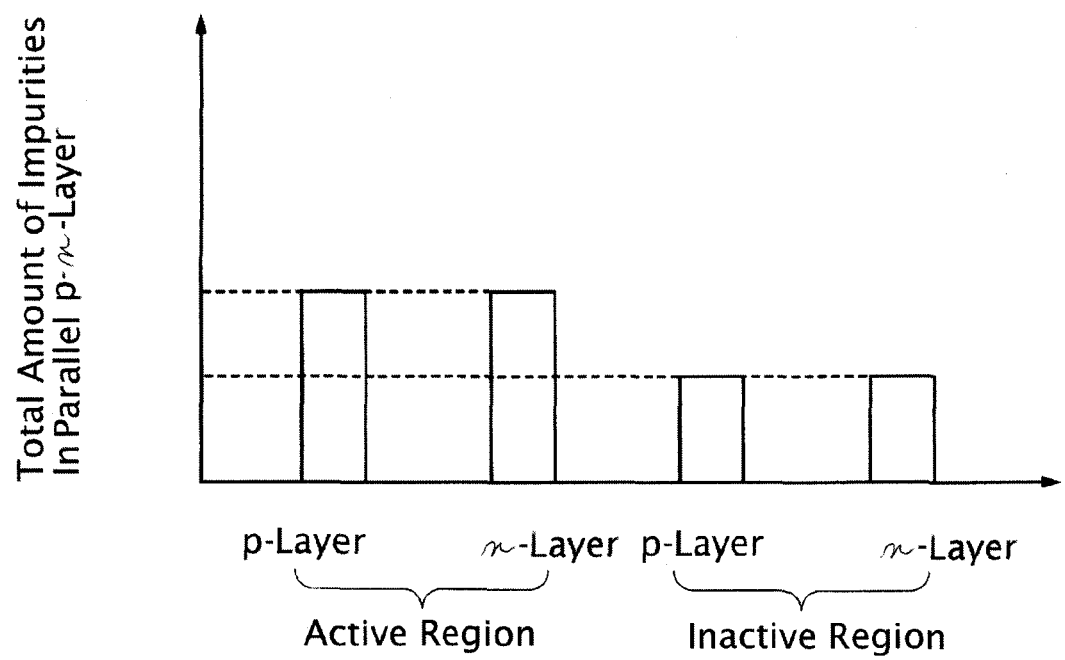
FIG. 47 is a diagram showing relations among total amounts of impurities in the p-semiconductor layers and the n-semiconductor layers in a parallel p-n layer in a related semiconductor device.

In the next, as shown in FIG. 45, the oxide films 32 are removed. Thereafter, mirror polishing of the surface is carried out to eliminate unevenness on the surface caused by the removal of the oxide films 32. In this way, as shown in FIG. 46, a super-junction semiconductor substrate is completed which has the first parallel p-n layer and the second parallel p-n layer. The first parallel p-n layer includes the first n-semiconductor layers 2a of the n-epitaxial layer 31 and the first p-semiconductor layers 2b of the p-epitaxial layer 34c being alternately arranged. The second parallel p-n layer includes the second n-semiconductor layers 3a of the n-epitaxial layer 31 and the second p-semiconductor layers 3b of the p-epitaxial layer 34c being alternately arranged.

With the use of the super-junction semiconductor substrate, the element surface structure, the peripheral voltage withstanding structure, the drain electrode and the like of the MOSFET are formed at relatively high temperatures, for example, of the order of 1000 to 1100° C. This causes interdiffusion of impurities to complete the semiconductor device according to the ninth, eleventh, thirteenth and fifteenth embodiments. Since the processes of manufacturing the element surface structure, the peripheral voltage withstanding structure and the like of the MOSFET are well-known, the explanation about them will be omitted.

The twenty-seventh embodiment is a method of manufacturing a semiconductor device which can be applied when manufacturing the semiconductor device according to the above-explained second, fourth, sixth, eighth, tenth, twelve, fourteenth and sixteenth embodiments. When manufacturing the semiconductor device according to the second, fourth, sixth or eighth embodiments, the manufacturing method according to the twenty-fifth embodiment is applied. While, when manufacturing the semiconductor device according to the tenth, twelfth, fourteenth and sixteenth embodiments, the manufacturing method according to the twenty-fifth embodiment is applied.

In any of these cases, however, the twenty-seventh embodiment differs from the twenty-fifth and twenty-sixth embodiments in that the element surface structure, the peripheral voltage withstanding structure, the drain electrode and the like of the MOSFET are formed at relatively low temperatures of the order of 400 to 800° C. With temperatures at such levels, interdiffusion of impurities due to heat history is inhibited. Hence, reduction in impurity concentration is prevented in each of the first n-semiconductor layer 2a, the first p-semiconductor layer 2b, the second n-semiconductor layer 3a and the second p-semiconductor layer 3b. Therefore, compared with the twenty-fifth and twenty-sixth embodiments, the impurity concentration in the semiconductor device can be easily controlled.

The inventors actually manufactured, according to the twenty-fifth embodiment, a super-junction semiconductor substrate as shown in FIG. 41 with the impurity concentration in each of the substrate and the filling epitaxial layers taken as $6.0 \times 10^{15}$ cm$^{-3}$. Thereafter, on thus manufactured substrate, the inventors formed element surface structures at temperatures of the order of 400 to 800° C. As a result, about the second parallel p-n layer, having the second p-semiconductor layers 3b with larger widths and laid out in a part of the inactive region 200, the impurity concentration in the second p-semiconductor layers 3b was about $5.5 \times 10^{15}$ cm$^{-3}$. Moreover, the impurity concentration in the second n-semiconductor layers 3a was about $5.0 \times 10^{15}$ cm$^{-3}$. Both of the impurity concentrations were uniformly distributed in the depth direction.

Furthermore, in the first parallel p-n layer laid out in the active region 100, both of the first p-semiconductor layer 2b and the first n-semiconductor layer 2a have an impurity concentration of about $5.5 \times 10^{15}$ cm$^{-3}$, which was uniformly distributed in the depth direction. Such impurity concentration distributions are approximately equal to those in the second embodiment shown in FIG. 6 and FIG. 7.

Here, for making a well tradeoff between on-resistance and breakdown voltage, when both of the first p-semiconductor 2$b$ and the first n-semiconductor layer 2$a$, formed in the first parallel p-n layer laid out in the active region 100, have a width of 5 μm, it is desirable for both of the first p-semiconductor 2$b$ and the first n-semiconductor layer 2$a$ to have a final impurity concentration of about $4.5 \times 10^{15}$ cm$^{-3}$. For providing the impurity concentration with such a value, it is necessary only that the impurity concentration in the n-epitaxial layer 31, which is to become the first n-semiconductor layer 2$a$, is made to be on the order of $5.0 \times 10^{15}$ cm$^{-3}$ when the layer is made grown. Moreover, it is necessary only that the p-epitaxial layer 34$a$ to become the first p-semiconductor layer 2$b$ is made grown in the trenches 33$a$ and 33$b$ with impurity concentration of the order of $5.0 \times 10^{15}$ cm$^{-3}$.

As a result of manufacture of the super-junction semiconductor substrate by carrying out epitaxial growth with such impurity concentrations, in the second parallel p-n layer having the second p-semiconductor layers 3$b$ with larger widths, the impurity concentration in the second p-semiconductor layers 3$b$ and that in the second n-semiconductor layers 3$a$ became about $4.5 \times 10^{15}$ cm$^{-3}$ and about $4.0 \times 10^{15}$ cm$^{-3}$, respectively. Moreover, in the first parallel p-n layer, both of the first p-semiconductor layers 2$b$ and the first n-semiconductor layer 2$a$ are made to have an impurity concentration of about $4.5 \times 10^{15}$ cm$^{-3}$.

In other words, there could be manufactured a semiconductor device having the same structure and impurity concentrations as the semiconductor device according to the second embodiment. Moreover, although the explanation is omitted, by changing the width and the spacing (pitch) of the trenches, a region having the width and the spacing of trenches different from those of the active region 100 (i.e. the region in which the second p-n layer is laid out) and the impurity concentration in the epitaxial layers filling the trenches, a semiconductor device can be manufactured which has the same structure and impurity concentrations as the semiconductor device according to the fourth, sixth, eighth, tenth, twelfth, fourteenth and sixteenth embodiments.

The manufacturing method according to the twenty-seventh embodiment can be also applied to when manufacturing the semiconductor device according to the eighteenth, twentieth, twenty-second and twenty-fourth embodiments. In this case, however, the manufacturing method of the twenty-fifth embodiment is applied with the width of each of the trenches 33$b$, formed in the region where the second parallel p-n layer is laid out, made smaller than the width of each of the trenches 33$a$ formed in the region where the first parallel p-n layer is laid out.

In the foregoing, the invention is not limited to the above-described embodiments but can be variously modified. For example, described numerical values of dimensions of thicknesses and widths and impurity concentrations are merely examples and the invention is not limited to the numerical values. Moreover, on the parallel p-n layer, a semiconductor elements other than a MOSFET, such as an IGBT or a bipolar transistor, can be formed. In the above-described embodiments, the first conductivity type and the second conductivity type are taken as an n-type and a p-type, respectively. The invention, however, is similarly valid even when the first conductivity type and the second conductivity type are taken as a p-type and an n-type, respectively.

As explained in the foregoing, the invention is useful for a high-power semiconductor device. In particular, the invention is suited for a semiconductor device in which breakdown voltage enhancement and current capacity enhancement can be compatible such as a MOSFET, an IGBT and a bipolar transistor, each having a parallel p-n layer in a drift section.

What is claimed is:

1. A method of manufacturing a semiconductor device in which a parallel p-n layer with first conductivity type semiconductor layers and second conductivity type semiconductor layers being alternately joined is provided on a first conductivity type low resistance semiconductor layer and a part of the parallel p-n layer is provided over an active region in which a current flows in a turned-on state and a part of the parallel p-n layer is provided over an inactive region around the active region, the method comprising:

carrying out epitaxial growth of a first conductivity type semiconductor layer on the first conductivity type low resistance semiconductor layer;

depositing an insulator film on the surface of the epitaxially grown first conductivity type semiconductor layer;

carrying out patterning of the insulator film to form a mask for forming trenches;

by using the patterned insulator film as a mask, forming a plurality of trenches in a region to become an active region in the first conductivity type semiconductor layer and along with this, forming a plurality of trenches in a part of a region to become an inactive region in the first conductivity type semiconductor layer, the trenches having widths different from those of the trenches formed in the region to become the active region;

carrying out epitaxial growth of a second conductivity type semiconductor layer in each of the trenches formed in the first conductivity type semiconductor layer to fill trenches having the largest widths with the second conductivity type semiconductor layers to a level equal to or higher than the level of the surface of the insulator film used as the mask for forming the trenches; and polishing the parallel p-n layer comprising the first conductivity type semiconductor layers and the second conductivity type semiconductor layers filling the trenches to planarize the surface of the parallel p-n layer.

2. The method of manufacturing a semiconductor device as claimed in claim 1 wherein, in the step of forming the trenches in the first conductivity type semiconductor layer, in a part of the region to become the inactive region, the trenches are formed so that the width of each of the trenches becomes larger than the spacing between the trenches.

3. The method of manufacturing a semiconductor device as claimed in claim 2 wherein, in the step of forming the trenches in the first conductivity type semiconductor layer, in a part of the region to become the inactive region, trenches having widths larger than those of the trenches formed in the region to become the active region are formed.

4. The method of manufacturing a semiconductor device as claimed in claim 1 further comprising removing a part of each of the second conductivity type semiconductor layers filling the trenches by an amount grown to a level higher than the surface of the insulator film used as a mask for forming the trench by polishing the part with the insulator film further used as a polishing stopper, the step being carried out between the step of carrying out epitaxial growth of the second conductivity type semiconductor layer to fill each of the trenches and the step of polishing the parallel p-n layer to planarize the surface thereof.

* * * * *